(12) United States Patent
Hirano et al.

(10) Patent No.: US 8,450,044 B2
(45) Date of Patent: May 28, 2013

(54) POSITIVE RESIST COMPOSITION AND METHOD OF FORMING RESIST PATTERN

(75) Inventors: Tomoyuki Hirano, Kawasaki (JP); Daiju Shiono, Kawasaki (JP); Daichi Takaki, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 190 days.

(21) Appl. No.: 12/945,526

(22) Filed: Nov. 12, 2010

(65) Prior Publication Data

US 2011/0111343 A1    May 12, 2011

(30) Foreign Application Priority Data

Nov. 12, 2009 (JP) .................................. 2009-259029

(51) Int. Cl.
  *G03F 7/039* (2006.01)
  *G03F 7/20* (2006.01)
  *G03F 7/30* (2006.01)

(52) U.S. Cl.
  USPC ........ 430/270.1; 430/311; 430/326; 430/907; 430/910

(58) Field of Classification Search
  None
  See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 7,074,543 B2 | 7/2006 | Iwai et al. | |
| 7,078,562 B2 | 7/2006 | Furukawa et al. | |
| 2009/0162788 A1 | 6/2009 | Hada et al. | |
| 2009/0297980 A1 * | 12/2009 | Iwashita et al. | 430/270.1 |
| 2009/0317743 A1 * | 12/2009 | Shiono et al. | 430/270.1 |
| 2010/0075249 A1 | 3/2010 | Utsumi et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2003-241385 | 8/2003 |
| JP | A-2006-016379 | 1/2006 |
| JP | A-2008-134607 | 6/2008 |
| JP | A-2009-167156 | 7/2009 |
| WO | WO 2004/074242 | 9/2004 |

OTHER PUBLICATIONS

Gil et al., "First Microprocessors with Immersion Lithography," *Optical Microlithography XVIII*, Proceedings of SPIE, vol. 5754, pp. 119-128 (2005).

Kodama et al., Synthesis of Novel Fluoropolymer for 157nm Photoresists by Cyclo-polymerization, *Advances in Resist Technology and Processing XIX*, Proceedings of SPIE, vol. 4690, pp. 76-83 (2002).

* cited by examiner

*Primary Examiner* — Sin J. Lee
(74) *Attorney, Agent, or Firm* — Knobbe Martens Olson & Bear LLP

(57) ABSTRACT

A positive resist composition including a resin component (A) which exhibits increased solubility in an alkali developing solution under the action of acid and an acid-generator component (B), the resin component (A) including a polymeric compound (A1) having a structural unit (a1) containing an acid dissociable, dissolution inhibiting group, a structural unit (a5) containing a base dissociable group an a structural unit (a6) represented by general formula (a6-1) (R represents a hydrogen atom, an alkyl group of 1 to 5 carbon atoms or a halogenated alkyl group of 1 to 5 carbon atoms; each of $R^2$ and $R^3$ independently represents a hydrogen atom or an alkyl group that may contain an oxygen atom at an arbitrary position, or $R^2$ and $R^3$ are bonded together to form an alkylene group; and W represents a cyclic alkylene group that may include an oxygen atom at an arbitrary position).

[Chemical Formula 1]

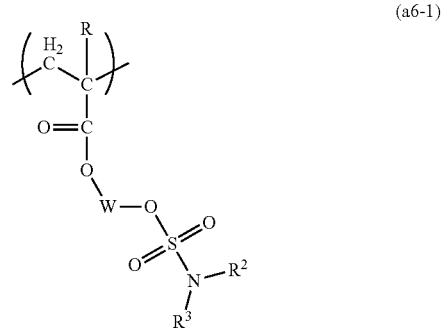

(a6-1)

5 Claims, 1 Drawing Sheet

POSITIVE RESIST COMPOSITION AND METHOD OF FORMING RESIST PATTERN

TECHNICAL FIELD

The present invention relates to a positive resist composition and a method of forming a resist pattern.

Priority is claimed on Japanese Patent Application No. 2009-259029, filed Nov. 12, 2009, the content of which is incorporated herein by reference.

BACKGROUND ART

In lithography techniques, for example, a resist film composed of a resist material is fanned on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits a changed solubility in an alkali developing solution under the action of acid and an acid-generator component that generates acid upon exposure.

For example, a chemically amplified positive resist contains, as a base component (base resin), a resin which exhibits increased solubility in an alkali developing solution under action of acid, and an acid generator is typically used. If the resist film formed using the resist composition is selectively exposed during formation of a resist pattern, then within the exposed portions, acid is generated from the acid-generator component, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are now widely used as base resins for resist compositions that use ArF excimer laser lithography, as they exhibit excellent transparency in the vicinity of 193 nm (for example, see Patent Document 1).

As a technique for further improving the resolution, a lithography method called liquid immersion lithography (hereafter, frequently referred to as "immersion exposure") is known in which exposure (immersion exposure) is conducted in a state where the region between the lens and the resist layer formed on a wafer is filled with a solvent (a immersion medium) that has a larger refractive index than the refractive index of air (see for example, Non-Patent Document 1).

According to this type of immersion exposure, it is considered that higher resolutions equivalent to those obtained using a shorter wavelength light source or a larger NA lens can be obtained using the same exposure light source wavelength, with no lowering of the depth of focus. Furthermore, immersion exposure can be conducted using a conventional exposure apparatus. As a result, it is expected that immersion exposure will enable the formation of resist patterns of higher resolution and superior depth of focus at lower costs. Accordingly, in the production of semiconductor devices, which requires enormous capital investment, immersion exposure is attracting considerable attention as a method that offers significant potential to the semiconductor industry, both in terms of cost and in terms of lithography properties such as resolution.

Immersion lithography is effective in forming patterns having various shapes. Further, immersion exposure is expected to be capable of being used in combination with currently studied super-resolution techniques, such as phase shift method and modified illumination method. Currently, as the immersion exposure technique, technique using an ArF excimer laser as an exposure source is being actively studied. Further, water is mainly used as the immersion medium.

In recent years, fluorine-containing compounds have been attracting attention for their properties such as water repellency and transparency, and active research and development of fluorine-containing compounds have been conducted in various fields. For example, in the fields of resist materials, currently, an acid-labile group such as a methoxymethyl group, tert-butyl group or tert-butoxycarbonyl group is being introduced into a fluorine-containing polymeric compound, and the fluorine-containing polymeric compound is used as a base resin for a chemically amplified positive resist. However, when such a fluorine-containing polymeric compound is used as a base resin for a positive resist, disadvantages are caused in that a large amount of an out gas is generated, and resistance to a dry-etching gas (etching resistance) is unsatisfactory.

Recently, as a fluorine-containing polymeric compound exhibiting excellent etching resistance, a fluorine-containing polymeric compound having an acid-labile group containing a cyclic hydrocarbon group has been reported (see, for example, Non-Patent Document 2).

DOCUMENTS OF RELATED ART

[Patent Document]
[Patent Document 1] Japanese Unexamined Patent Application, First Publication No. 2003-241385
[Patent Document 2] Japanese Unexamined Patent Application, First Publication No. 2006-016379
[Non-Patent Documents]
[Non-Patent Document 1] Proceedings of SPIE (U.S.), vol. 5754, pp. 119-128 (2005)
[Non-Patent Document 2] Proceedings of SPIE (U.S.), vol. 4690, pp. 76-83 (2002)

SUMMARY OF THE INVENTION

In the aforementioned immersion exposure, a resist material is required which exhibits not only general lithography properties (e.g., sensitivity, resolution, etching resistance and the like), but also properties suited for immersion lithography. For example, in immersion exposure, when the resist film comes in contact with the immersion medium, elution of a substance contained in the resist film into the immersion medium occurs. This elution of a substance causes phenomenon such as degeneration of the resist film and change in the refractive index of the immersion medium, thereby adversely affecting the lithography properties. The amount of the eluted substance is affected by the properties of the resist film surface (e.g., hydrophilicity, hydrophobicity, and the like). For example, by enhancing the hydrophobicity of the resist film surface, the elution of a substance can be reduced. Further, when the immersion medium is water, and immersion exposure is performed using a scanning-type immersion exposure apparatus as disclosed in Non-Patent Document 1, a water tracking ability in which the immersion medium is capable of tracking the movement of the lens is required. When the water tracking ability is low, the exposure speed becomes low, and as a result, there is a possibility that the productivity is adversely affected. It is presumed that the water tracking ability can be improved by enhancing the hydrophobicity of the resist film (rendering the resist film hydrophobic).

Accordingly, it is presumed that the above-described characteristic problems of immersion lithography, which require a reduction in substance elution and an improvement in the water tracking ability, can be addressed by enhancing the hydrophobicity of the resist film surface.

However, if the resist film is simply rendered hydrophobic, then adverse effects are seen on the lithography properties. For example, as the hydrophobicity of the resist film is increased, defects tend to be generated more readily on the surface of the formed resist pattern following alkali developing. Especially, in the case of a positive resist composition, defects are likely to be generated at unexposed portions.

The term "defects" refers to general abnormalities within a resist film that are detected when observed from directly above the developed resist film using, for example, a surface defect detection apparatus (product name: "KLA") manufactured by KLA-TENCOR Corporation. Examples of these abnormalities include post-developing scum, foam, dust, bridges (structures that bridge different portions of the resist pattern), color irregularities, and foreign deposits.

It is presumed that the aforementioned problem can be solved by a resist material which is hydrophobic during immersion exposure, and becomes hydrophilic during developing, and as a result, a resist pattern having an excellent shape can be formed. However, such a resist material is essentially unknown in the art.

The present invention takes the above circumstances into consideration, with an object of providing a novel resist composition and a method of forming a resist pattern that can be preferably used in lithography applications.

For solving the above-mentioned problems, the present invention employs the following aspects.

Specifically, a first aspect of the present invention is a positive resist composition including a resin component (A) which exhibits increased solubility in an alkali developing solution under the action of acid and an acid-generator component (B), the resin component (A) including a polymeric compound (A1) having a structural unit (a1) containing an acid dissociable, dissolution inhibiting group, a structural unit (a5) containing a base dissociable group an a structural unit (a6) represented by general formula (a6-1) shown below.

[Chemical Formula 1]

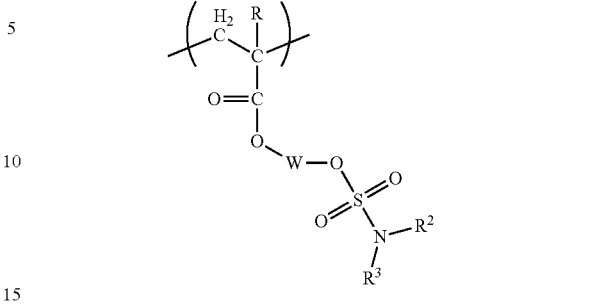

(a6-1)

In the formula, R represents a hydrogen atom, an alkyl group of 1 to 5 carbon atoms or a halogenated alkyl group of 1 to 5 carbon atoms; each of $R^2$ and $R^3$ independently represents a hydrogen atom or an alkyl group that may contain an oxygen atom at an arbitrary position, or $R^2$ and $R^3$ are bonded together to form an alkylene group; and W represents a cyclic alkylene group that may include an oxygen atom at an arbitrary position.

A second aspect of the present invention is a method of forming a resist pattern, including using a positive resist composition according to the first aspect to form a resist film on a substrate, subjecting the resist film to exposure, and subjecting the resist film to alkali developing to form a resist pattern.

In the present description and claims, an "alkyl group" includes linear, branched or cyclic, monovalent saturated hydrocarbon, unless otherwise specified.

The term "alkylene group" includes linear, branched or cyclic divalent saturated hydrocarbon, unless otherwise specified.

A "lower alkyl group" is an alkyl group of 1 to 5 carbon atoms.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

The term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position.

The term "(meth)acrylate" is a generic term that includes either or both of the acrylate having a hydrogen atom bonded to the α-position and the methacrylate having a methyl group bonded to the α-position.

According to the present invention, there are provided a novel resist composition and a method of forming a resist pattern that can be preferably used in lithography applications.

DETAILED DESCRIPTION OF THE INVENTION

<<Positive Resist Composition>>

Figure 1:
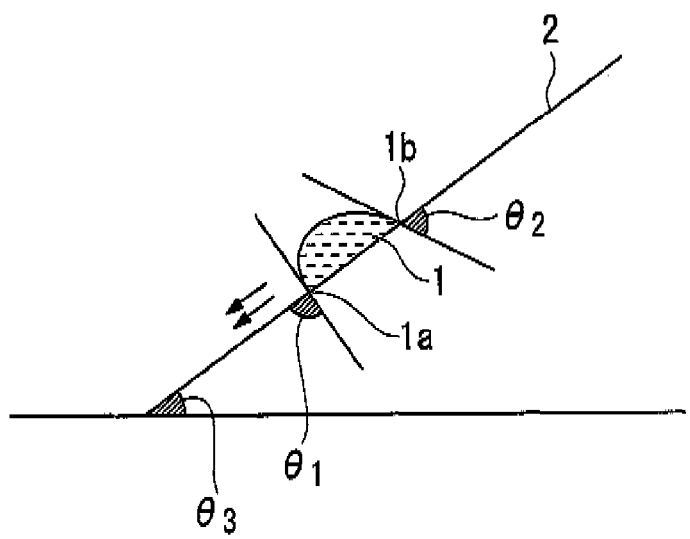
FIG. 1 is an explanatory diagram of an advancing angle ($\theta_1$), a receding angle ($\theta_2$) and a sliding angle ($\theta_3$).

The positive resist composition according to the first aspect of the present invention includes a resin component (A) which exhibits increased solubility in an alkali developing solution under action of acid (hereafter, referred to as "component (A)") and an acid-generator component (B) which generates acid upon exposure (hereafter, referred to as "component (B)").

In the positive resist composition, when radial rays are irradiated (when exposure is conducted), acid is generated from the component (B), and the solubility of the component (A) in an alkali developing solution is increased by the action of the generated acid. Therefore, in the formation of a resist pattern, by conducting selective exposure of a resist film formed by using the positive resist composition of the present invention, the solubility of the exposed portions in an alkali developing solution is increased, whereas the solubility of the unexposed portions in an alkali developing solution is unchanged, and hence, a resist pattern can be formed by alkali developing.

It is preferable that the positive resist composition of the present invention further includes a nitrogen-containing organic compound (D) (provided that the polymeric compound (A1) is excluded).

<Component (A)>

In the present invention, the component (A) includes a polymeric compound (A1) (hereafter, referred to as "component (A1)") having a structural unit (a1) containing an acid dissociable, dissolution inhibiting group, a structural unit (a5) containing a base dissociable group and a structural unit (a6) represented by the aforementioned general formula (a6-1).

[Component (A1)]

The component (A1) is a polymeric compound having a film-forming ability. Therefore, the component (A1) can be used as a base resin for forming a resist film. Alternatively, another resin component may be used as the base resin, and the component (A1) may be used as a component (an additive) other than the base resin.

(Structural Unit (a1))

The structural unit (a1) is a structural unit containing an acid dissociable, dissolution inhibiting group.

As the acid dissociable, dissolution inhibiting group for the structural unit (a1), any of those which have been proposed as acid dissociable, dissolution inhibiting groups for a base resin of a chemically amplified resist may be used. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

As an example of the aliphatic branched, acid dissociable, dissolution inhibiting group, for example, a group represented by the formula —$C(R^{71})(R^{72})(R^{73})$ can be given (in the formula, each of $R^{71}$ to $R^{73}$ independently represents a linear alkyl group of 1 to 5 carbon atoms). The group represented by the formula —$C(R^{71})(R^{72})(R^{73})$ preferably has 4 to 8 carbon atoms, and specific examples include a tert-butyl group, a 2-methyl-2-butyl group, a 2-methyl-2-pentyl group and a 3-methyl-3-pentyl group. Among these, a tert-butyl group is particularly desirable.

The term "aliphatic cyclic group" refers to a monocyclic group or polycyclic group that has no aromaticity.

The "aliphatic cyclic group" within the structural unit (a1) may or may not have a substituent. Examples of the substituent include an alkyl group of 1 to 5 carbon atoms, an alkoxy group of 1 to 5 carbon atoms, a fluorine atom, a fluorinated alkyl group of 1 to 5 carbon atoms, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group.

Further, the "hydrocarbon group" may be either saturated or unsaturated, but is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantine, norbornane, isobornane, tricyclodecane or tetracyclododecane. Further, these groups in which one or more hydrogen atoms have been removed from a monocycloalkane and groups in which one or more hydrogen atoms have been removed from a polycycloalkane may have part of the carbon atoms constituting the ring replaced with an ethereal oxygen atom (—O—).

Examples of aliphatic cyclic group containing acid dissociable, dissolution inhibiting groups include (i) a group which has a tertiary carbon atom on the ring structure of a monovalent aliphatic cyclic group; and (ii) a group which has a branched alkylene group containing a tertiary carbon atom, and a monovalent aliphatic cyclic group to which the tertiary carbon atom is bonded.

Specific examples of (i) a group which has a tertiary carbon atom on the ring structure of a monovalent aliphatic cyclic group include groups represented by general formulas (1-1) to (1-9) shown below.

Specific examples of (ii) a group which has a branched alkylene group containing a tertiary carbon atom, and a monovalent aliphatic cyclic group to which the tertiary carbon atom is bonded include groups represented by general formulas (2-1) to (2-6) shown below.

[Chemical Formula 2]

(1-1)

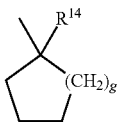
(1-2)

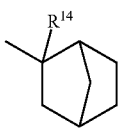
(1-3)

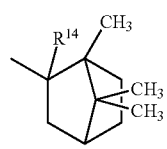
(1-4)

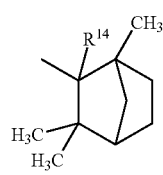
(1-5)

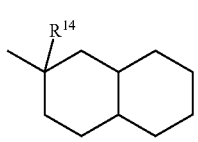
(1-6)

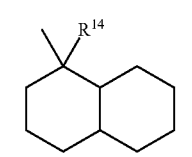
(1-7)

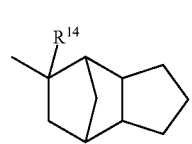
(1-8)

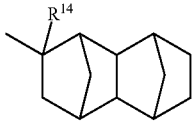
(1-9)

In the formulas above, $R^{14}$ represents an alkyl group; and g represents an integer of 0 to 8.

[Chemical Formula 3]

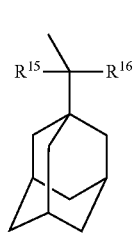
(2-1)

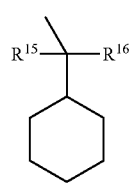
(2-2)

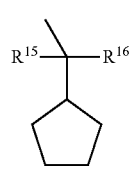
(2-3)

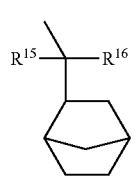
(2-4)

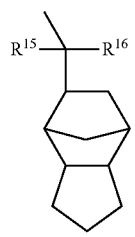
(2-5)

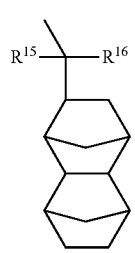
(2-6)

In the formulas above, each of $R^{15}$ and $R^{16}$ independently represents an alkyl group.

As the alkyl group for $R^{14}$, a linear or branched alkyl group is preferable.

The linear alkyl group preferably has 1 to 5 carbon atoms, more preferably 1 to 4, and still more preferably 1 or 2. Specific examples include a methyl group, an ethyl group, an n-propyl group, an n-butyl group and an n-pentyl group. Among these, a methyl group, an ethyl group or an n-butyl group is preferable, and a methyl group or an ethyl group is more preferable.

The branched alkyl group preferably has 3 to 10 carbon atoms, and more preferably 3 to 5. Specific examples of such branched alkyl groups include an isopropyl group, an isobutyl group, a tert-butyl group, an isopentyl group and a neopentyl group, and an isopropyl group is particularly desirable.

g is preferably an integer of 0 to 6, more preferably an integer of 1 to 6, and still more preferably an integer of 1 to 4.

As the alkyl group for $R^{15}$ and $R^{16}$, the same alkyl groups as those for $R^{14}$ can be used.

In formulas (1-1) to (1-9) and (2-1) to (2-6), part of the carbon atoms constituting the ring may be replaced with an ethereal oxygen atom (—O—).

Further, in formulas (1-1) to (1-9) and (2-1) to (2-6), one or more of the hydrogen atoms bonded to the carbon atoms constituting the ring may be substituted with a substituent. Examples of the substituent include an alkyl group of 1 to 5 carbon atoms, a fluorine atom and a fluorinated alkyl group.

An "acetal-type acid dissociable, dissolution inhibiting group" generally substitutes a hydrogen atom at the terminal of an alkali-soluble group such as a carboxy group or hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 4]

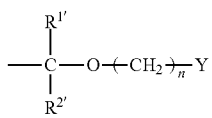

(p1)

In the formula, $R^{1'}$ and $R^{2'}$ each independently represent a hydrogen atom or an alkyl group of 1 to 5 carbon atoms; n represents an integer of 0 to 3; and Y represents an alkyl group of 1 to 5 carbon atoms or an aliphatic cyclic group.

In general formula (p1) above, n is preferably an integer of 0 to 2, more preferably 0 or 1, and most preferably 0.

As the alkyl group of 1 to 5 carbon atoms for $R^{1'}$ and $R^{2'}$, the same alkyl groups of 1 to 5 carbon atoms as those described above for $R^1$ can be used, although a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 5]

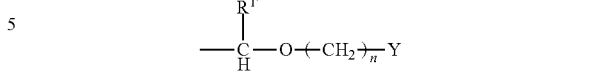

(p1-1)

In the formula, $R^{1'}$ n and Y are the same as defined above.

As the alkyl group of 1 to 5 carbon atoms for Y, the same alkyl groups of 1 to 5 carbon atoms as those described above for $R^1$ can be used.

As the aliphatic cyclic group for Y, any of the aliphatic monocyclic/polycyclic groups which have been proposed for conventional ArF resists and the like can be appropriately selected for use. For example, the same groups described above in connection with, the "aliphatic cyclic group" can be used.

Further, as the acetal-type, acid dissociable, dissolution inhibiting group, groups represented by general formula (p2) shown below can also be used.

[Chemical Formula 6]

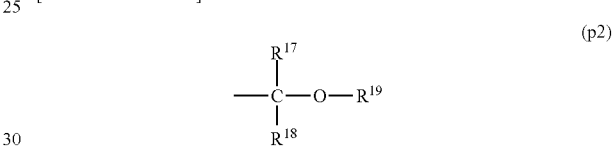

(p2)

In the formula, $R^{17}$ and $R^{18}$ each independently represent a linear or branched alkyl group or a hydrogen atom; and $R^{19}$ represents a linear, branched or cyclic alkyl group; or $R^{17}$ and $R^{19}$ each independently represents a linear or branched alkylene group, and the terminal of $R^{17}$ is bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include tetrahydropyranyl group and tetrahydrofuranyl group.

Specific examples of acetal-type acid dissociable, dissolution inhibiting groups include groups represented by formulas (p3-1) to (p3-12) shown below.

[Chemical Formula 7]

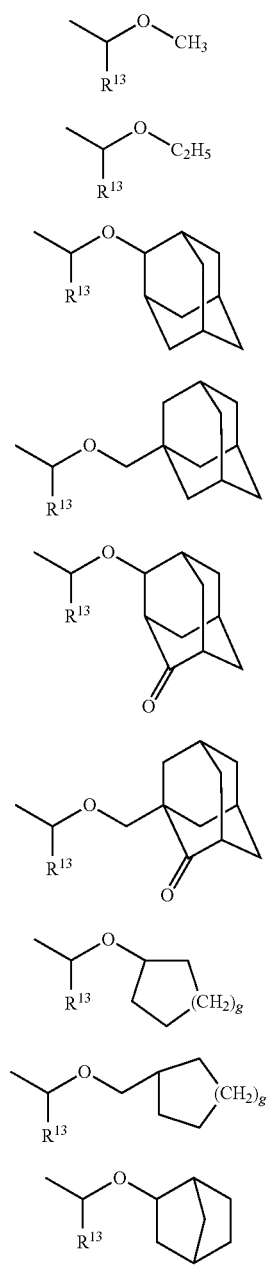

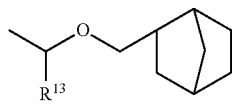

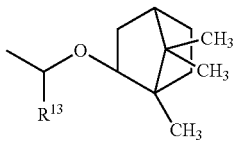

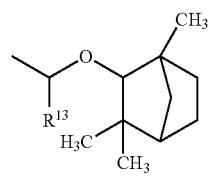

In the formulas above, $R^{13}$ represents a hydrogen atom or a methyl group; and g is the same as defined above.

The main chain of the structural unit (a1) is not particularly limited, and preferable examples include a structural unit derived from hydroxystyrene, a structural unit derived from an acrylate ester, and a structural unit having a cyclic main chain (hereafter, referred to as "cyclic-main chain structural unit"). Among these, a structural unit derived from hydroxystyrene or a structural unit derived from an acrylate ester is preferable, and a structural unit derived from an acrylate ester is particularly desirable.

In the present descriptions and the claims, the expression "structural unit derived from hydroxystyrene" refers to a structural unit that is formed by the cleavage of the ethylenic double bond of hydroxystyrene.

A "structural unit derived from an acrylate ester" refers to a structural unit that is formed by the cleavage of the ethylenic double bond of an acrylate ester.

Further, in the present specification, a "cyclic-main chain structural unit" refers to a structural unit having a monocyclic or polycyclic ring structure, and at least one carbon atom within the ring structure, preferably two or more carbon atoms within the ring structure constitutes the main chain.

The term "hydroxystyrene" includes hydroxystyrene, compounds in which the hydrogen atom at the α-position of a hydroxystyrene has been substituted with another substituent such as an alkyl group, and derivatives thereof. Unless specified otherwise, the α-position (α-position carbon atom) of a structural unit derived from a hydroxystyrene refers to the carbon atom to which the benzene ring is bonded.

Examples of the alkyl group for the substituent at the α-position of the hydroxystyrene include alkyl groups of 1 to 5 carbon atoms, and specific examples include linear and branched alkyl groups such as a methyl group, an ethyl group, a propyl group, an isopropyl group, an n-butyl group, an isobutyl group, a tert-butyl group, a pentyl group, an isopentyl group and a neopentyl group.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent include an alkyl group of 1 to 5 carbon atoms and a halogenated alkyl group of 1 to 5 carbon atoms.

With respect to the "structural unit derived from an acrylate ester", the "α-position (the carbon atom on the α-position)"

refers to the carbon atom having the carbonyl group bonded thereto, unless specified otherwise.

With respect to the acrylate ester, specific examples of the alkyl group of 1 to 5 carbon atoms for the substituent at the α-position include linear or branched alkyl groups such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group of 1 to 5 carbon atoms include groups in which part or all of the hydrogen atoms of the aforementioned "alkyl group of 1 to 5 carbon atoms for the substituent at the α-position" are substituted with halogen atoms. Examples of the halogen atom include a fluorine atom, a chlorine atom, a bromine atom and an iodine atom, and a fluorine atom is particularly desirable.

In the present invention, it is preferable that a hydrogen atom, an alkyl group of 1 to 5 carbon atoms or a halogenated alkyl group of 1 to 5 carbon atoms is bonded to the α-position of the acrylate ester, a hydrogen atom, an alkyl group of 1 to 5 carbon atoms or a fluorinated alkyl group of 1 to 5 carbon atoms is more preferable, and in terms of industrial availability, a hydrogen atom or a methyl group is the most desirable.

Specific examples of the structural unit (a1) include a structural unit represented by general formula (a1-0-1) shown below, a structural unit represented by general formula (a1-0-2) shown below, and a structural unit represented by general formula (a1-0-3) shown below in which the hydrogen atom of the —OH group has been substituted with an acid dissociable, dissolution inhibiting group.

[Chemical Formula 8]

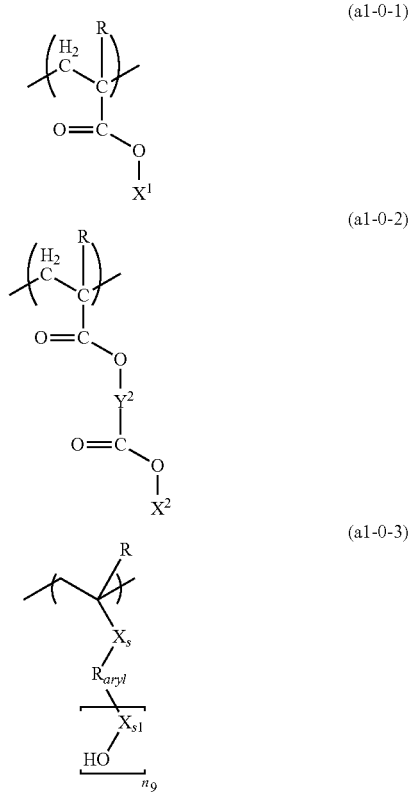

In the formulas, R represents a hydrogen atom, an alkyl group of 1 to 5 carbon atoms or a halogenated alkyl group of 1 to 5 carbon atoms; $X^1$ represents an acid dissociable, dissolution inhibiting group; $Y^2$ represents a divalent linking group; $X^2$ represents an acid dissociable, dissolution inhibiting group; Xs represents a single bond or a divalent linking group; $Xs_1$ represents a single bond or a divalent linking group; $R_{aryl}$ represents an aromatic group which may have a substituent; and n9 represents an integer of 1 to 3.

In general formula (a1-0-1), as the alkyl group of 1 to 5 carbon atoms represented by R, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

$X^1$ is not particularly limited as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and tertiary alkyl ester-type acid dissociable, dissolution inhibiting groups are preferable.

In general formula (a1-0-2), R is the same as defined above. $X^2$ is the same as defined for $X^1$ in general formula (a1-0-1).

As the divalent linking group for $Y^2$, an alkylene group, a divalent aliphatic cyclic group or a divalent linking group containing a hetero atom can be mentioned.

As the aliphatic cyclic group, the same as those used above in connection with the explanation of "aliphatic cyclic group" can be used, except that two hydrogen atoms have been removed therefrom.

When $Y^2$ represents an alkylene group, it preferably has 1 to 10 carbon atoms, more preferably 1 to 6, still more preferably 1 to 4, and most preferably 1 to 3.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, examples thereof include —O—, —C(=O)—O—, —C(=O)—, —C(=O)—NH—, —NH— (H may be substituted with a substituent such as an alkyl group or an acyl group), —S—, —S(=O)$_2$—, —S(=O)$_2$—O—, "-A-O—B— (wherein O is an oxygen atom, and each of A and B independently represents a divalent hydrocarbon group which may have a substituent)" and "-A-C(=O)—O—B—".

When $Y^2$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^2$ is "A-O—B", each of A and B independently represents a divalent hydrocarbon group which may have a substituent.

A hydrocarbon "has a substituent" means that part or all of the hydrogen atoms within the hydrocarbon group is substituted with groups or atoms other than hydrogen atom.

The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

As specific examples of the aliphatic hydrocarbon group for A, a linear or branched aliphatic hydrocarbon group, and an aliphatic hydrocarbon group having a ring in the structure thereof can be given.

The linear or branched aliphatic hydrocarbon group preferably has 1 to 10 carbon atoms, more preferably 1 to 8, still more preferably 2 to 5, and most preferably 2.

As a linear aliphatic hydrocarbon group, a linear alkylene group is preferable, and specific examples include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples include alkylalkylene groups, e.g., alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$— and —$C(CH_2CH_3)_2$—; alkylethylene groups such as —$CH(CH_3)$$CR_2$—, —$CH(CH_3)CH(CH_3)$—, —$C(CH_3)_2CH_2$— and —$CH(CH_2CH_3)CH_2$—; alkyltrimethylene groups such as —$CH(CH_3)C_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated lower alkyl group of 1 to 5 carbon atoms, and an oxygen atom (═O).

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (═O).

As A, a linear aliphatic hydrocarbon group is preferable, more preferably a linear alkylene group, still more preferably a linear alkylene group of 2 to 5 carbon atoms, and most preferably an ethylene group.

Examples of the hydrocarbon group for A include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (═O).

As the hydrocarbon group for B, the same divalent hydrocarbon groups as those described above for A can be used.

As B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

As $Y^2$, the aforementioned alkylene group, a divalent aliphatic cyclic group or a divalent linking group containing a hetero atom is preferable. Among these, a divalent linking group containing a hetero atom is preferable, and a linear group containing an oxygen atom as a heteroatom, e.g., a group containing an ester bond is particularly desirable.

More specifically, a group represented by the aforementioned formula -A-O—B— or -A-C(═O)—O—B— is preferable, and a group represented by the formula —$(CH_2)_{a'}$—C(═O)—O—$(CH_2)_{b'}$— is particularly desirable.

a' represents an integer of 1 to 5, preferably 1 or 2, and most preferably 1.

b' represents an integer of 1 to 5, preferably 1 or 2, and most preferably 1.

In general formula (a1-0-3), R is the same as defined above.

n9 is preferably 1 or 2, and most preferably 1.

In general formula (a1-0-3), as the divalent linking group for Xs, the same divalent linking groups as those described above for $Y^2$ can be mentioned. Among these, a divalent linking group containing a hetero atom is preferable, —O—, —C(═O)—O—, —C(═O)—, —O—C(═O)—O—, —C(═O)—NH—, —NH— (H may be substituted with a substituent such as an alkyl group or an acyl group), a group represented by the formula -A-O—B— or a group represented by the formula -[$A^X$-C(═O)—O]$_{m''}$—B"— is more preferable, and a group represented by the formula -[$A^X$-C(═O)—O]$_{m''}$B"— is still more preferable.

In the formulas above, A and B are the same as defined above, m" represents an integer of 0 to 3, and each of $A^X$ and B" independently represents a single bond or a divalent hydrocarbon group which may have a substituent.

Examples of divalent hydrocarbon groups for $A^X$ and B" which may have a substituent include the same groups as those described above for the "divalent hydrocarbon group which may have a substituent" usable as A and B.

As $A^X$, a single bond or a linear alkylene group is preferable, a single bond or a linear alkylene group of 1 to 5 carbon atoms is more preferable, and a single bond, a methylene group or an ethylene group is particularly desirable.

As B", a single bond or a linear alkylene group is preferable, a linear alkylene group of 1 to 5 carbon atoms is more preferable, and a methylene group or an ethylene group is particularly desirable.

In the group represented by the formula -[$A^X$-C(=O)—O]$_{m''}$—B"—, m" represents an integer of 0 to 3, preferably an integer of 0 to 2, more preferably 0 or 1, and most preferably 1.

In general formula (a1-0-3), Xs1 is the same as defined for Xs, and a carbonyl group or an alkylene group of 1 to 4 carbon atoms is preferable.

In general formula (a1-0-3), the aromatic group for $R_{aryl}$ is a hydrocarbon group which has an aromatic ring. The aromatic group preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of the aromatic group include a phenyl group, a biphenyl group, a fluorenyl group, a naphthyl group, an anthryl group and a phenanthryl group.

Among these, as $R_{aryl}$, in terms of ease in synthesis and improvement in the lithography properties (e.g., heat resistance, suppression of pattern collapse, sensitivity and resist pattern shape) of the resist film formed using a positive resist composition containing the component (A1), a phenyl group or a naphthyl group is particularly desirable.

The aromatic group may have a substituent. For example, part of the carbon atoms constituting the aromatic ring within the aromatic group may be substituted with a hetero atom, or a hydrogen atom bonded to the aromatic ring within the aromatic group may be substituted with a substituent.

In the former example, a hetero aryl group in which part of the carbon atoms constituting the ring of the aromatic group have been substituted with a hetero atom such as an oxygen atom, a sulfur atom or a nitrogen atom can be used.

Examples of the substituent for the aromatic group in the latter example include an alkyl group, an alkoxy group, a halogen atom, a halogenated alkyl group, a hydroxy group, an oxygen atom (=O), —COOR", —OC(=O)R", a hydroxyalkyl group and a cyano group.

The alkyl group for the substituent in the latter example is preferably an alkyl group of 1 to 6 carbon atoms. Further, the alkyl group is preferably a linear alkyl group or a branched alkyl group. Specific examples include a methyl group, an ethyl group, a propyl group, an isopropyl group, an n-butyl group, an isobutyl group, a tert-butyl group, a pentyl group, an isopentyl group, a neopentyl group and a hexyl group.

Among these, a methyl group or ethyl group is preferable, and a methyl group is particularly desirable.

The alkoxy group for the substituent in the latter example is preferably are alkoxy group of 1 to 6 carbon atoms. Further, the alkoxy group is preferably a linear alkoxy group or a branched alkyl group. Specific examples of the alkoxy group include the aforementioned alkyl groups for the substituent having an oxygen atom (—O—) bonded thereto.

Examples of the halogen atom as the substituent in the latter example include a fluorine atom, a chlorine atom, a bromine atom and an iodine atom.

Example of the halogenated alkyl group as the substituent in the latter example includes a group in which part or all of the hydrogen atoms within the aforementioned alkyl group have been substituted with the aforementioned halogen atoms.

In the —COOR" group and the —OC(=O)R" group, R" represents a hydrogen atom or a linear, branched or cyclic alkyl group of 1 to 15 carbon atoms.

When R" represents a linear or branched alkyl group, it is preferably an alkyl group of 1 to 10 carbon atoms, more preferably an alkyl group of 1 to 5 carbon atoms, and most preferably a methyl group or an ethyl group.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane.

The hydroxyalkyl group for the substituent in the latter example preferably has 1 to 6 carbon atoms, and specific examples thereof include the aforementioned alkyl groups for the substituent in which at least one hydrogen atom has been substituted with a hydroxy group.

Among these, the substituent for $R_{aryl}$ is preferably an alkyl group, an alkoxy group, a hydroxy group, an oxygen atom (=O), —COOR", —OC(=O)R" or a hydroxyalkyl group, more preferably an alkoxy group, a hydroxy group, —OC(=O)R" or a hydroxyalkyl group of 1 to 5 carbon atoms, and still more preferably a hydroxy group or —OC(=O)R". In terms of improvement in various lithography properties (such as development rate, heat resistance, adhesion to substrate) and sensitivity of the resist film formed using a positive resist composition containing the component (A1), a hydroxy group, —OC(=O)CH$_3$ or —OC(=O)CH$_2$CH$_3$ is particularly desirable.

Specific examples of the structural unit represented by general formula (a1-0-3) (structural units in which the hydrogen atom of —OH group has not been substituted with an acid dissociable, dissolution inhibiting group) are shown below.

[Chemical Formula 9]

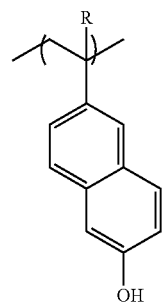

(a1-0-3-1)

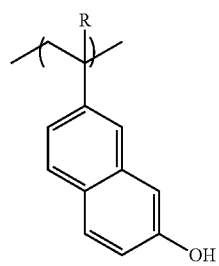 (a1-0-3-2)
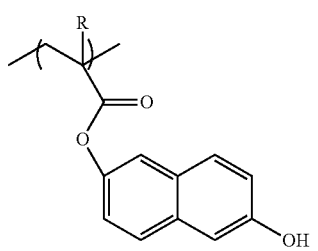 (a1-0-3-8)
(a1-0-3-3)
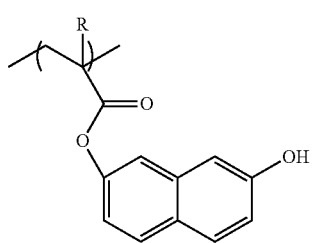 (a1-0-3-9)
(a1-0-3-4)
(a1-0-3-5)
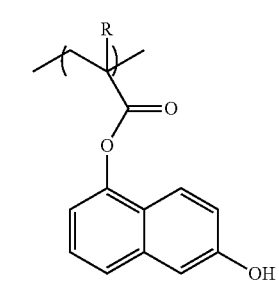 (a1-0-3-10)
(a1-0-3-6)
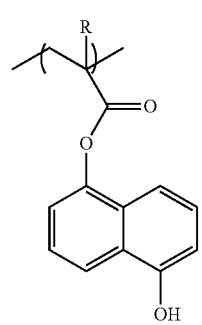 (a1-0-3-11)
(a1-0-3-7)
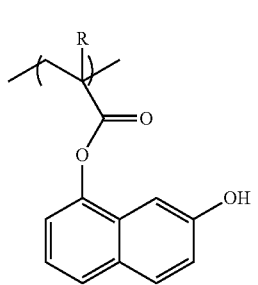
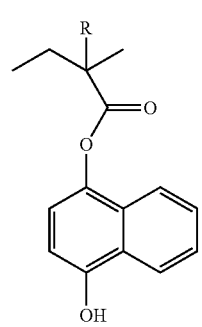 (a1-0-3-12)

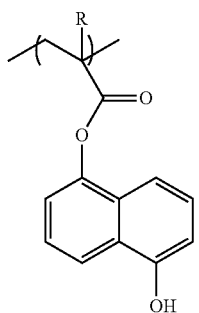 (a1-0-3-13)
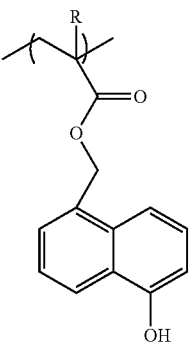 (a1-0-3-17)
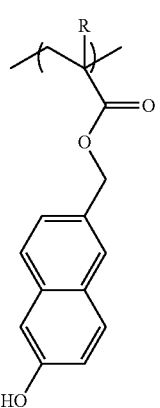 (a1-0-3-14)
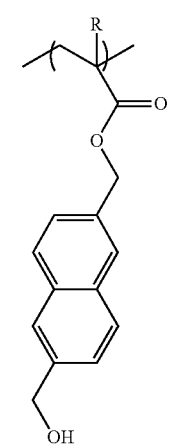 (a1-0-3-18)
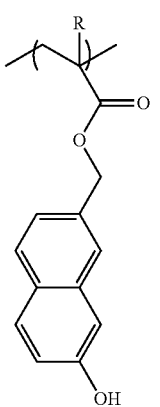 (a1-0-3-15)
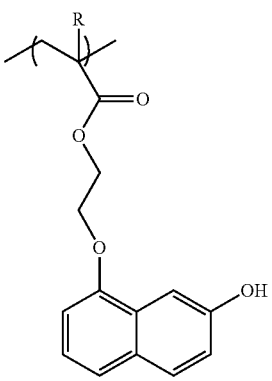 (a1-0-3-19)
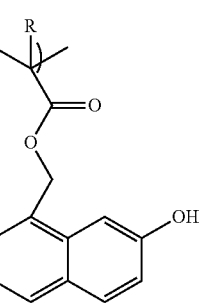 (a1-0-3-16)
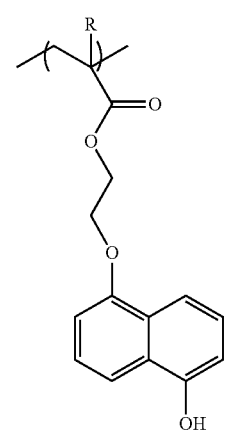 (a1-0-3-20)

-continued (a1-0-3-21)
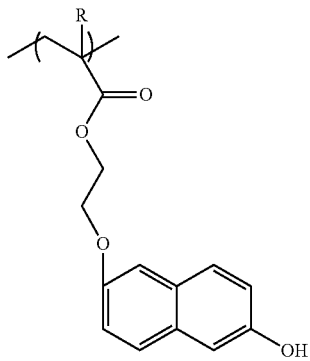

(a1-0-3-22)
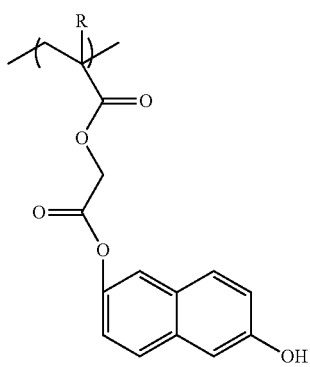

(a1-0-3-23)
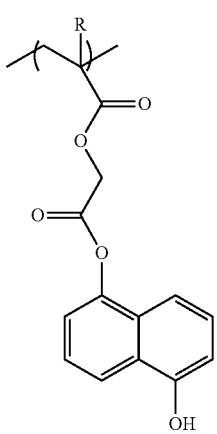

In the present invention, among the aforementioned examples, in terms of transparency in the vicinity of 193 nm, resist pattern shape and lithography properties, the structural unit (a1) is preferably a structural unit derived from an acrylate ester containing an acid dissociable, dissolution inhibiting group.

Specific examples of preferable structural units as the structural unit (a1) include structural units represented by general formulas (a1-1) to (a1-4) shown below,

[Chemical Formula 10]

(a1-1)
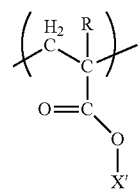

(a1-2)
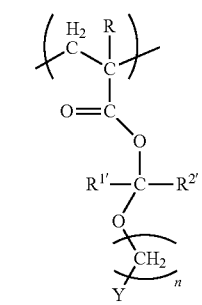

(a1-3)
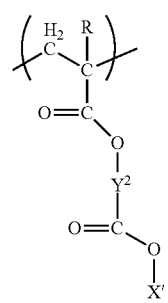

(a1-4)
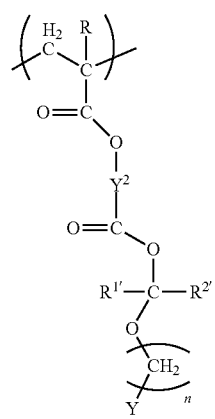

In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R is the same as defined above; and each of $R^{1\prime}$ and $R^{2\prime}$ independently represents a hydrogen atom or an alkyl group of 1 to 5 carbon atoms.

Examples of the tertiary alkyl ester-type acid dissociable, dissolution inhibiting group for X' include the same tertiary alkyl ester-type acid dissociable, dissolution inhibiting groups as those described above for $X^1$.

As $R^{1\prime}$, $R^{2\prime}$, n and Y axe respectively the same as defined for $R^{1\prime}$, $R^{2\prime}$, n and Y in general formula (p1) described above in connection with the "acetal-type acid dissociable, dissolution inhibiting group".

As examples of $Y^2$, the same groups as those described above for $Y^2$ in general formula (a1-0-2) can be given.
Specific examples of structural units represented by general formula (a1-1) to (a1-4) are shown below.
In the formulas shown below, $R^\alpha$ represents a hydrogen atom, a methyl group or a trifluoromethyl group.
[Chemical Formula 11]
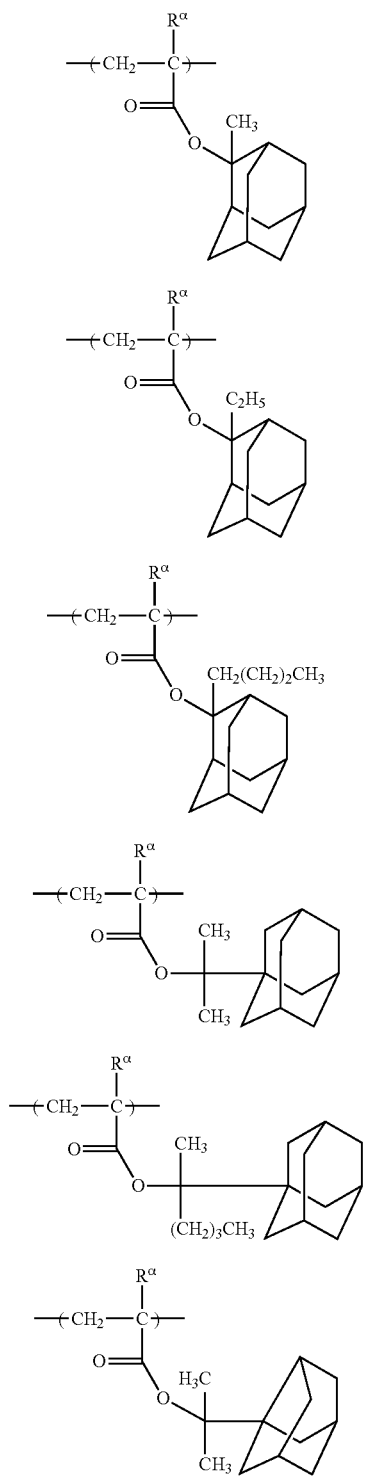
[Chemical Formula 12]
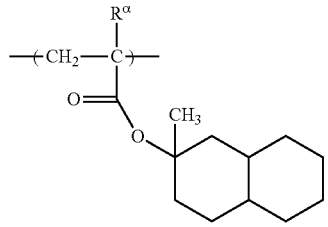
(a1-1-7)
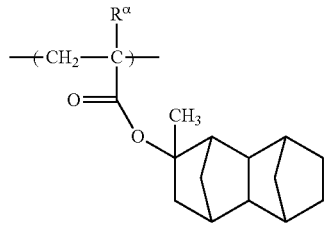
(a1-1-8)
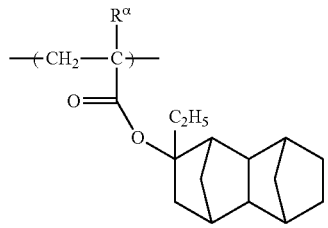
(a1-1-9)
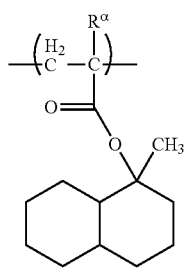
(a1-1-10)
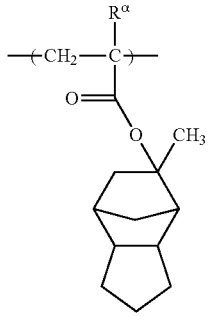
(a1-1-11)
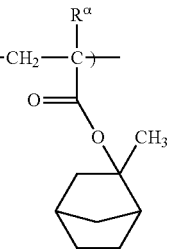
(a1-1-12)

(a1-1-13)
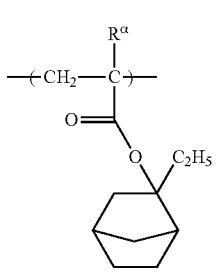
(a1-1-14)
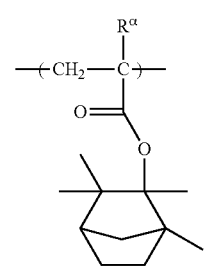
(a1-1-15)
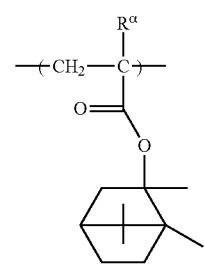
(a1-1-16)
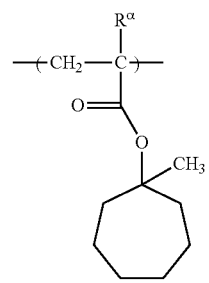
(a1-1-17)
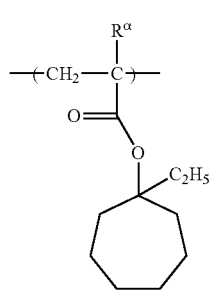
(a1-1-18)
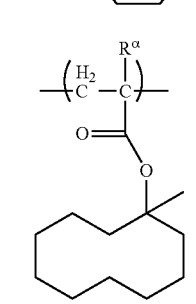
(a1-1-19)
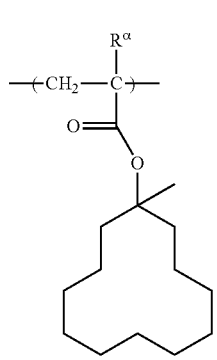
(a1-1-20)
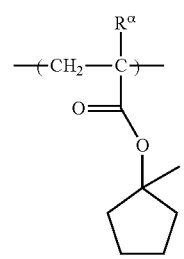
(a1-1-21)
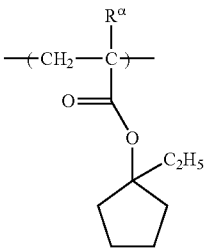
[Chemical Formula 13]
(a1-1-22)
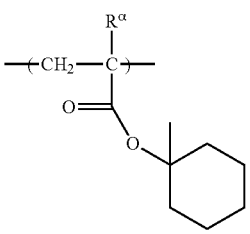
(a1-1-23)
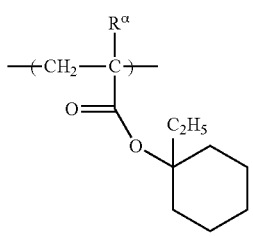
(a1-1-24)
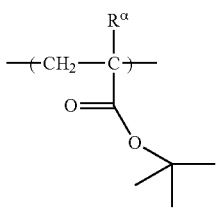

(a1-1-25)
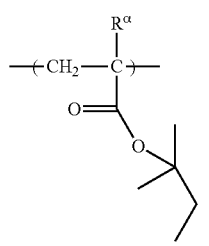
(a1-1-26)
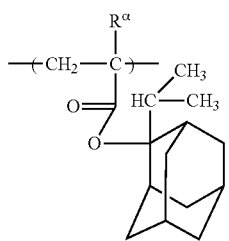
(a1-1-27)
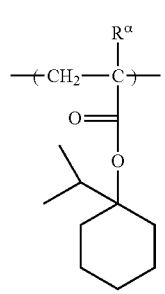
(a1-1-28)
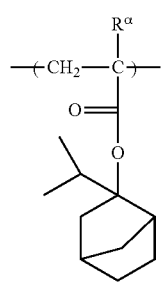
(a1-1-29)
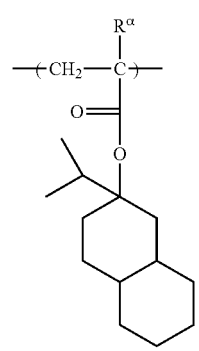
(a1-1-30)
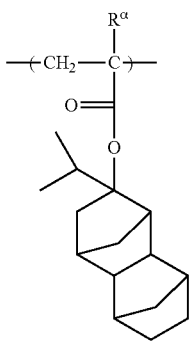
(a1-1-31)
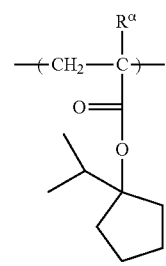
(a1-1-32)
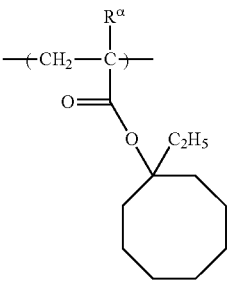
(a1-1-33)
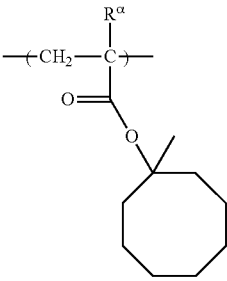
[Chemical Formula 14]
(a1-2-1)

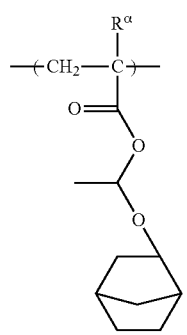 (a1-2-2)
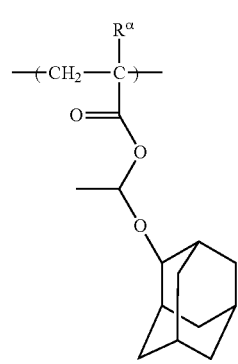 (a1-2-3)
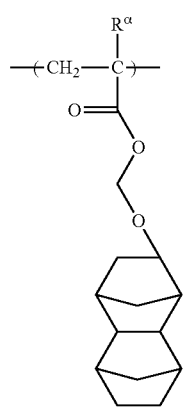 (a1-2-4)
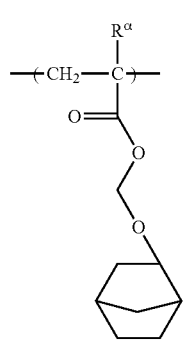 (a1-2-5)
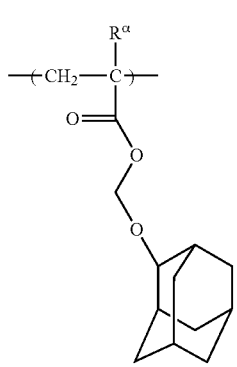 (a1-2-6)
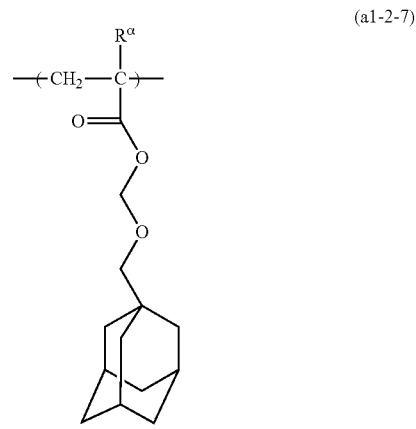 (a1-2-7)
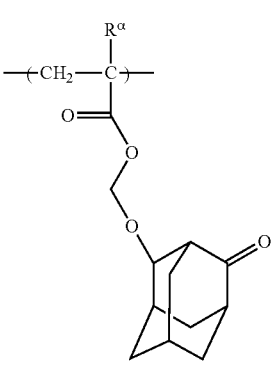 (a1-2-8)
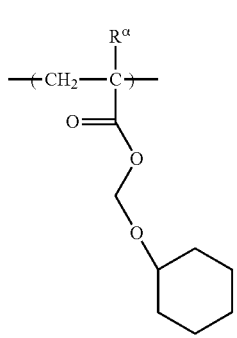 (a1-2-9)

(a1-2-10)
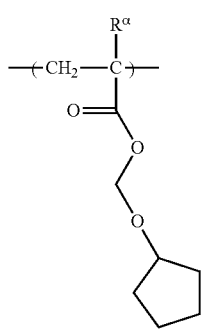
(a1-2-11)
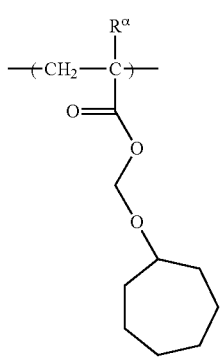
(a1-2-12)
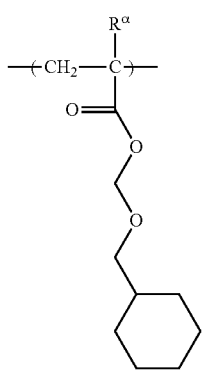
(a1-2-13)
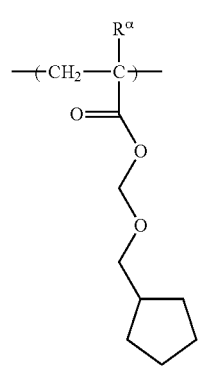
(a1-2-14)
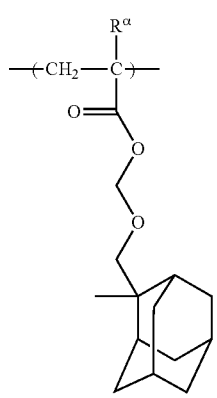
(a1-2-15)
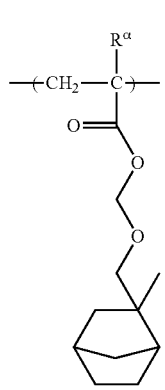
(a1-2-16)
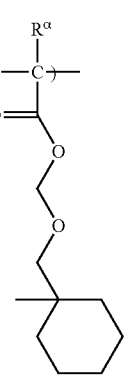
(a1-2-17)
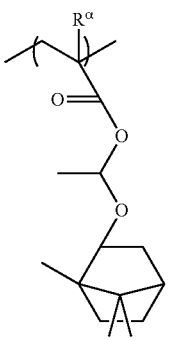

(a1-2-18)
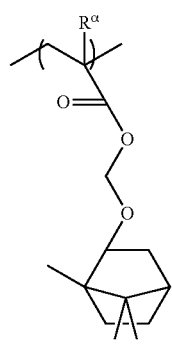
(a1-2-19)
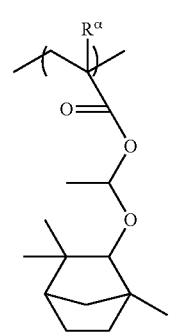
(a1-2-20)
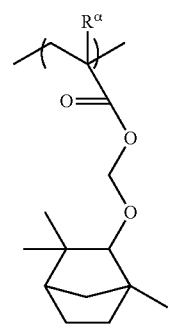
(a1-2-21)
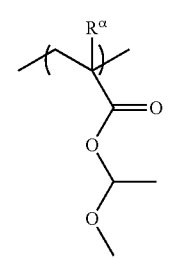
(a1-2-22)
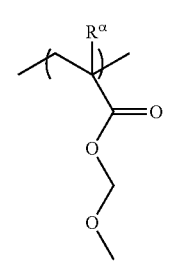
(a1-2-23)
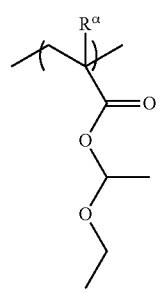
(a1-2-24)
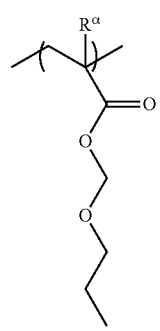
[Chemical Formula 15]
(a1-3-1)
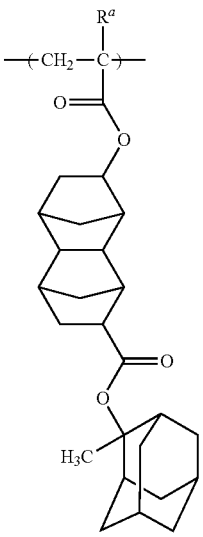

(a1-3-2)
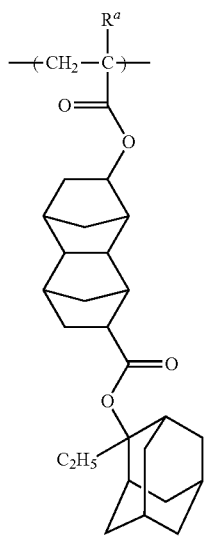
(a1-3-3)
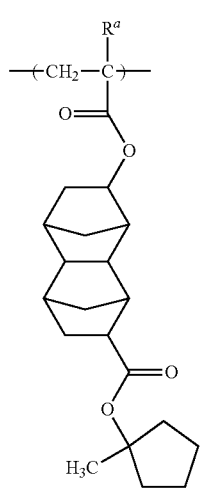
(a1-3-4)
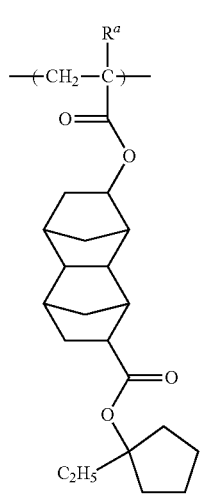
(a1-3-5)
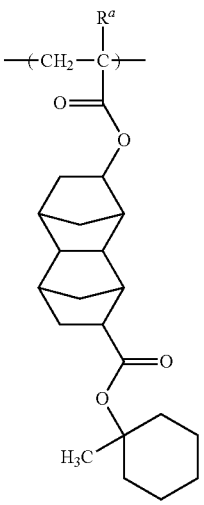
(a1-3-6)
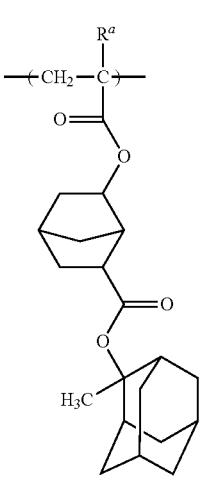
(a1-3-7)

-continued
(a1-3-8)
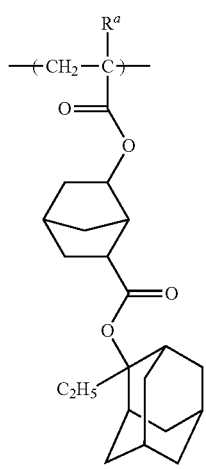
(a1-3-9)
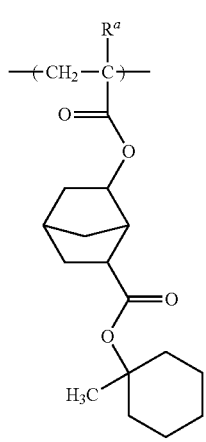
(a1-3-10)
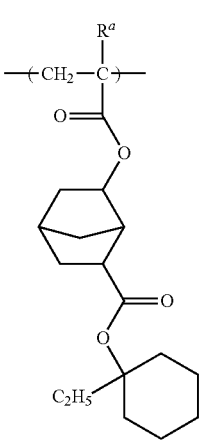
-continued
(a1-3-11)
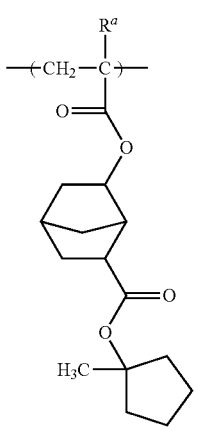
(a1-3-12)
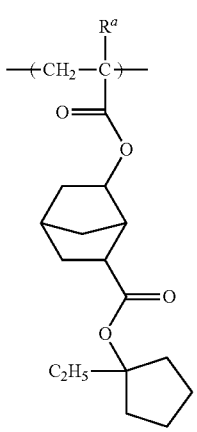
(a1-3-13)
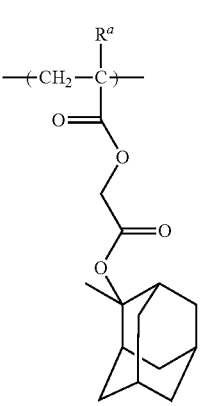
(a1-3-14)
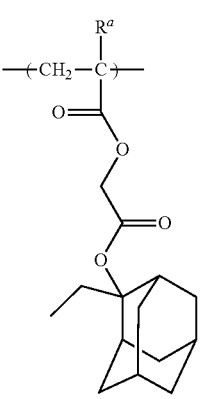

(a1-3-15) 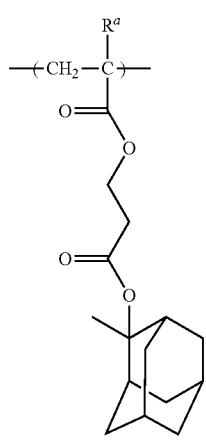
(a1-3-16) 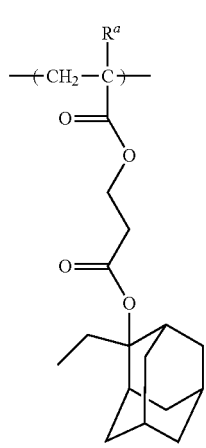
(a1-3-17) 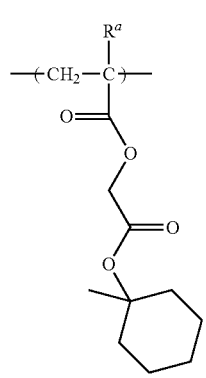
(a1-3-18) 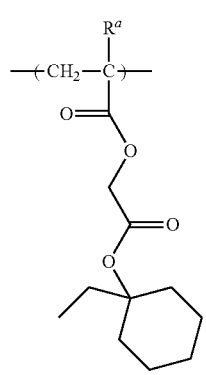
[Chemical Formula 16]
(a1-3-19) 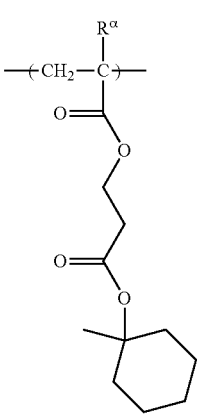
(a1-3-20) 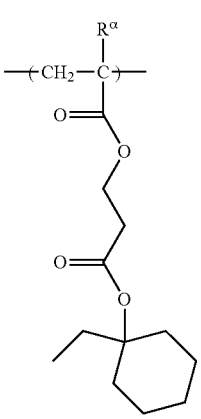
(a1-3-21) 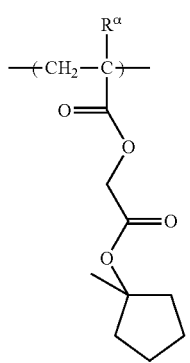
(a1-3-22) 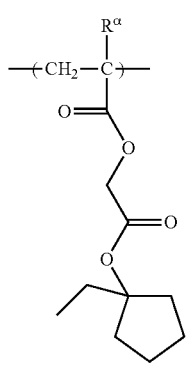

(a1-3-23)
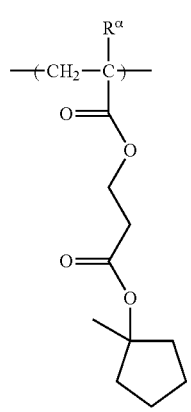
(a1-3-26)
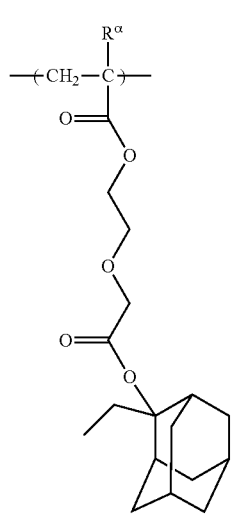
(a1-3-24)
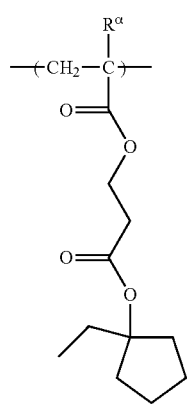
(a1-3-27)
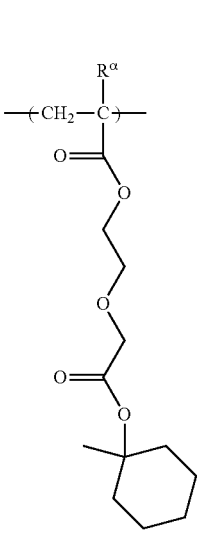
[Chemical Formula 17]
(a1-3-25)
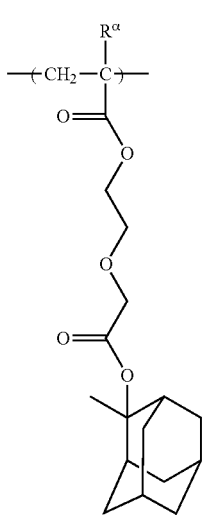
(a1-3-28)
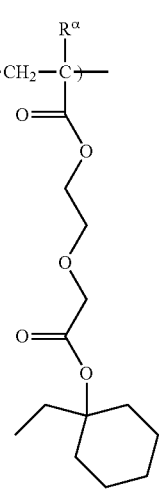

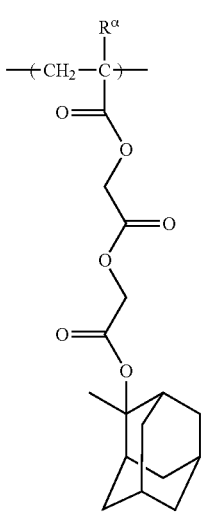 (a1-3-29)
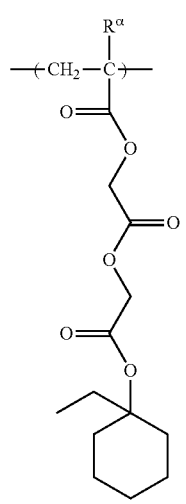 (a1-3-30)
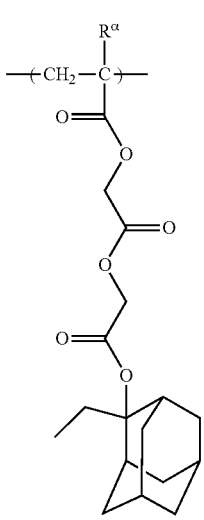 (a1-3-31)
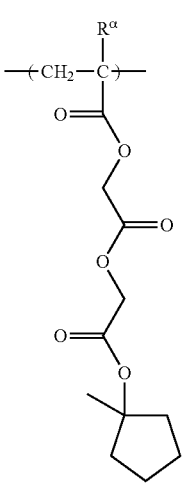 (a1-3-32)
[Chemical Formula 18]
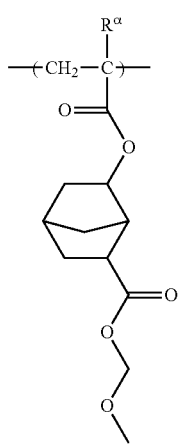 (a1-4-1)
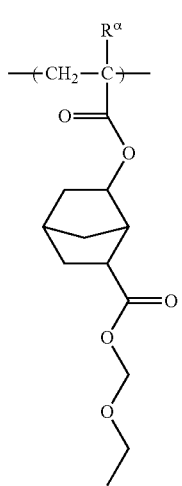 (a1-4-2)

(a1-4-3)
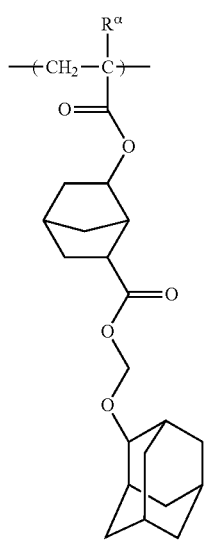
(a1-4-4)
(a1-4-5)
(a1-4-6)
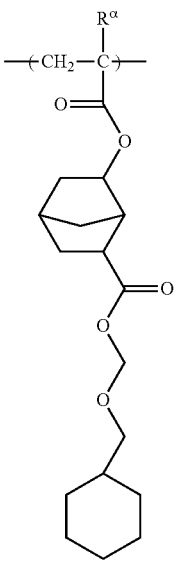
(a1-4-7)
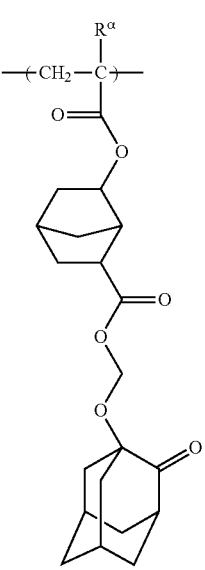
(a1-4-8)
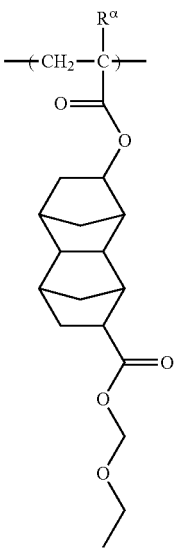

(a1-4-9)
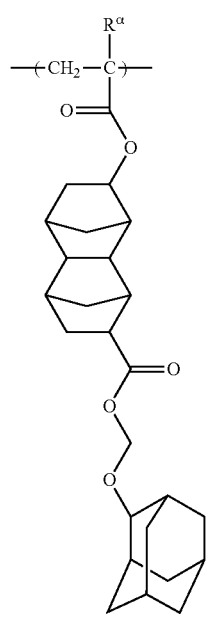
(a1-4-11)
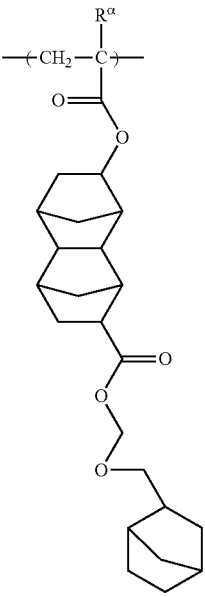
(a1-4-10)
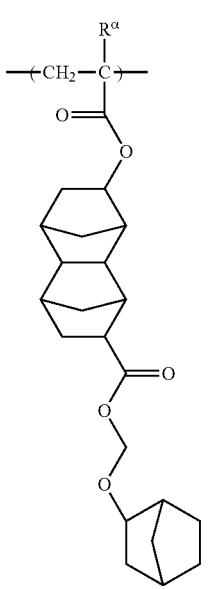
(a1-4-12)
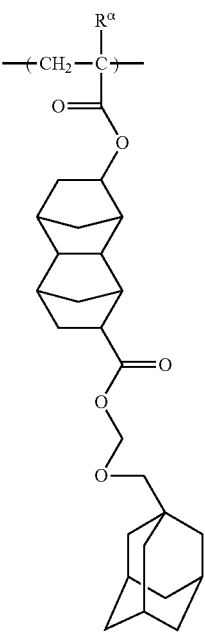

(a1-4-13)
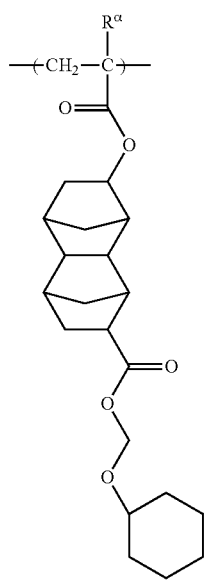

(a1-4-14)
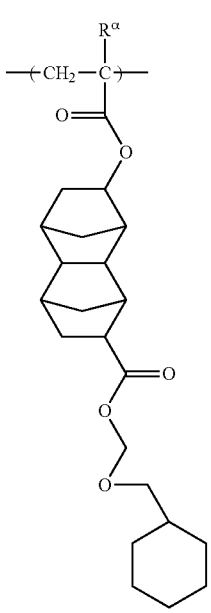

(a1-4-15)
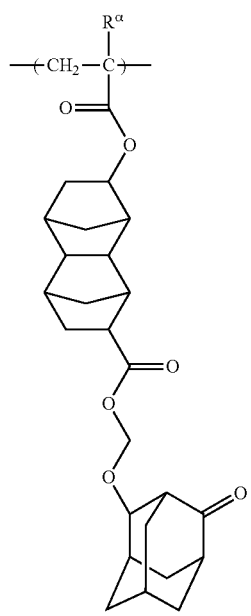

Among the structural units represented by the aforementioned general formulas (a1-1) to (a1-4), structural units represented by general formula (a1-1) or (a1-3) are preferable. More specifically, at least one structural unit selected from the group consisting of structural units represented by formulas (a1-1.1) to (a-1-1-4), (a1-1-16), (a1-1-17), (a1-1-20) to (a1-1-23), (a1-1-26), (a1-1-32), (a1-1-33) and (a1-3-25) to (a1-3-28) is more preferable.

Further, as the structural unit (a1), structural units represented by general formula (a1-1-01) shown below which includes the structural units represented by formulas (a1-1-1) to (a1-1-3) and (a1-1-26), structural units represented by general formula (a1-1-02) shown below which includes the structural units represented by formulas (a1-1-16), (a1-1-17), (a1-1-20) to (a1-1-23), (a1-1-32) and (a1-1-33), structural units represented by general formula (a1-3-01) shown below which include the structural units represented by formulas (a1-3-25) and (a1-3-26), and structural units represented by general formula (a1-3-02) shown below which include the structural units represented by formulas (a1-3-27) and (a1-3-28) are also preferable.

[Chemical Formula 19]

(a1-1-01)
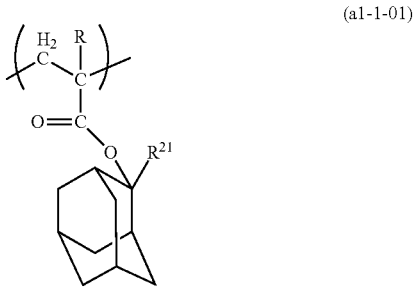

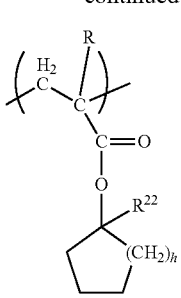

(a1-1-02)

In the formula, R represents a hydrogen atom, a lower alkyl group or a halogenated lower alkyl group; $R^{21}$ represents a lower alkyl group; $R^{22}$ represents a lower alkyl group. h represents an integer of 1 to 6.

In general formula (a1-1-01), R is the same as defined above.

The lower alkyl group for $R^{21}$ is the same as defined for the lower alkyl group for R above, a linear or branched alkyl group is preferable, and a methyl group, an ethyl group or an isopropyl group is particularly desirable.

In general formula (a1-1-02), R is the same as defined above.

The lower alkyl group for $R^{22}$ is the same as defined for the lower alkyl group for R above, a linear or branched alkyl group is preferable, and a methyl group or an ethyl group is particularly desirable.

h is preferably 1 to 4.

[Chemical Formula 20]

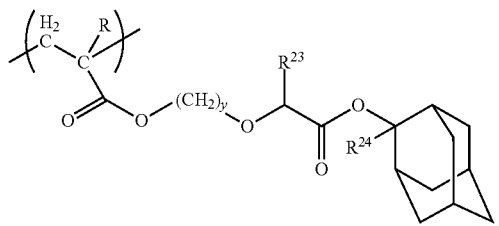

(a1-3-01)

In the formula, R represents a hydrogen atom, a lower alkyl group or a halogenated lower alkyl group; $R^{24}$ represents a lower alkyl group; $R^{23}$ represents a hydrogen atom or a methyl group; and y represents an integer of 1 to 10.

[Chemical Formula 21]

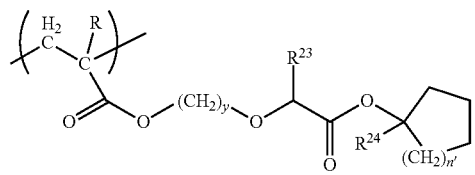

(a1-3-02)

In the formula, R represents a hydrogen atom, a lower alkyl group or a halogenated lower alkyl group; $R^{24}$ represents a lower alkyl group; $R^{23}$ represents a hydrogen atom or a methyl group; y represents an integer of 1 to 10; and n' represents an integer of 1 to 6.

In general formulas (a1-3-01) and (a1-3-02), R is the same as defined above.

$R^{23}$ is preferably a hydrogen atom.

The lower alkyl group for $R^{24}$ is the same as defined for the lower alkyl group for R, and is preferably a methyl group or an ethyl group.

y is preferably an integer of 1 to 8, more preferably an integer of 2 to 5, and most preferably 2.

n' is preferably 1 to 4.

As the structural unit (a1), one type of structural unit may be used alone, or two or more types of structural units may be used in combination.

In the component (A1), the amount of the structural unit (a1) based on the combined total of all structural units constituting the component (A1) is preferably 1 to 80 mol %, more preferably 5 to 70 mol %, and still more preferably 10 to 60 mol %. When the amount of the structural unit (a1) is at least as large as the lower limit of the above-mentioned range, a pattern can be easily formed using a resist composition prepared from the component (A1). On the other hand, when the amount of the structural unit (a1) is no more than the upper limit of the above-mentioned range, a good balance can be achieved with the other structural units.

(Structural Unit (a5))

The structural unit (a5) is a structural unit containing a base dissociable group.

In the structural unit (a5), the term "base dissociable group" refers to an organic group which can be dissociated from the structural unit (f1) by the action of a base. Examples of the base include alkali developing solutions generally used in the fields of lithography. That is, the "base dissociable group" refers to a group which is dissociated by the action of an alkali developing solution (for example, a 2.38% by weight aqueous solution of tetramethylammonium hydroxide (TMAH) at 23° C.).

A base dissociable group dissociates due to hydrolysis caused by the action of an alkali developing solution. Therefore, a hydrophilic group is formed when the base dissociable group dissociates and the hydrophilicity of the component (A1) is enhanced, and hence, the compatibility of the component (A1) with the alkali developing solution is improved.

In the component (A1), when no fluorine atom is contained in portions other than the base dissociable group within the structural unit (a5), it is necessary that the base dissociable group contain a fluorine atom. On the other hand, when a fluorine atom is contained in a portion other than the base dissociable group, the base dissociable group may or may not contain a fluorine atom.

A base dissociable group containing a fluorine atom refers to a base dissociable group in which part or all of the hydrogen atoms have been substituted with a fluorine atom.

In the structural unit (a5), the base dissociable group is not particularly limited as long as it is an organic group that satisfies the definition described above, and the base dissociable group may or may not contain a fluorine atom, although it preferably contains a fluorine atom. It is particularly desirable that the fluorine atom contained in the structural unit (a5) is present only in the base dissociable group. If the base dissociable group contains a fluorine atom, since the fluorine atom contained in the base dissociable group is also dissociated from the structural unit (a5) when the base dissociable group is dissociated by the action of an alkali developing solution, the affinity for the alkali developing solution is enhanced.

Specific examples of the base dissociable group include those represented by general formulas (II-1) to (II-5) shown below.

In the present invention, the base dissociable group is preferably at least one base dissociable group selected from those represented by general formulas (II-1) to (II-5) shown below. In consideration of the excellent characteristic of exhibiting hydrophobicity during exposure and hydrophilicity during development, and ease in synthesis, a group represented by general formula (II-1), (II-4) or (II-5) shown below is particularly desirable.

[Chemical Formula 22]

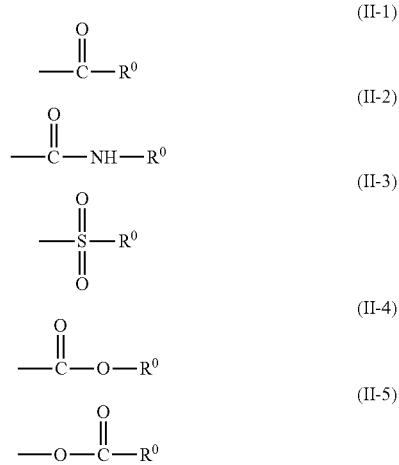

In the formulas, each $R^0$ independently represents an organic group which may have a fluorine atom.

In general formulas (II-1) to (II-5), each $R^0$ independently represents an organic group which may have a fluorine atom.

An "organic group" is a group containing at least one carbon atom.

The structure of $R^2$ may be linear, branched or cyclic, and is preferably linear or branched.

In $R^0$, the organic group preferably has 1 to 20 carbon atoms, more preferably 1 to 15 carbon atoms, still more preferably 1 to 10 carbon atoms, and most preferably 1 to 5 carbon atoms.

The fluorination ratio within $R^0$ is preferably 25% or more, more preferably 50% or more, and most preferably 60% or more, as the hydrophobicity of the resist film during immersion exposure is enhanced. The term "fluorination ratio" refers to the percentage (%) of the number of fluorine atoms based on the total number of hydrogen atoms and fluorine atoms contained within the organic group.

As a preferable example of $R^0$, a fluorinated hydrocarbon group which may or may not have a substituent such as a methyl group or an ethyl group can be given.

With respect to the fluorinated hydrocarbon group for $R^0$ which may have a substituent, the hydrocarbon group may be either an aliphatic hydrocarbon group or an aromatic hydrocarbon group, and an aliphatic hydrocarbon group is preferable.

An aliphatic hydrocarbon group refers to a hydrocarbon group having no aromaticity. The aliphatic hydrocarbon group may be either saturated or unsaturated, but in general, the aliphatic hydrocarbon group is preferably saturated.

As $R^0$, a fluorinated, saturated hydrocarbon group or a fluorinated, unsaturated hydrocarbon group is preferable, more preferably a fluorinated, saturated hydrocarbon group, and most preferably a fluorinated alkyl group.

Examples of fluorinated alkyl groups include groups in which part or all of the hydrogen atoms within the below described unsubstituted alkyl groups have been substituted with a fluorine atom. The fluorinated alkyl group may be either a group in which part of the hydrogen atoms within an unsubstituted alkyl group described below has been substituted with a fluorine atom, or a group in which all of the hydrogen atoms within an unsubstituted alkyl group described below has been substituted with a fluorine atom (i.e., a perfluoroalkyl group).

The unsubstituted alkyl group may be linear, branched or cyclic. Alternatively, the unsubstituted alkyl group may be a combination of a linear or branched alkyl group with a cyclic alkyl group.

The unsubstituted linear alkyl group preferably has 1 to 10 carbon atoms, and more preferably 1 to 8. Specific examples include a methyl group, an ethyl group, an n-propyl group, an n-butyl group, an n-pentyl group, an n-hexyl group, an n-heptyl group, an n-octyl group, an n-nonyl group and an n-decyl group.

The unsubstituted branched alkyl group preferably has 3 to 10 carbon atoms, and more preferably 3 to 8. As the branched alkyl group, a tertiary alkyl group is preferable.

As an example of an unsubstituted cyclic alkyl group, a group in which one hydrogen atom has been removed from a monocycloalkane or a polycycloalkane such as a bicycloalkane, tricycloalkane or tetracycloalkane can be given. Specific examples include monocycloalkyl groups such as a cyclopentyl group and a cyclohexyl group; and polycycloalkyl groups such as an adamantyl group, a norbornyl group, an isobornyl group, a tricyclodecyl group and a tetracyclododecyl group.

Examples of the combination of a linear or branched alkyl group with a cyclic alkyl group include groups in which a cyclic alkyl group as a substituent is bonded to a linear or branched alkyl group, and groups in which a linear or branched alkyl group as a substituent is bonded to a cyclic alkyl group.

Examples of substituents for the fluorinated hydrocarbon group include a lower alkyl group of 1 to 5 carbon atoms.

As the fluorinated alkyl group for $R^0$, a linear or branched fluorinated alkyl group is preferable. In particular, a group represented by general formula (III-1) or (III-2) shown below is desirable, and a group represented by general formula (III-1) is most preferable.

[Chemical Formula 23]

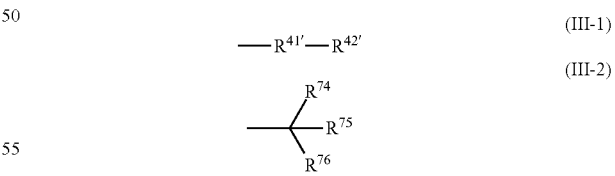

In general formula (III-1), $R^{41'}$ represents an unsubstituted alkylene group of 1 to 9 carbon atoms, and $R^{42'}$ represents a fluorinated alkyl group of 1 to 9 carbon atoms, provided that the total number of carbon atoms of $R^{41'}$ and $R^{42'}$ is no more than 10. In general formula (III-2), each of $R^{74}$ to $R^{76}$ independently represents a linear alkyl group of 1 to 5 carbon atoms, with the provision that at least one of $R^{74}$ to $R^{76}$ represents an alkyl group having a fluorine atom.

In general formula (III-1), the alkylene group for $R^{41'}$ may be linear, branched or cyclic, and is preferably linear or branched. Further, the number of carbon atoms within the alkylene group is preferably within a range of from 1 to 5.

As $R^{41'}$, a methylene group, an ethylene group or a propylene group is particularly desirable.

As $R^{42'}$, a linear or branched fluorinated alkyl group of 1 to 5 carbon atoms is preferable, and a perfluoroalkyl group is particularly desirable. Among perfluoroalkyl groups, a trifluoromethyl group (—$CF_3$), a tetrafluoroethyl group (—$C_2F_4H$) or —$C_2F_5$ is preferable.

In general formula (III-2), as the alkyl group for $R^{74}$ to $R^{76}$, an ethyl group or a methyl group is preferable, and a methyl group is particularly desirable. At least one of the alkyl groups for $R^{74}$ to $R^{76}$ is a fluorinated alkyl group, and all of the alkyl groups for $R^{74}$ to $R^{76}$ may be fluorinated alkyl groups.

As a preferable example of the structural unit (a5), a structural unit represented by general formula (a5-0) shown, below can be given.

[Chemical Formula 24]

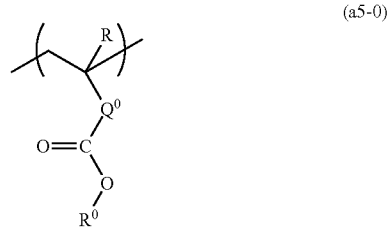

(a5-0)

In general formula (a5-0), R represents a hydrogen atom, an alkyl group of 1 to 5 carbon atoms or a halogenated alkyl group of 1 to 5 carbon atoms; $Q^0$ represents a single bond or a divalent linking group which may have a fluorine atom; and $R^0$ represents an organic group which may have a fluorine atom.

In general formula (a5-0), R represents a hydrogen atom, an alkyl group of 1 to 5 carbon atoms or a halogenated alkyl group of 1 to 5 carbon atoms, and is the same as defined for R described above in the explanation of the component (A).

Specific examples of the alkyl group of 1 to 5 carbon atoms for R include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group for R include groups in which part or all of the hydrogen atoms of the aforementioned lower alkyl group have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, a hydrogen atom or a methyl group is more preferable, and a methyl group is particularly desirable.

In general formula (a5-0), $Q^0$ represents a single bond or a divalent linking group which may have a fluorine atom.

With respect to the divalent linking group for $Q^0$, the divalent linking group may have a fluorine atom means that part or all of the hydrogen atoms within the linking group may be substituted with a fluorine atom.

The divalent linking group for $Q^0$ may or may not have an acid dissociable portion in the structure thereof.

An "acid dissociable portion" refers to a portion within the $Q^0$ group which is dissociated from the group by action of acid generated from the component (B) upon exposure. Specific examples of such acid dissociable portion include a portion that forms a cyclic or chain-like tertiary alkyl ester with the carbonyl group; and a portion in which one or more hydrogen atoms have been removed from a group bonded to the oxygen atom constituting the acetal structure of an acetal-type acid dissociable, dissolution inhibiting group such as an alkoxyalkyl group.

As preferable examples of the divalent linking group for $Q^0$, a divalent hydrocarbon group which may have a substituent, and a divalent linking group containing a hetero atom can be given.

As examples of the divalent hydrocarbon group which may have a substituent and the divalent linking group containing a hetero atom, the same groups as those described above for the "divalent linking group containing a hetero atom" represented by $Y^2$ in general formula (a1-0-2) and the "divalent hydrocarbon group which may have a substituent" represented by A and B in the formula "A-O—B" for $Y^2$.

The divalent linking group for $Q^0$ may be the "divalent hydrocarbon group which may have a substituent" or the "divalent linking group containing a hetero atom" which may or may not have a fluorine atom.

In the present invention, the divalent linking group for $Q^0$ is preferably a linear or branched alkylene group, a divalent linking group containing a divalent aromatic cyclic group or a hetero atom, or any of these groups containing a fluorine atom. Among these, a divalent linking group containing a hetero atom which may have a fluorine atom is particularly desirable.

When $Q^0$ represents a linear or branched alkylene group, it preferably has 1 to 10 carbon atoms, more preferably 1 to 6, still more preferably 1 to 4, and most preferably 1 to 3. Specific examples include the same linear alkylene groups and branched alkylene groups as those described above for the "divalent hydrocarbon group which may have a substituent".

When $Q^0$ represents a divalent aromatic cyclic group, examples of the aromatic cyclic group include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group; an aromatic hydrocarbon group in which part of the carbon atoms constituting the ring of the aforementioned divalent aromatic hydrocarbon group has been substituted with a hetero atom such as an oxygen atom, a sulfur atom or a nitrogen atom; and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

When $Q^0$ represents a divalent linking group containing a hetero atom, preferable examples of the divalent linking group include —O—, —C(=O)—O—, —C(=O)—, —O—C(=O)—O—, —C(=O)—NH—, —$NR^{04}$—($R^{04}$ represents a substituent such as an alkyl group or an acyl group), —S—, —S(=O)$_2$—, —S(=O)$_2$—O—, a group represented by the formula —C(=O)—O—$R^{08}$—, a group represented by the formula —O—$R^{08}$—, a group represented by the formula —$R^{09}$—O— and a group represented by the formula —$R^{09}$—O—$R^{08}$—.

$R^{08}$ represents a divalent hydrocarbon group which may have a substituent, preferably a linear or branched aliphatic hydrocarbon group, and more preferably an alkylene group or an alkylalkylene group.

As the alkylene group, a methylene group or an ethylene group is particularly desirable.

The alkyl group within the alkylalkylene group is preferably a linear alkyl group of 1 to 5 carbon atoms, more preferably a linear alkyl group of 1 to 3 carbon atoms, and most preferably an ethyl group.

The $R^{08}$ groups may or may not contain a fluorine atom.

$R^{09}$ represents a divalent aromatic cyclic group, preferably a group in which one hydrogen atom has been removed from the nucleus of a monovalent aromatic hydrocarbon group, and most preferably a group in which one hydrogen atom has been removed from a naphthyl group.

In general formula (a5-0), $R^0$ represents an organic group which may have a fluorine atom, and is the same as defined for $R^0$ in general formulas (II-1) to (II-5).

Among the aforementioned examples, when the structural unit (a5) is represented by general formula (a5-0) in which $Q^0$ is a single bond, $R^0$ is preferably a methyl group or an ethyl group.

Alternatively, when the structural unit (a5) is represented by general formula (a5-0) in which $Q^0$ is a divalent linking group which may have a fluorine atom, it is preferably a structural unit represented by general formula (a5-01) shown below or general formula (a5-02) described later.

[Chemical Formula 25]

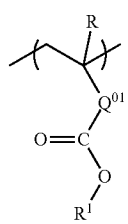

(a5-01)

In general formula (a5-01), R represents a hydrogen atom, an alkyl group of 1 to 5 carbon atoms or a halogenated alkyl group of 1 to 5 carbon atoms; $Q^{01}$ represents a divalent linking group having no fluorine atom; and $R^1$ represents an organic group having a fluorine atom.

Structural unit represented by general formula (a5-01)

In general formula (a5-01), R represents a hydrogen atom, an alkyl group of 1 to 5 carbon atoms or a halogenated alkyl group of 1 to 5 carbon atoms, and is the same as defined for R in general formula (a5-0).

In general formula (a5-01), $Q^{01}$ represents a divalent linking group having no fluorine atom, and examples thereof include the same groups as those described above for $Q^0$ in general formula (a5-0) which have no fluorine atom.

In general formula (a5-01), $R^1$ represents an organic group having a fluorine atom, and examples thereof include the same groups as those described above for $R^0$ in general formula (a5-0) which have a fluorine atom.

Preferable examples of such a structural unit represented by general formula (a5-01) include at least one structural unit selected from the group consisting of a structural unit represented by general formula (a5-01-1) shown below and a structural unit represented by general formula (a5-01-2) shown below.

[Chemical Formula 26]

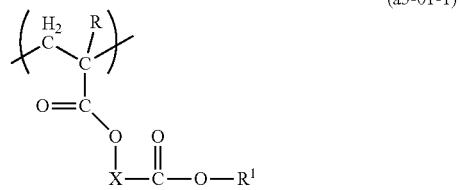

(a5-01-1)

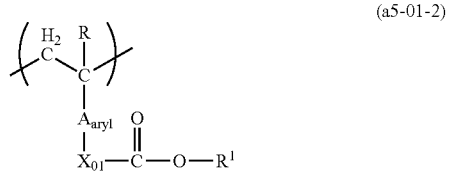

(a5-01-2)

In the formula, each R independently represents a hydrogen atom, an alkyl group of 1 to 5 carbon atoms or a halogenated alkyl group of 1 to 5 carbon atoms, and each $R^1$ independently represents an organic group having a fluorine atom. In general formula (a5-01-1), X represents a divalent organic group. In general formula (a5-01-2), $A_{aryl}$ represents a divalent aromatic cyclic group which may have a substituent, and $X_{01}$ represents a single bond or a divalent linking group. However, each of X, $A_{aryl}$ and $X_{01}$ has no fluorine atom.

In general formulas (a5-01-1) and (a5-01-2), as the lower alkyl group for R, a linear or branched lower alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group include groups in which part or all of the hydrogen atoms of the aforementioned "lower alkyl group" have been substituted with a halogen atom. Examples of the halogen atom include a fluorine atom, a chlorine atom, a bromine atom and an iodine atom, and a fluorine atom is particularly desirable.

In the present invention, as R, a hydrogen atom, a lower alkyl group or a fluorinated lower alkyl group is preferable, and a hydrogen atom or a methyl group is more preferable in terms of industrial availability.

In general formulas (a5-01-1) and (a5-01-2), $R^1$ represents an organic group having a fluorine atom, and is the same as defined for $R^1$ in general formula (a5-01).

In general formulas (a5-01-1) and (a5-01-2), $R^1$ is preferably a fluorinated hydrocarbon group, more preferably a fluorinated alkyl group, still more preferably a fluorinated alkyl group of 1 to 5 carbon atoms, still more preferably —$CH_2$—$CF_3$, —$C_2$—$CF_2$—$CF_3$, —$CH(CF_3)_2$ or —$CH_2$—$CF_2$—$CF_2$—$CF_3$, and most preferably —$CH_2$—$CF_3$ or —$CH_2$—$CF_2$—$CF_3$.

In general formula (a5-01-1), X represents a divalent organic group.

X may or may not have an acid dissociable portion.

An "acid dissociable portion" refers to a portion within the organic group which is dissociated from the organic group by the action of acid generated upon exposure. When X has an acid dissociable portion, it is preferable that the acid dissociable portion has a tertiary carbon atom.

Preferable examples of X include a hydrocarbon group which may have a substituent, and a group containing a hetero atom.

A hydrocarbon "has a substituent" means that part or all of the hydrogen atoms within the hydrocarbon group is substituted with groups or atoms other than hydrogen.

The hydrocarbon group may be either an aliphatic hydrocarbon group or an aromatic hydrocarbon group.

An "aliphatic hydrocarbon group" refers to a hydrocarbon group that has no aromaticity.

The aliphatic hydrocarbon group may be either saturated or unsaturated, but in general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

The linear or branched aliphatic hydrocarbon group preferably has 1 to 10 carbon atoms, more preferably 1 to 8, still more preferably 1 to 5, and most preferably 1 or 2.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated lower alkyl group of 1 to 5 carbon atoms, and an oxygen atom (=O).

As examples of the hydrocarbon group containing a ring, a cyclic aliphatic hydrocarbon group (a group in which two hydrogen atoms have been removed from an aliphatic hydrocarbon ring), and a group in which the cyclic aliphatic hydrocarbon group is bonded to the terminal of the aforementioned chain-like aliphatic hydrocarbon group or interposed within the aforementioned chain-like aliphatic hydrocarbon group, can be given.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include a lower alkyl group of 1 to 5 carbon atoms, a fluorine atom, a fluorinated lower alkyl group of 1 to 5 carbon atoms, and an oxygen atom (=O).

With respect to a divalent group containing a hetero atom, a hetero atom is an atom other than carbon and hydrogen, and examples thereof include an oxygen atom, a nitrogen atom, a sulfur atom and a halogen atom.

Specific examples of divalent groups containing a hetero atom include —O—, —C(=O)—, —C(=O)—O—, a carbonate bond (—O—C(=O)—O—), —NH—, NH—, —$NR^{05}$— (in the formula, $R^{05}$ represents an alkyl group), —NH—C(=O)—, and a combination of any of these "groups" with a divalent hydrocarbon group. As examples of the divalent hydrocarbon group, the same groups as those described above for the hydrocarbon group which may have a substituent can be given, and a linear or branched aliphatic hydrocarbon group is preferable.

In general formula (a5-01-2), $A_{aryl}$ represents a divalent aromatic cyclic group which may have a substituent. A specific example of $A_{aryl}$ includes an aromatic hydrocarbon ring (which may have a substituent) having two hydrogen atoms removed therefrom.

The ring skeleton of the aromatic cyclic group for $A_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of the substituent for the aromatic cyclic group represented by $A_{aryl}$ include a halogen atom, an alkyl group, an alkoxy group, a halogenated lower alkyl group and an oxygen atom (=O). Examples of the halogen atom include a fluorine atom, a chlorine atom, an iodine atom and a bromine atom. As the substituent for the aromatic cyclic group represented by $A_{aryl}$, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ represents an aromatic cyclic group having a substituent, the number of the substituent may be 1 or more, preferably 1 or 2, and more preferably 1.

In general formula (a5-01-2), $X_{01}$ represents a single bond or a divalent linking group. Examples of divalent linking groups include an alkylene group of 1 to 10 carbon atoms, —O—, —C(=O)—, —C(=O)—O—, a carbonate bond (—O—C(=O)—O—), —NH—C(=O)—, and a combination of these groups. Of these, a combination of —O— with an alkylene group of 1 to 10 carbon atoms is particularly desirable.

Examples of alkylene groups of 1 to 10 carbon atoms include linear, branched or cyclic alkylene groups, and a linear or branched alkylene group of 1 to 5 carbon atoms and a cyclic alkylene group of 4 to 10 carbon atoms are preferable.

Among structural units represented by the aforementioned general formula (a5-01-1), structural units represented by general formulas (a5-01-11) to (a5-01-16) shown below are preferable.

Further, among structural units represented by the aforementioned general formula (a5-01-2), structural units represented by general formulas (a5-01-21) to (a5-01-26) shown below are preferable.

[Chemical Formula 27]
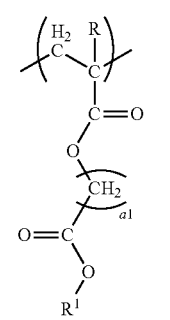 (a5-01-11)
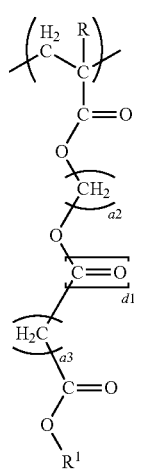 (a5-01-12)
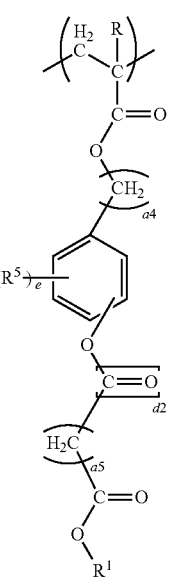 (a5-01-13)
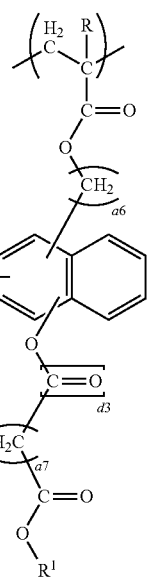 (a5-01-14)
[Chemical Formula 28]
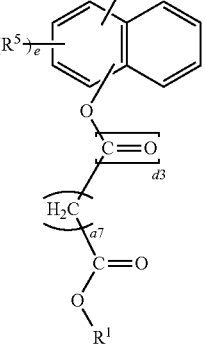 (a5-01-15)
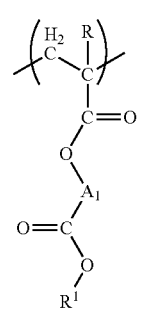 (a5-01-16)

[Chemical Formula 29]

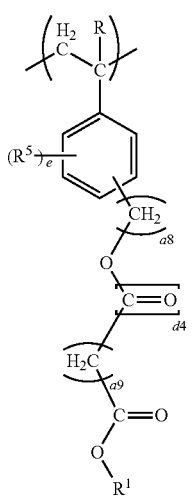
(a5-01-21)

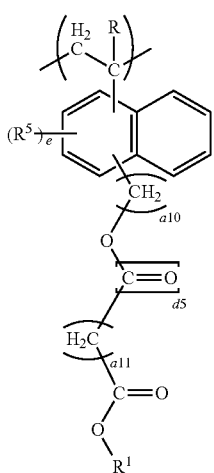
(a5-01-22)

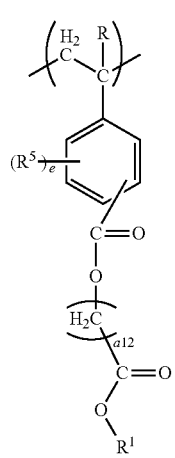
(a5-01-23)

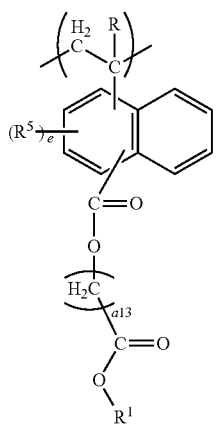
(a5-01-24)

[Chemical Formula 30]

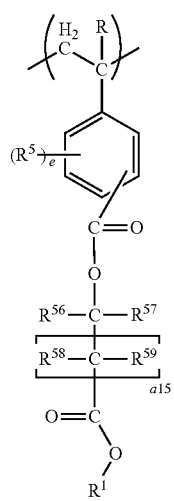
(a5-01-25)

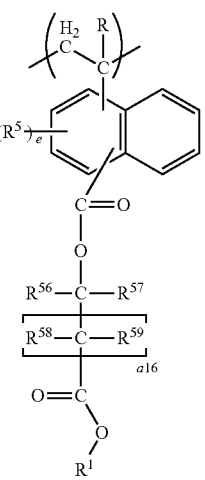
(a5-01-26)

In general formulas (a5-01-11) to (a5-01-16) and (a5-01-21) to (a5-01-26), R and $R^1$ are the same as defined above; each of $R^{56}$ and $R^{57}$ independently represents an alkyl group of 1 to 10 carbon atoms; each of $R^{58}$ and $R^{59}$ independently represents a hydrogen atom or an alkyl group of 1 to 10 carbon atoms; each of a1, a2, a3, a5, a7 a9 and a11 to a13 independently represents an integer of 1 to 5; each of a4, a6, a8 and a10 independently represents an integer of 0 to 5; each of a14 to a16 independently represents an integer of 1 to 5; each of d1 to d5 independently represents 0 or 1; $R^5$ represents a substituent; e represents an integer of 0 to 2; and $A_1$ represents a cyclic alkylene group of 4 to 20 carbon atoms.

In formulas (a5-01-11) to (a5-01-16) and (a5-01-21) to (a5.01-26), as R, a hydrogen atom or a methyl group is preferable.

In general formula (a5-01-11), a1 is preferably an integer of 1 to 3, more preferably 1 or 2.

In formula (a5-01-12), it is preferable that each of a2 and a3 independently represent an integer of 1 to 3, and more preferably 1 or 2.

d1 is preferably 0.

In formula (a5-01-13), a4 is preferably an integer of 0 to 3, more preferably an integer of 0 to 2, and most preferably 0 or 1.

a5 is preferably an integer of 1 to 3, and more preferably 1 or 2.

Examples of the substituent for $R^5$ include a halogen atom, a lower alkyl group, an alkoxy group of 1 to 5 carbon atoms, a halogenated lower alkyl group, or an oxygen atom (=O). As the lower alkyl group, the same lower alkyl groups as those described above for R can be mentioned. Examples of the halogen atom include a fluorine atom, a chlorine atom, an iodine atom and a bromine atom. As the halogenated lower alkyl group, the same halogenated lower alkyl groups as those described above for R can be mentioned.

e is preferably 0 or 1, and most preferably 0 from an industrial viewpoint.

d2 is preferably 0.

In general formula (a5-01-14), a6 is preferably an integer of 0 to 3, more preferably an integer of 0 to 2, and most preferably 0 or 1.

a7 is preferably an integer of 1 to 3, and more preferably 1 or 2.

d3 is preferably 0.

$R^5$ and e are the same as defined above.

In formula (a5-01-15), a14 is preferably an integer of 0 to 3, more preferably an integer of 0 to 2, and most preferably 0 or 1.

It is preferable that each of $R^{56}$ and $R^{57}$ independently represents a linear, branched or cyclic alkyl group of 1 to 10 carbon atoms, and specific examples thereof include a methyl group, an ethyl group, an n-propyl group, an isopropyl group, an n-butyl group, an isobutyl group, a tert-butyl group, a tert-pentyl group, a cyclopentyl group, a cyclohexyl group, a cyclooctyl group, a norbornyl group, an isobornyl group, a tricyclodecyl group, an adamantyl group and a tetracyclododecyl group. Of these, an alkyl group of 1 to 6 carbon atoms is preferable, more preferably an alkyl group of 1 to 4 carbon atoms, and most preferably a methyl group or an ethyl group.

It is preferable that each of $R^{58}$ and $R^{59}$ independently represents a hydrogen atom, or a linear, branched or cyclic alkyl group of 1 to 10 carbon atoms. For $R^{58}$ and $R^{59}$, the linear, branched or cyclic alkyl group of 1 to 10 carbon atoms is the same as defined above for $R^{56}$ and $R^{57}$.

In formula (a5-01-16), $A_1$ represents a cyclic alkylene group of 4 to 20 carbon atoms, and is preferably a cyclic alkylene group of 5 to 15 carbon atoms, and more preferably a cyclic alkylene group of 6 to 12 carbon atoms. Specific examples of the cyclic alkylene group include those described above as the "cyclic aliphatic hydrocarbon group" for the aforementioned hydrocarbon group which may have a substituent, and the cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent.

Examples of substituents include a lower alkyl group of 1 to 5 carbon atoms and an oxygen atom (=O).

In formula (a5-01-21), a8 is preferably an integer of 0 to 3, more preferably an integer of 0 to 2, and most preferably 0 or 1.

a9 is preferably an integer of 1 to 3, and more preferably 1 or 2.

d4 is preferably 0.

$R^5$ and e are the same as defined above.

In formula (a5-01-22), a10 is preferably an integer of 0 to 3, more preferably an integer of 0 to 2, and most preferably 0 or 1.

a11 is preferably an integer of 1 to 3, and more preferably 1 or 2.

d5 is preferably 0.

$R^5$ and e are the same as defined above.

In formula (a5-01-23), a12 is preferably an integer of 1 to 3, and more preferably 1 or 2.

$R^5$ and e are the same as defined above.

In formula (a5-01-24), a13 is preferably an integer of 1 to 3, and more preferably 1 or 2.

$R^5$ and e are the same as defined above.

In formulas (a5-01-25) and (a5-01-26), each of a15 and a16 is preferably an integer of 0 to 3, more preferably an integer of 0 to 2, and most preferably 0 or 1.

$R^{56}$, $R^{57}$, $R^{55}$ and $B^{59}$ are the same as defined above.

In general formulas (a5-01-25) and (a5-01-26), $R^5$ and e are the same as defined above.

Specific examples of structural units represented by the above general formulas (a5-01-11) to (a5-01-16) and (a5-01-21) to (a5-01-26) are shown below.

[Chemical Formula 31]

-continued
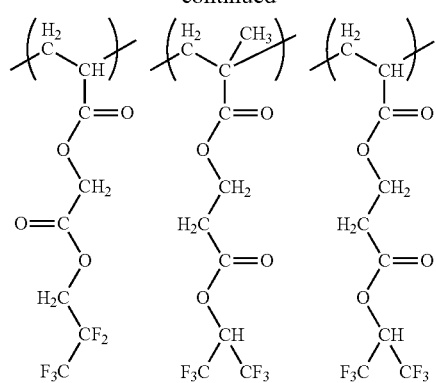
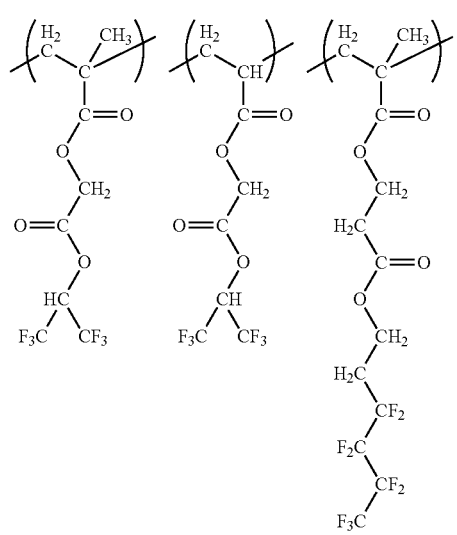
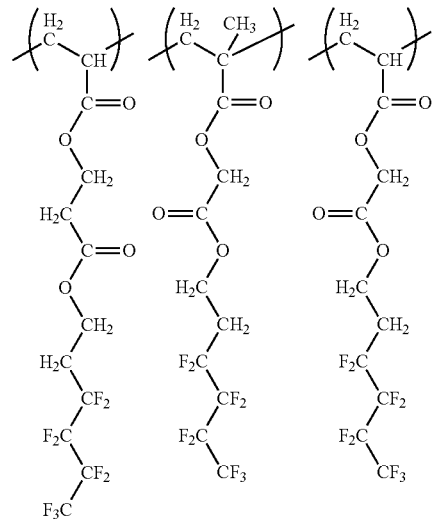
-continued
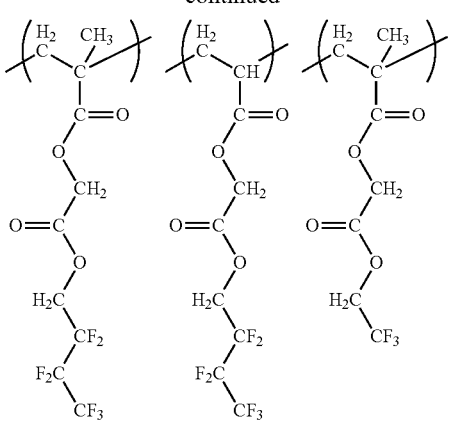
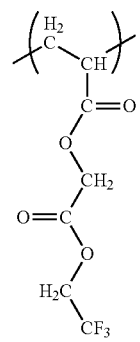
[Chemical Formula 32]
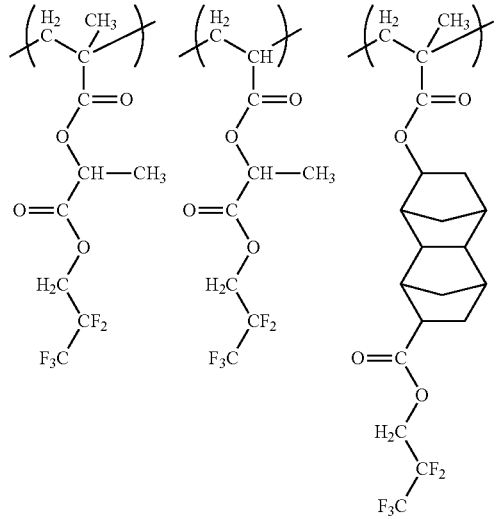

-continued
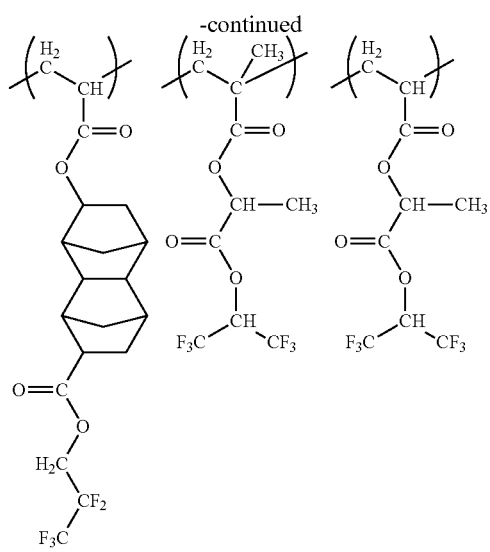
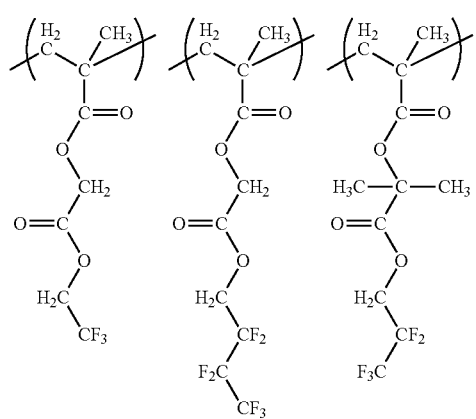
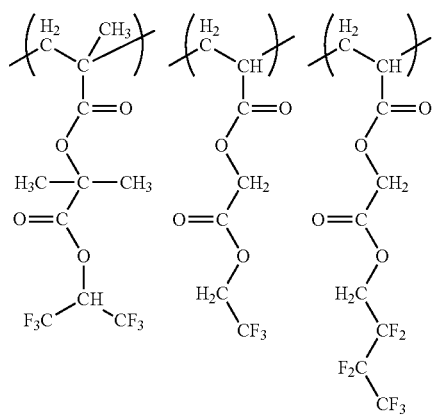
-continued
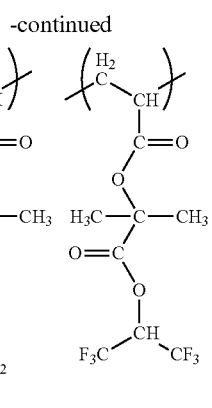
[Chemical Formula 33]
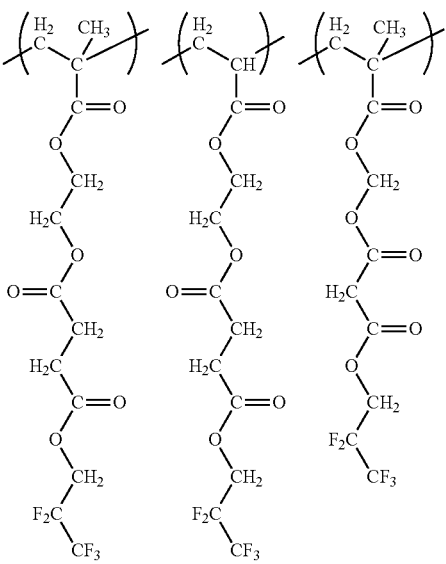
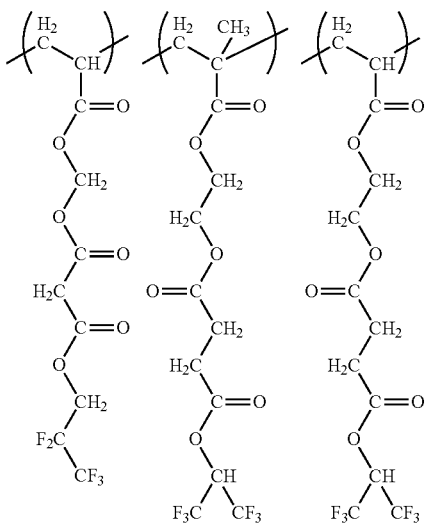

73
-continued
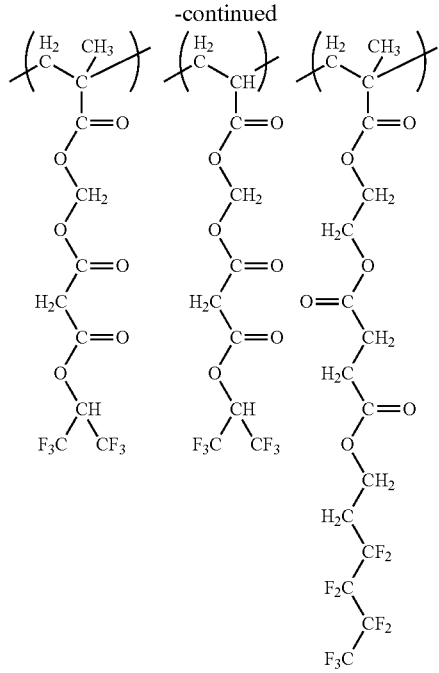
74
-continued
[Chemical Formula 34]
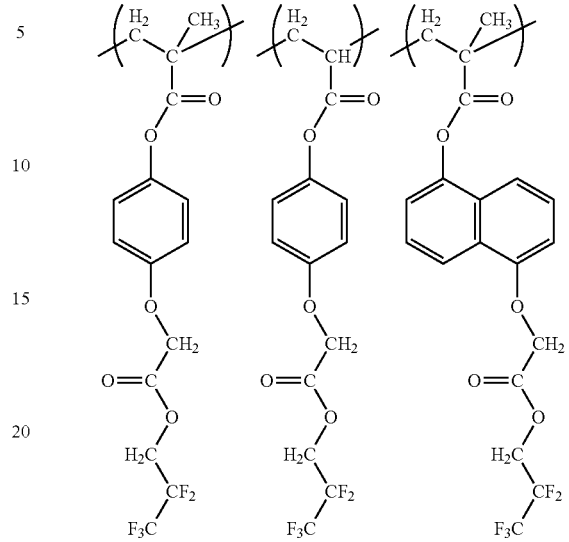
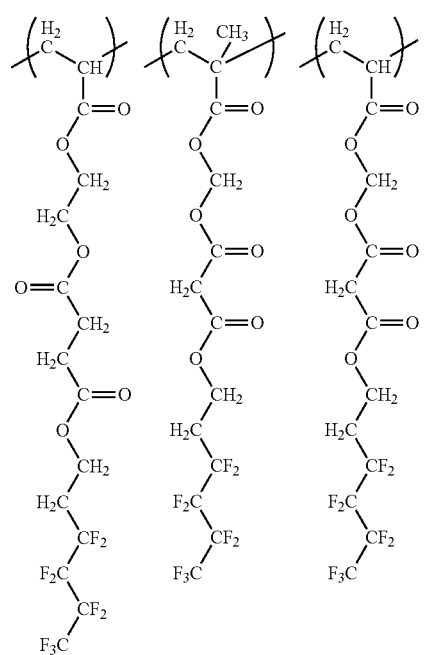
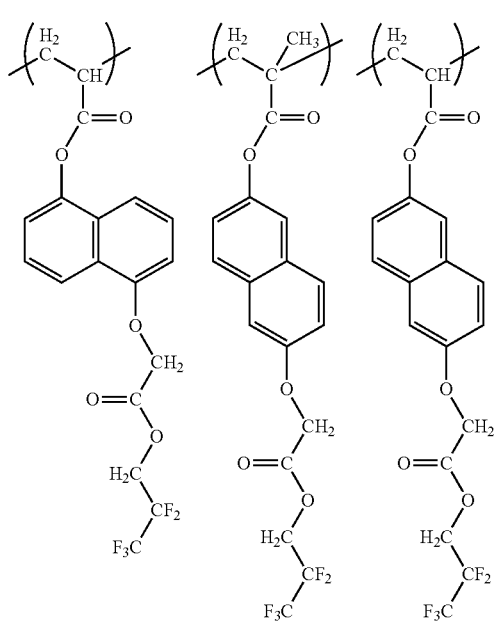

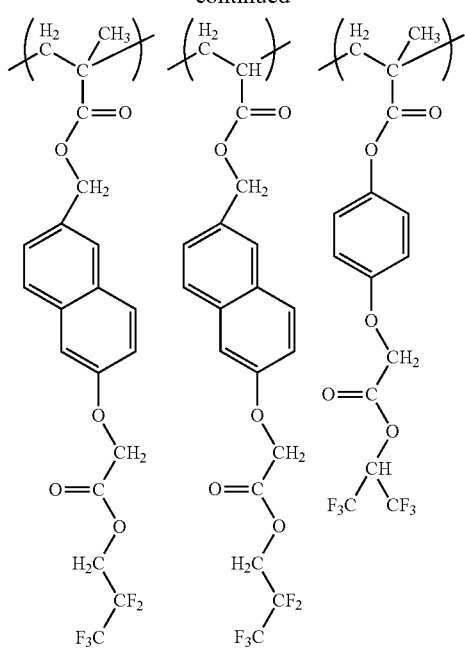
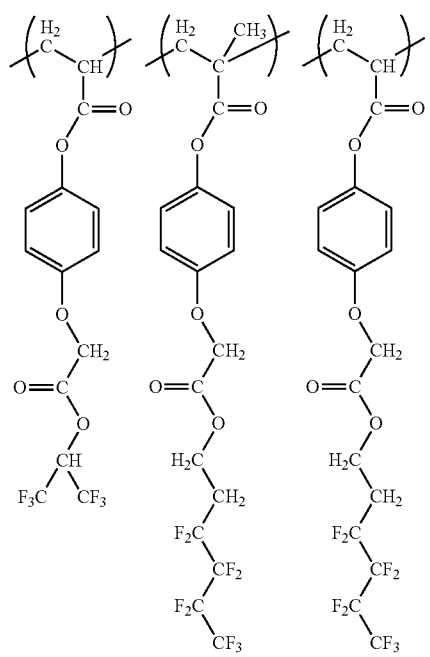
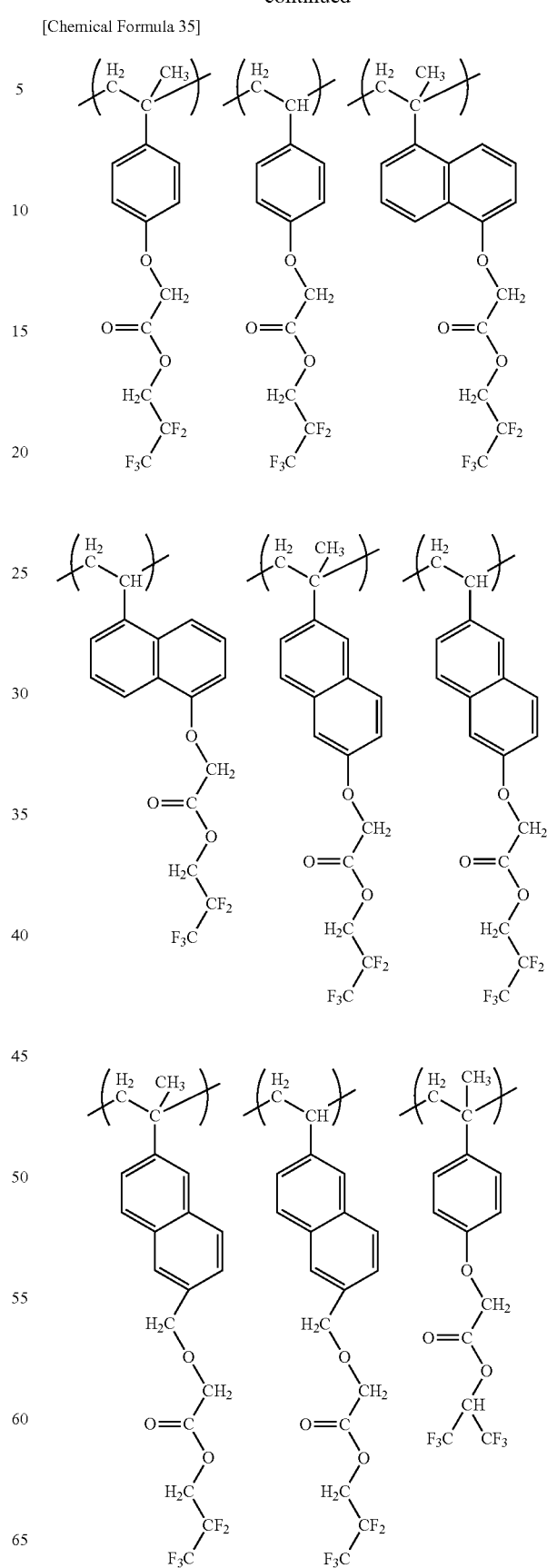

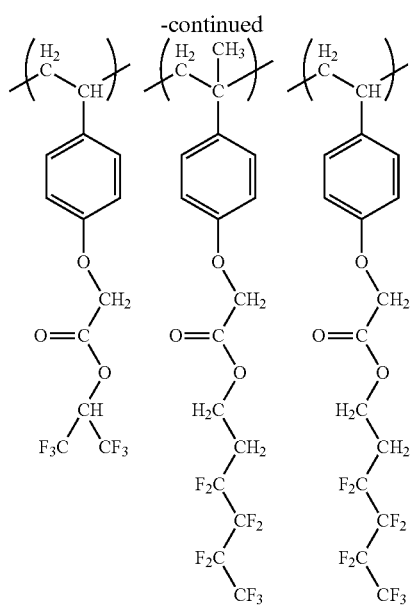

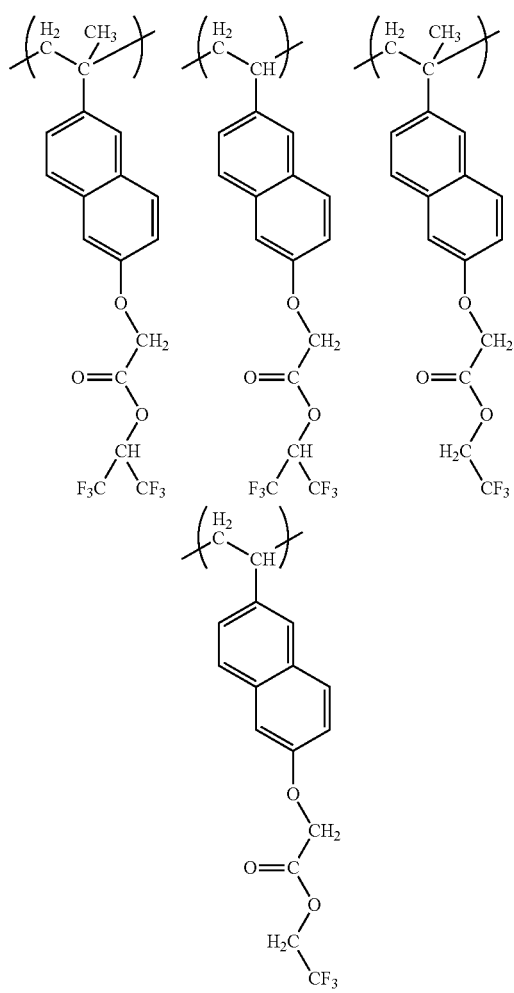

[Chemical Formula 36]

As the structural unit (a5-01), at least one structural unit selected from the group consisting of structural units represented by the aforementioned general formulas (a5-01-11) to (a5-01-16) and (a5-01-21) to (a5-01-26) is preferable, at least one structural unit selected from the group consisting of structural units represented by the aforementioned general formulas (a5-01-11) to (a5-01-14) and (a5-01-21) to (a5-01-24) is more preferable, at least one structural unit selected from the group consisting of structural units represented by the aforementioned general formulas (a5-01-11) to (a5-01-13), (a5-01-21) and (a5-01-22) is still more preferable, and at least one structural unit selected from the group consisting of structural units represented by the aforementioned general formulas (a5-01-11) and (a5-01-22) is most preferable.

In the component (A1), the amount of the structural unit represented by general formula (a5-01), based on the combined total of all structural units constituting the component (A1) is preferably 20 to 90 mol %, more preferably 30 to 90 mol %, and still more preferably 40 to 90 mol %.

When the amount of the structural unit represented by general formula (a5-01) is at least as large as the lower limit of the above-mentioned range, the characteristic feature of exhibiting hydrophobicity during immersion exposure, and becoming hydrophilic during alkali developing is improved. On the other hand, when the amount of the structural unit is no more than the upper limit of the above-mentioned range, a good balance can be achieved with the other structural units,

[Chemical Formula 37]

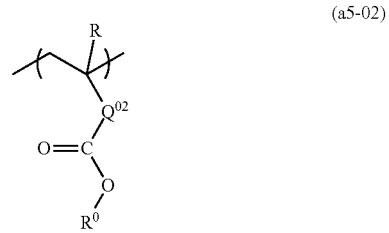

(a5-02)

In general formula (a5-02), R represents a hydrogen atom, an alkyl group of 1 to 5 carbon atoms or a halogenated alkyl group of 1 to 5 carbon atoms; $Q^{02}$ represents a divalent linking group having a fluorine atom; and $R^0$ represents an organic group which may have a fluorine atom.

Structural unit represented by general formula (a5-02)

In general formula (a5-02), R represents a hydrogen atom, an alkyl group of 1 to 5 carbon atoms or a halogenated alkyl group of 1 to 5 carbon atoms, and is the same as defined for R in general formula (a5-0).

In general formula (a5-02), $Q^{02}$ represents a divalent linking group having a fluorine atom, and examples thereof include the same groups as those described above for $Q^0$ in general formula (a5-0) which have a fluorine atom.

In general formula (a5-02), $R^0$ represents an organic group which may have a fluorine atom, and is the same as defined for $R^0$ in general formula (a5-0).

Preferable examples of such a structural unit represented by general formula (a5-02) include at least one structural unit selected from the group consisting of a structural unit represented by general formula (a5-02-1) shown below and a structural unit represented by general formula (a5-02-2) shown below.

[Chemical Formula 38]

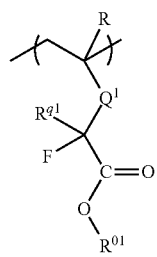
(a5-02-1)

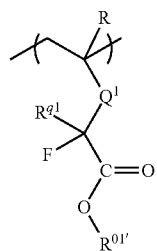
(a5-02-2)

In the formulas, each R independently represents a hydrogen atom, an alkyl group of 1 to 5 carbon atoms or a halogenated alkyl group of 1 to 5 carbon atoms; each $Q^1$ independently represents a group containing —O—, —CH$_2$—O— or —C(=O)—O—; and each $R^{q1}$ independently represents a fluorine atom or a fluorinated alkyl group. In general formula (a5-02-1), $R^{01}$ represents an organic group having a fluorine atom. In general formula (a5-02-2), $R^{01'}$ represents an alkyl group.

In general formulas (a5-02-1) and (a5-02-2), as the lower alkyl group for R, a linear or branched lower alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group include groups in which part or all of the hydrogen atoms of the aforementioned "lower alkyl group" have been substituted with a halogen atom. Examples of the halogen atom include a fluorine atom, a chlorine atom, a bromine atom and an iodine atom, and a fluorine atom is particularly desirable.

In the present invention, as R, a hydrogen atom, a lower alkyl group or a fluorinated lower alkyl group is preferable, and a hydrogen atom or a methyl group is more preferable in terms of industrial availability.

In general formulas (a5-02-1) and (a5-02-2), each $Q^1$ independently represents a group containing —O—, —C$_2$—O— or —C(=O)—O—.

Specific examples of $Q^1$ include a group consisting of —O—, —CH$_2$—O— or —C(=O)—O— and a divalent hydrocarbon group which may have a substituent; —O—; —CH$_2$—O— and —C(=O)—O—.

Examples of the divalent hydrocarbon group include the same groups as those described above for the "divalent hydrocarbon group which may have a substituent" represented by $Q^0$ in general formula (a5-0). The divalent hydrocarbon group is preferably an aliphatic hydrocarbon group, and more preferably a linear or branched alkylene group.

Among these examples, in terms of the stability in the synthesis thereof and the stability in the positive resist composition, $Q^1$ is preferably a group consisting of —C(=O)—O— and a divalent hydrocarbon group which may have a substituent, more preferably a group consisting of —C(=O)—O— and an aliphatic hydrocarbon group, and most preferably a group consisting of —C(=O)—O— and a linear or branched alkylene group.

As a specific example of a preferable group for $Q^1$, a group represented by general formula ($Q^1$-1) can be given.

[Chemical Formula 39]

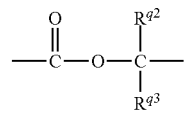
($Q^1$-1)

In general formula ($Q^1$-1), each of $R^{q2}$ and $R^{q3}$ independently represents a hydrogen atom, an alkyl group or a fluorinated alkyl group, wherein $R^{q2}$ and $R^{q3}$ may be mutually bonded to form a ring.

In general formula ($Q^1$-1), each of $R^{q2}$ and $R^{q3}$ independently represents a hydrogen atom, an alkyl group or a fluorinated alkyl group, wherein $R^{q2}$ and $R^{q3}$ may be mutually bonded to form a ring.

The alkyl group for $R^{q2}$ and $R^{q3}$ may be linear, branched or cyclic, and is preferably linear or branched.

The linear or branched alkyl group is preferably a linear or branched alkyl group of 1 to 5 carbon atoms, more preferably a methyl group or an ethyl group, and most preferably an ethyl group.

The cyclic alkyl group preferably has 4 to 15 carbon atoms, more preferably 4 to 12, and most preferably 5 to 10. Specific examples include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these examples, a group in which one or more hydrogen atoms have been removed from adamantane is preferable.

The fluorinated alkyl group for $R^{q2}$ and $R^{q3}$ is an alkyl group in which part or all of the hydrogen atoms have been substituted with a fluorine atom.

In the fluorinated alkyl group, the alkyl group prior to being substituted with a fluorine atom may be linear, branched or cyclic, and examples thereof include the same groups as those described above for the alkyl group represented bye and $R^{q2}$ and $R^{q3}$.

$R^{q2}$ and $R^{q3}$ may be mutually bonded to form a ring. Such a ring constituted of $R^{q2}$, $R^{q3}$ and the carbon atom having $R^{q2}$ and $R^{q3}$ bonded thereto can be mentioned as a group in which two hydrogen atoms have been removed from a monocycloalkane or a polycycloalkane described above for the aforementioned cyclic alkyl group, preferably a 4- to 10-membered ring, and more preferably a 5- to 7-membered ring.

Among these examples, $R^{q2}$ and $R^{q3}$ preferably represents a hydrogen atom or an alkyl group.

In general formulas (a5-02-1) and (a5-02-2), each $R^{q1}$ independently represents a fluorine atom or a fluorinated alkyl group.

With respect to the fluorinated alkyl group for $R^{q1}$, the alkyl group prior to being fluorinated may be linear, branched or cyclic.

The linear or branched alkyl group preferably has 1 to 5 carbon atoms, more preferably 1 to 3 carbon atoms, and most preferably 1 or 2 carbon atoms.

In the fluorinated alkyl group, the percentage of the number of fluorine atoms based on the total number of hydrogen atoms and fluorine atoms (fluorination ratio (%)) is preferably 30 to 100%, and more preferably 50 to 100%. The higher the fluorination ratio, the higher the hydrophobicity of the resist film.

In general formula (a5-02-1), $R^{O1}$ represents an organic group having a fluorine atom, and examples thereof include the same groups as those described above for $R^O$ in general formula (a5-0) which have a fluorine atom.

As $R^{O1}$, a fluorinated hydrocarbon group is preferable, and a fluorinated alkyl group is more preferable. Specifically, a fluorinated alkyl group of 1 to 5 carbon atoms is still more preferable, $-CH_2-CF_3$, $-CH_2-CF_2-CF_3$, $-CH(CF_3)_2$ or $-CH_2-CF_2-CF_2-CF_3$ is still more preferable, and $-CH_2-CF_3$ is most preferable.

In general formula (a5-02-2), $R^{O1'}$ represents an alkyl group.

The alkyl group for $R^{O1'}$ preferably has 1 to 10 carbon atoms, more preferably 1 to 8 carbon atoms, and most preferably 1 to 5 carbon atoms. Specific examples include a methyl group, an ethyl group, a propyl group, an isopropyl group, an n-butyl group, an isobutyl group, a tert-butyl group, a pentyl group, an isopentyl group and a neopentyl group. Among these, a methyl group and an ethyl group are preferable.

Specific examples of the structural units represented by general formulas (a5-02-1) and (a5-02-2) are shown below.

[Chemical Formula 40]

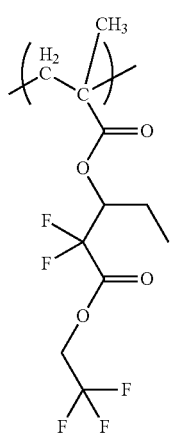
(a5-02-11)

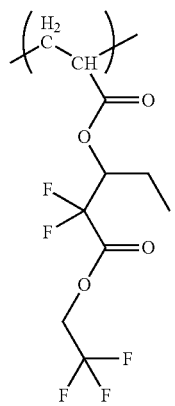
(a5-02-12)

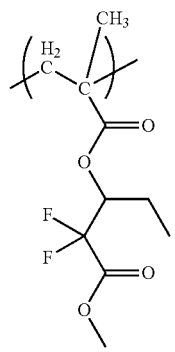
(a5-02-21)

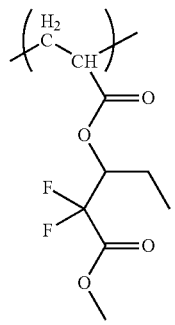
(a5-02-22)

In the component (A1), the amount of the structural unit represented by general formula (a5-02), based on the combined total of all structural units constituting the component (A1) is preferably 20 to 90 mol %, more preferably 30 to 90 mol %, and still more preferably 40 to 90 mol %.

When the amount of the structural unit represented by general formula (a5-02) is at least as large as the lower limit of the above-mentioned rang; the characteristic feature of exhibiting hydrophobicity during immersion exposure, and becoming hydrophilic during alkali developing is improved. On the other hand, when the amount of the structural unit is no more than the upper limit of the above-mentioned range, a good balance can be achieved with the other structural units.

As a preferable example of the structural unit (a5), a structural unit represented by general formula (a5-1) shown below can also be given.

[Chemical Formula 41]

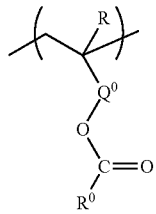
(a5-1)

In general formula (a5-1), R represents a hydrogen atom, an alkyl group of 1 to 5 carbon atoms or a halogenated alkyl group of 1 to 5 carbon atoms; $Q^0$ represents a single bond or a divalent linking group which may have a fluorine atom; and $R^0$ represents an organic group which may have a fluorine atom.

Structural unit represented by general formula (a5-1)

In formula (a5-1), R, $Q^0$ and $R^0$ are respectively the same as defined for R, $Q^0$ and $R^0$ in the aforementioned general formula (a5-0).

In formula (a5-1), when $Q^0$ represents a single bond, $R^0$ is preferably a methyl group or an ethyl group.

In formula (a5-1), when $Q^0$ represents a divalent linking group which may have a fluorine atom, it is preferably a structural unit represented by the aforementioned general formula (a5-01) in which "-$Q^{01}$-C(=O)—O—$R^1$" is replaced with "-$Q^{01}$-O—C(=O)—$R^1$", or a structural unit represented by the aforementioned general formula (a5-02) in which "-$Q^{02}$-C(=O)—O—$R^0$" is replaced with "-$Q^{02}$-O—C(=O)—$R^0$".

Specific examples of structural units represented by general formula (a5-1) are shown below,

[Chemical Formula 42]

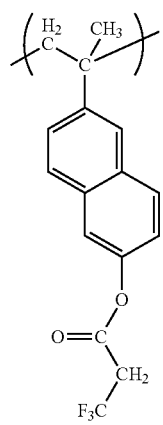
(a5-1-1)

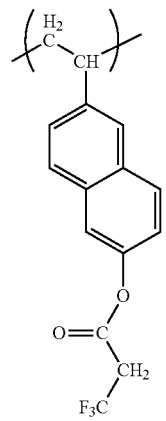
(a5-1-2)

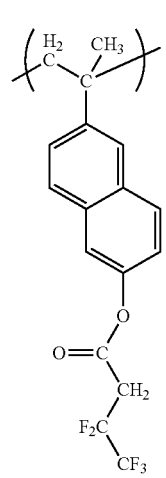
(a5-1-3)

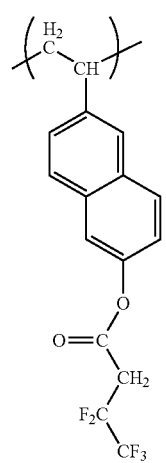
(a5-1-4)

(a5-1-5)

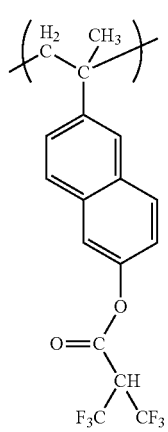

(a5-1-6)

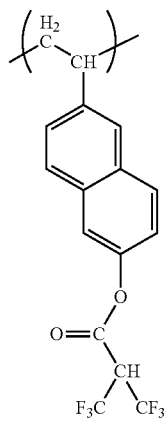

In the component (A1), the amount of the structural unit represented by general formula (a5-1), based on the combined total of all structural units constituting the component (A1) is preferably 20 to 90 mol %, more preferably 30 to 90 mol %, and still more preferably 40 to 90 mol %.

When the amount of the structural unit represented by general formula (a5-1) is at least as large as the lower limit of the above-mentioned range, the characteristic feature of exhibiting hydrophobicity during immersion exposure, and becoming hydrophilic during alkali developing is improved. On the other hand, when the amount of the structural unit is no more than the upper limit of the above-mentioned range, a good balance can be achieved with the other structural units.

In the component (A1), as the structural unit (a5), one type of structural unit may be used, or two or more types may be used in combination.

(Structural Unit (a6))

The structural unit (a6) is a structural unit represented by general formula (a6-1) shown below.

[Chemical Formula 43]

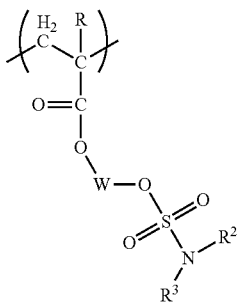

(a6-1)

In the formula, R represents a hydrogen atom, an alkyl group of 1 to 5 carbon atoms or a halogenated alkyl group of 1 to 5 carbon atoms; each of $R^2$ and $R^3$ independently represents a hydrogen atom or an alkyl group that may contain an oxygen atom at an arbitrary position, or $R^2$ and $R^3$ are bonded together to form an alkylene group; and W represents a cyclic alkylene group that may include an oxygen atom at an arbitrary position.

In general formula (a6-1), R represents a hydrogen atom, an alkyl group of 1 to 5 carbon atoms or a halogenated alkyl group of 1 to 5 carbon atoms, and is the same as defined for R described above in the explanation of the component (A).

Specific examples of the alkyl group of 1 to 5 carbon atoms for R include linear or branched alkyl groups such as a methyl group, an ethyl group, a propyl group, an isopropyl group, an n-butyl group, an isobutyl group, a tert-butyl group, a pentyl group, an isopentyl group and a neopentyl group.

Specific examples of the halogenated lower alkyl group for R include groups in which part or all of the hydrogen atoms of the aforementioned lower alkyl group have been substituted with halogen atoms. Examples of the halogen atom include a fluorine atom, a chlorine atom, a bromine atom and an iodine atom, and a fluorine atom is particularly desirable. The fluorinated alkyl group is preferably a linear or branched fluorinated alkyl group, and specific examples thereof include a monofluoromethyl group, a difluoromethyl group, a trifluoromethyl group, a perfluoroethyl group, a perfluoropropyl group, a perfluoroisopropyl group, a perfluorobutyl group, a perfluoroisobutyl group, a perfluoro-tert-butyl group, a perfluoropentyl group, a perfluoroisopentyl group and a perfluoroneopentyl group.

As R, a hydrogen atom, an alkyl group of 1 to 5 carbon atoms or a fluorinated alkyl group of 1 to 5 carbon atoms is preferable, a hydrogen atom, a methyl group or a trifluoromethyl group is more preferable, a hydrogen atom or a methyl group is still more preferable, and a methyl group is particularly desirable.

In general formula (a6-1), the alkyl groups for $R^2$ and $R^3$ may be linear, branched or cyclic groups.

As the linear or branched alkyl group, alkyl groups of 1 to 8 carbon atoms are preferable, and alkyl groups of 1 to 5 carbon atoms are more preferable. Specific examples thereof include a methyl group, an ethyl group, an n-propyl group, an i-propyl group, an n-butyl group, an i-butyl group, a t-butyl group, a 2-methyl-2-butyl group, a 3-methyl-2-butyl group, a 1-pentyl group, a 2-pentyl group, a 3-pentyl group and a branched tertiary alkyl group described later.

Examples of the cyclic alkyl group include a cyclopropyl group, a cyclobutyl group, a cyclopentyl group, a 1-methyl-1-cyclopentyl group, a 1-ethyl-1-cyclopentyl group, a cyclohexyl group, a 1-methyl-1-cyclohexyl group, a 1-ethyl-1-cyclohexyl group, a 1-methyl-1-cycloheptyl group, a 1-ethyl-1-cycloheptyl group, a 1-methyl-1-cyclooctyl group, a 1-ethyl-1-cycloodyl group, a bicyclo[2.2.1]heptan-2-yl group, a 1-adamantyl group, a 2-adamantyl group, a 2-methyl-2-adamantyl group, and a 2-ethyl-2-adamantyl group.

The linear or branched alkyl groups for $R^2$ and $R^3$ may have a cyclic alkyl group as a substituent. Furthermore, the cyclic alkyl groups for $R^2$ and $R^3$ may include a linear or branched alkyl group, a fluorine atom, a fluorinated alkyl group of 1 to 5 carbon atoms, an oxygen atom (=O) or the like as a substituent. Examples of the cyclic alkyl group and the linear or branched alkyl group as the substituent include the same groups as those described above.

The alkyl groups for $R^2$ and $R^3$ may include an oxygen atom at an arbitrary position. The expression "include an oxygen atom" means that an oxygen atom (—O—) is introduced into the carbon chain of the alkyl group. Examples of alkyl groups that include an oxygen atom include acetal-type acid-dissociable, dissolution-inhibiting groups such as the alkoxyalkyl groups described later.

In the structural unit (a6), at least one of $R^2$ and $R^3$ may be an acid dissociable, dissolution inhibiting group.

An "acid-dissociable, dissolution-inhibiting group" is a group which, during formation of a resist pattern using the resist composition, has an alkali dissolution-inhibiting effect that renders the entire polymer compound (A1) insoluble in an alkali developing solution prior to exposure, but then dissociates under the action of the acid generated from the component (B) upon exposure, causing the entire polymer compound (A1) to undergo an increase in solubility within the alkali developing solution.

There are no particular limitations on the acid-dissociable, dissolution-inhibiting group in the structural unit (a6), provided the group corresponds with an alkyl group that may include an oxygen atom at an arbitrary position, and any of the groups that have been proposed for use within the base components of conventional positive chemically amplified resist compositions may be selected as appropriate. Examples of the acid dissociable, dissolution inhibiting group include a tertiary alkyl ester-type acid dissociable, dissolution inhibiting group (e.g., an aliphatic branched, acid dissociable, dissolution inhibiting group or an aliphatic cyclic group-containing acid dissociable, dissolution inhibiting group) and an acetal-type acid dissociable, dissolution inhibiting group. As the acid dissociable, dissolution inhibiting group, the same groups as those described above for the structural unit (a1) can be mentioned.

For example, in those cases where at least one of $R^2$ and $R^3$ in the structural unit (a6) is a tertiary alkyl group, the tertiary carbon atom of the tertiary alkyl group is bonded to the nitrogen atom at the terminal of the sulfamoyloxy group (—OSO$_2$N—group). In this tertiary alkyl group, the action of the acid generated from the component (B) upon exposure during formation of a resist pattern causes a cleavage of the bond between the nitrogen atom at the terminal of the sulfamoyloxy group (—OSO$_2$N—group) and the tertiary carbon atom.

In those cases where at least one of $R^2$ and $R^3$ in the structural unit (a6) is an acetal-type acid dissociable, dissolution inhibiting group, the acetal-type acid dissociable, dissolution inhibiting group is bonded to the nitrogen atom at the terminal of the sulfamoyloxy group (—OSO$_2$N—group). In this acetal-type acid-dissociable, dissolution-inhibiting group, the action of the acid generated from the component (B) upon exposure during formation of a resist pattern using the resist composition causes a cleavage of the bond between the nitrogen atom and the acetal-type acid-dissociable, dissolution-inhibiting group.

The alkylene group formed in those cases where $R^2$ and $R^3$ are bonded together is preferably a linear or branched alkylene group, and is more preferably a linear alkylene group. The alkylene group preferably contains 1 to 5 carbon atoms, and specific examples thereof include an ethanediyl group, a propane-1,3-diyl group and a butane-1,4-diyl group.

In the present invention, in terms of forming a resist pattern having an excellent shape, it is preferable that at least one of $R^2$ and $R^3$ (for example, $R^2$) is a hydrogen atom, and it is particularly desirable that $R^2$ and $R^3$ are both hydrogen atoms.

In general formula (a6-1), in terms of improvement in various lithography properties, the cyclic alkylene group represented by W, which may include an oxygen atom at an arbitrary position, may be either a monocyclic group or a polycyclic group. In terms of raising the Tg to improve lithography properties and improving the etching resistance, a polycyclic group is preferable, and a bi-, tri- or tetra-cyclic group is particularly desirable.

The number of carbon atoms within the alkylene group is preferably within a range from 3 to 20, and is more preferably from 5 to 12.

Specific examples of the alkylene group include a cyclopropanediyl group, a cyclobutane-1,2-diyl group, a cyclobutane-1,3-diyl group, a cyclopentane-1,2-diyl group, a cyclopentane-1,3-diyl group, a cyclohexane-1,2-diyl group, a cyclohexane-1,3-diyl group, a cyclohexane-1,4-diyl group, a bicyclo[2.2.1]heptane-2,3-diyl group, a bicyclo[2.2.1]heptane-2,5-diyl group, a 7-oxabicyclo[2.2.1]heptane-2,5-diyl group, a bicyclo[2.2.1]heptane-2,6-diyl group, a 7-oxabicyclo[2.2.1]heptane-2,6-diyl group, an adamantane-1,3-diyl group, and an adamantane-1,2-diyl group.

Specific examples of structural units represented by general formula (a6-1) are shown below.

In the following formulas, "Me" represents a methyl group.

[Chemical Formula 44]

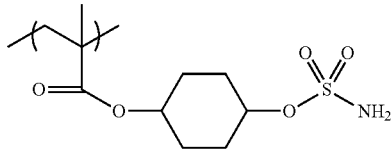

(a6-1-1)

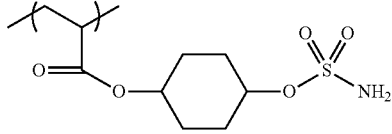

(a6-1-2)

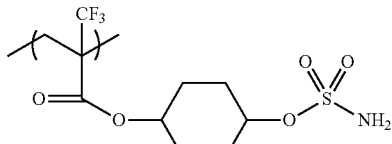

(a6-1-3)

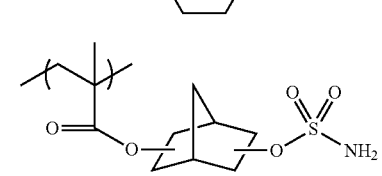

(a6-1-4)

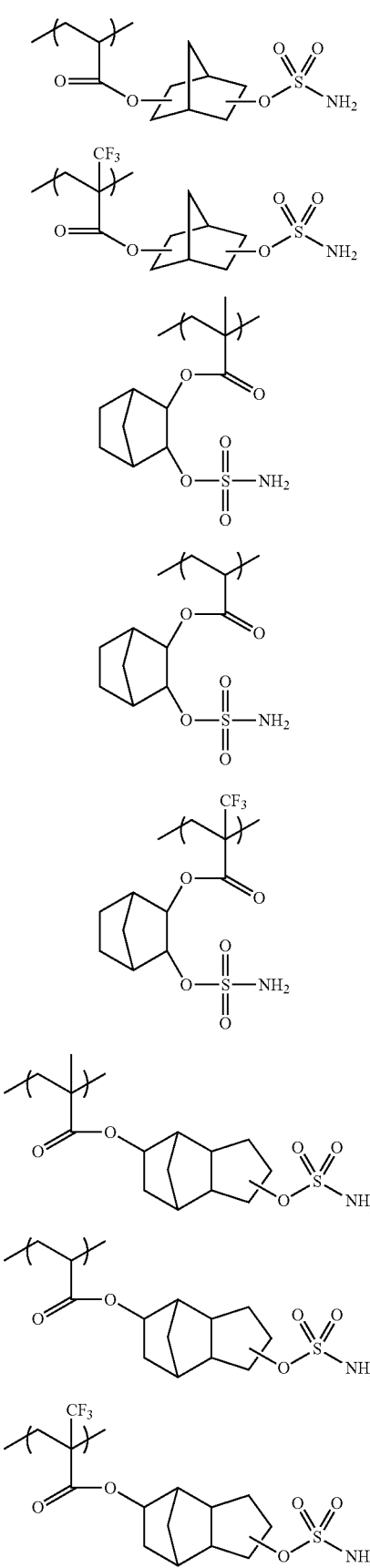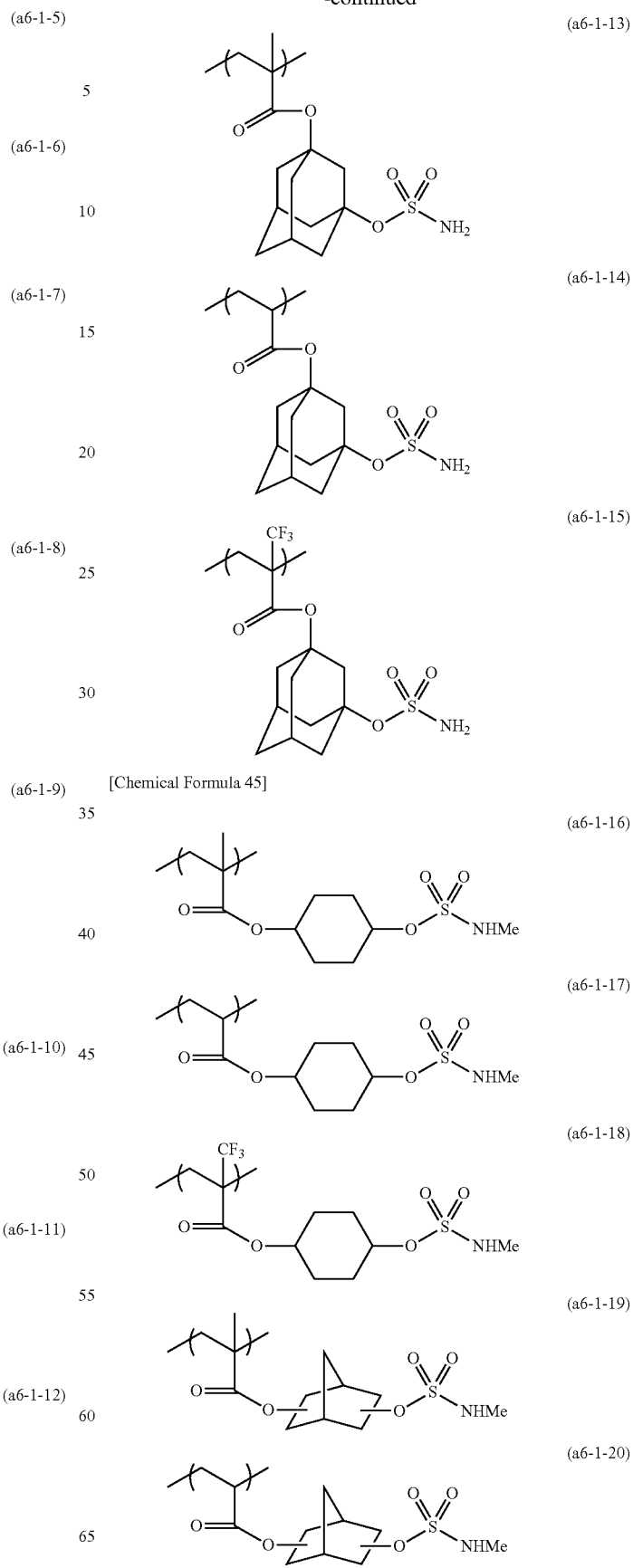

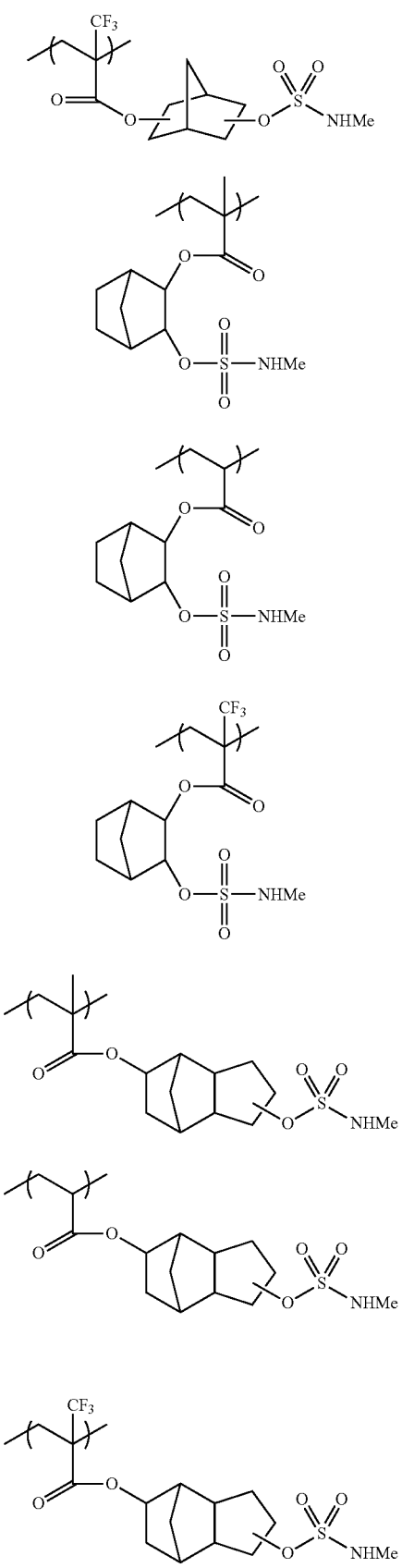
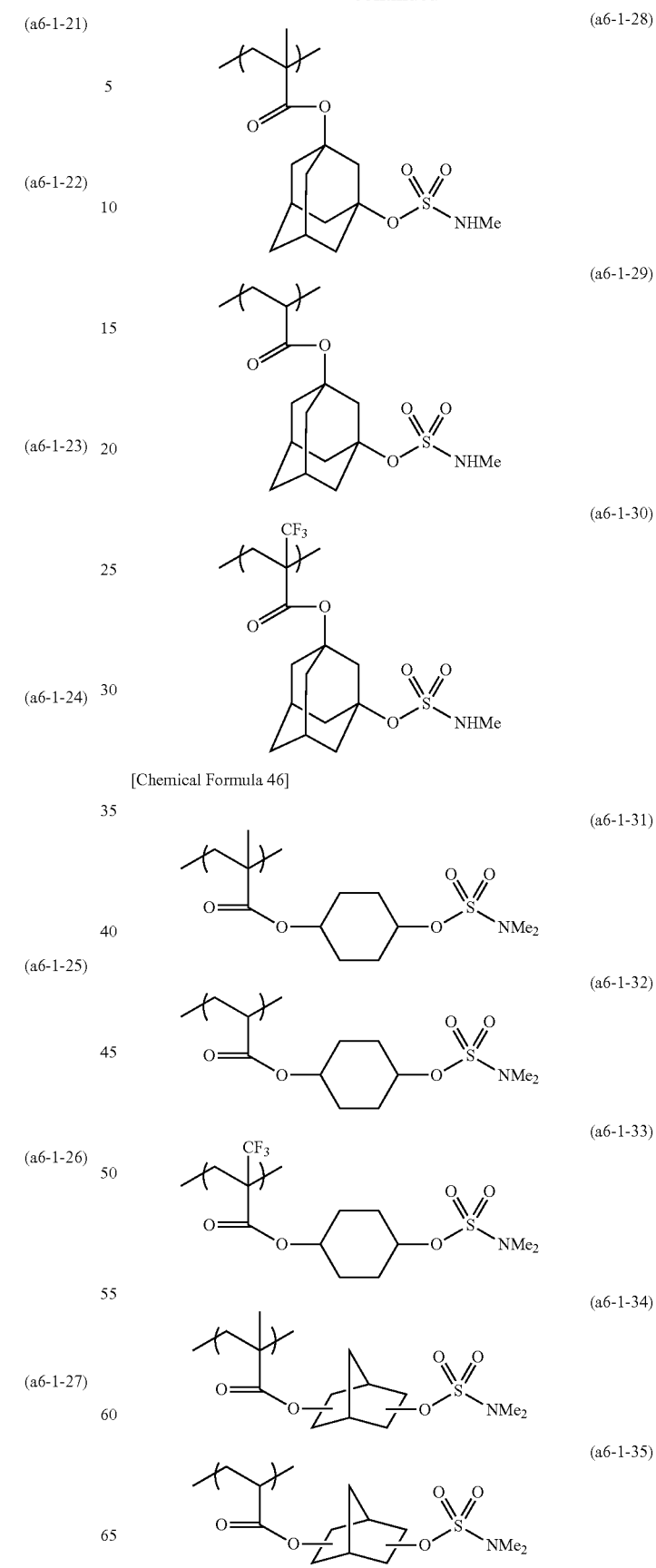
[Chemical Formula 46]

-continued (a6-1-51)
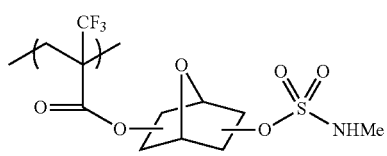

(a6-1-52)
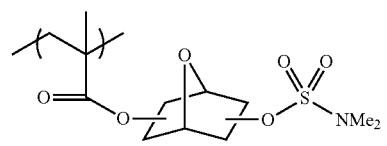

(a6-1-53)
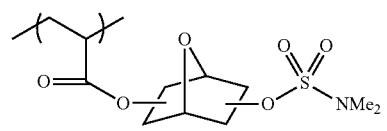

(a6-1-54)
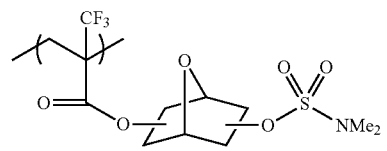

(a6-1-55)
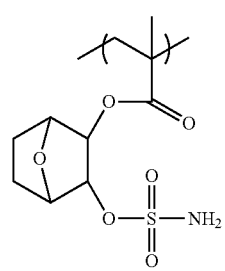

(a6-1-56)
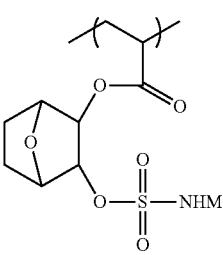

(a6-1-57)
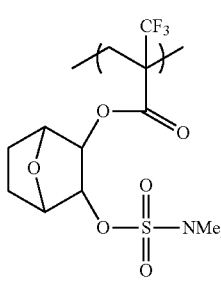

(a6-1-58)
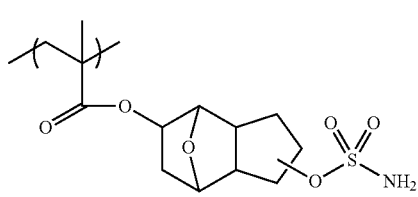

(a6-1-59)
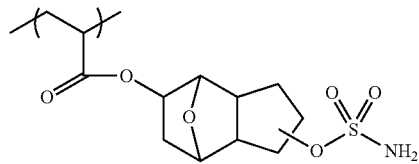

(a6-1-60)

(a6-1-61)

(a6-1-62)

(a6-1-63)

In the component (A1), as the structural unit (a6), one type of structural unit may be used, or two or more types may be used in combination.

In the component (A1), the amount of the structural unit (a6) based on the combined total of all structural units constituting the component (A1) is preferably 1 to 50 mol %, more preferably 1 to 40 mol %, and still more preferably 5 to 40 mol %.

When the amount of the structural unit (a6) is at least as large as the lower limit of the above-mentioned range, a resist pattern having can be reliably formed with a high resolution. Further, the solubility of the component (A1) in an alkali developing solution is enhanced, and as a result, a resist pattern having an excellent shape with reduced defects can be formed. On the other hand, when the amount of the structural unit (a6) is no more than the upper limit of the above-mentioned range, a good balance can be achieved with the other structural units.

(Other Structural Units)

The component (A1) may also include a structural unit other than the aforementioned structural units (a1), (a5) and (a6), as long as the effects of the present invention are not impaired.

As the other structural units, any of the multitude of conventional structural units used within the resin of resist compositions for ArF excimer lasers or KrF excimer lasers (and particularly for ArF excimer lasers) can be used.

The other structural unit is preferably a structural unit copolymerizable with the compounds which yield the structural units (a1), (a5) and (a6). Examples of such structural units include a structural unit (a2) derived from an acrylate ester containing a lactone-containing cyclic group, a structural unit (a3) derived from an acrylate ester containing a polar group-containing aliphatic hydrocarbon group, a structural unit derived from an acrylate ester containing an acid non-dissociable aliphatic polycyclic group, and a structural unit (a7) derived from an acrylate ester having a sultone structure on the side chain thereof.

Structural Unit (a2)

The structural unit (a2) is a structural unit derived from an acrylate ester containing a lactone-containing cyclic group.

The term "lactone-containing cyclic group" refers to a cyclic group including one ring containing a —O—C(O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

As the structural unit (a2), there is no particular limitation, and an arbitrary structural unit may be used.

Specific examples of lactone-containing monocyclic groups include a group in which one hydrogen atom has been removed from a 4- to 6-membered lactone ring, such as a group in which one hydrogen atom has been removed from β-propionolatone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below,

[Chemical Formula 48]

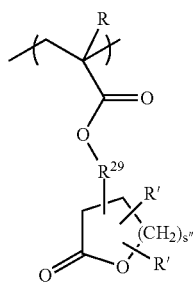

(a2-1)

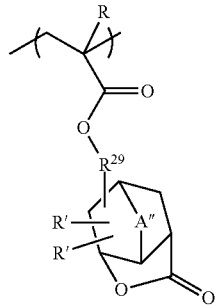

(a2-2)

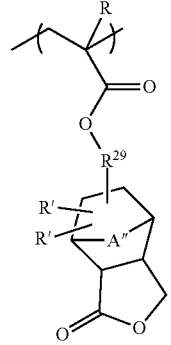

(a2-3)

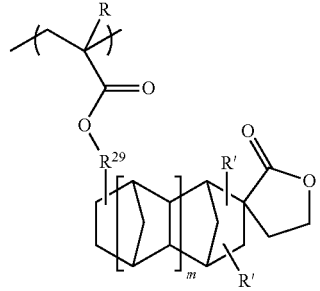

(a2-4)

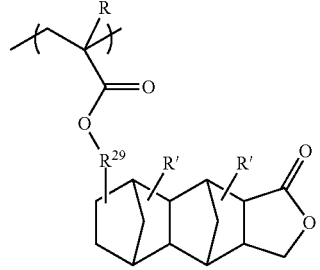

(a2-5)

In the formulas, R represents a hydrogen atom, a lower alkyl group or a halogenated lower alkyl group; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.

In general formulas (a2-1) to (a2-5), R is the same as defined for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group In terms of industrial availability, R' is preferably a hydrogen atom.

R" preferably represents a hydrogen atom or a linear, branched or cyclic alkyl group of 1 to 15 carbon atoms.

When R" is a linear or branched alkyl group, it preferably has 1 to 10 carbon atoms, more preferably 1 to 5 carbon atoms.

When R" is a cyclic alkyl group (cycloalkyl group), it preferably has 3 to 15 carbon atoms, more preferably 4 to 12 carbon atoms, and most preferably 5 to 10 carbon atoms. As examples of the cycloalkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Examples of such groups include groups in which one or more hydrogen atoms have been removed from a monocycloalkane such as cyclopentane or cyclohexane; and groups in which one or more hydrogen atoms have been removed from a polycycloalkane such as adamantine, norbornane, isobornane, tricyclodecane or tetracyclododecane.

As A", an alkylene group of 1 to 5 carbon atoms or —O— is preferable, more preferably an alkylene group of 1 to 5 carbon atoms, and most preferably a methylene group.

$R^{29}$ represents a single bond or a divalent linking group. Examples of divalent linking groups include the same divalent linking groups as those described above for $Y^2$ in general formula (a1-0-2). Among these, an alkylene group, an ester bond (—C(=O)—O—) or a combination thereof is preferable. The alkylene group as a divalent linking group for $R^{29}$ is preferably a linear or branched alkylene group. Specific examples include the same linear alkylene groups and branched alkylene groups as those described above for the aliphatic cyclic group A in $Y^2$.

s" is preferably 1 or 2.

Specific examples of structural units represented by general formulas (a2-1) to (a2-5) are shown below.

In the formulas shown below, $R^\alpha$ represents a hydrogen atom, a methyl group or a trifluoromethyl group.

[Chemical Formula 49]

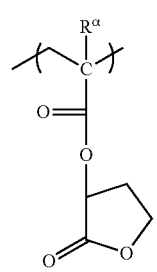
(a2-1-1)

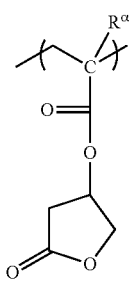
(a2-1-2)

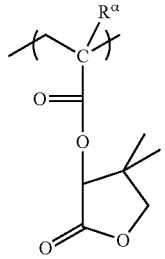
(a2-1-3)

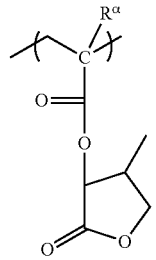
(a2-1-4)

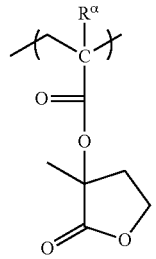
(a2-1-5)

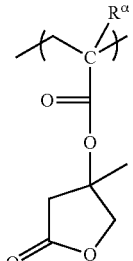
(a2-1-6)

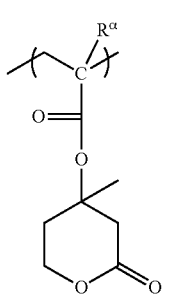
(a2-1-7)

-continued
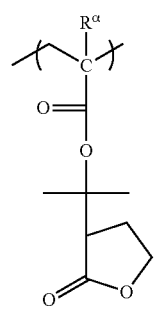 (a2-1-8)
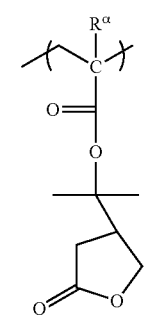 (a2-1-9)
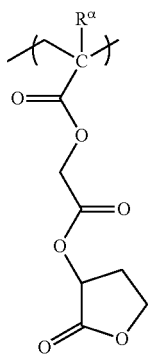 (a2-1-10)
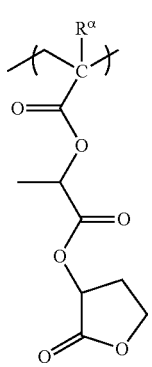 (a2-1-11)
-continued
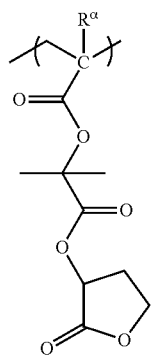 (a2-1-12)
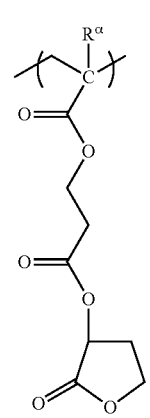 (a2-1-13)
[Chemical Formula 50]
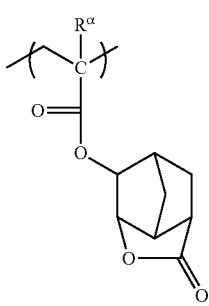 (a2-2-1)
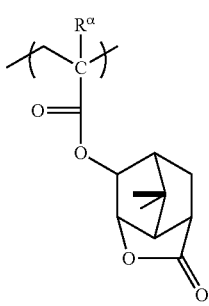 (a2-2-2)

-continued
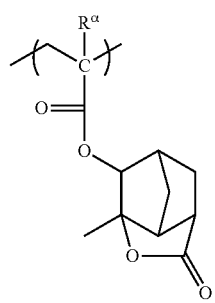
(a2-2-3)
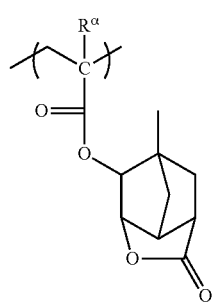
(a2-2-4)
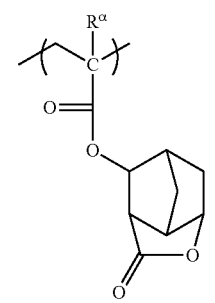
(a2-2-5)
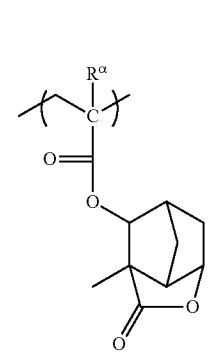
(a2-2-6)
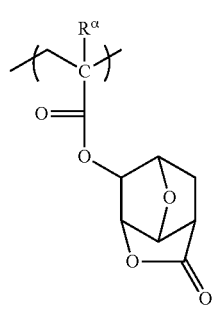
(a2-2-7)
-continued
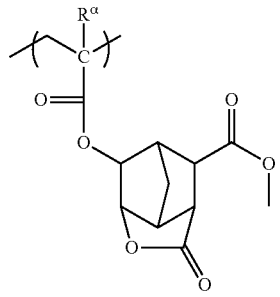
(a2-2-8)
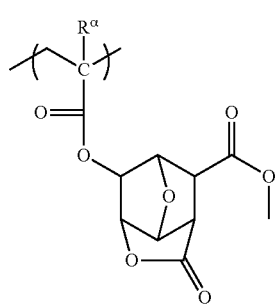
(a2-2-9)
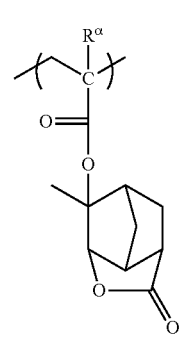
(a2-2-10)
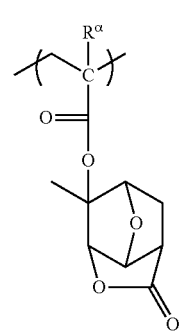
(a2-2-11)
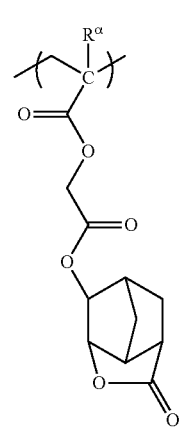
(a2-2-12)

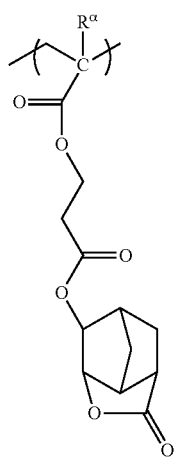 (a2-2-13)
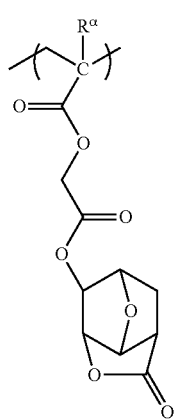 (a2-2-14)
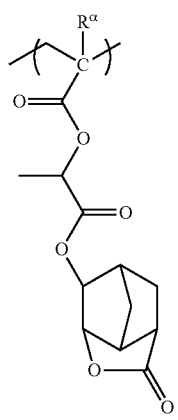 (a2-2-15)
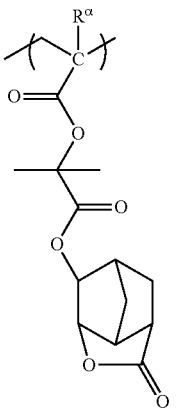 (a2-2-16)
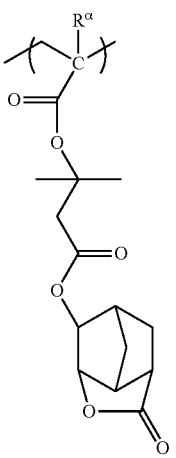 (a2-2-17)
[Chemical Formula 51]
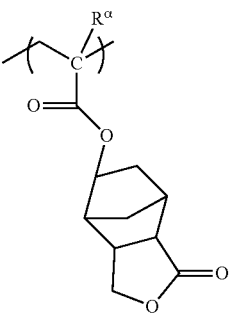 (a2-3-1)
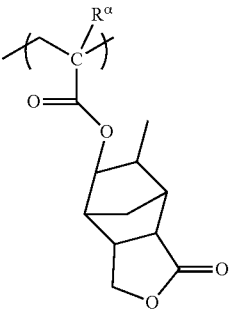 (a2-3-2)

-continued
(a2-3-3)
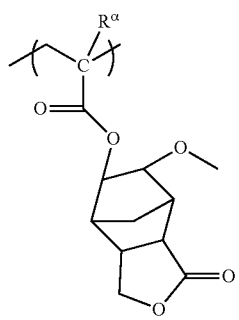
(a2-3-4)
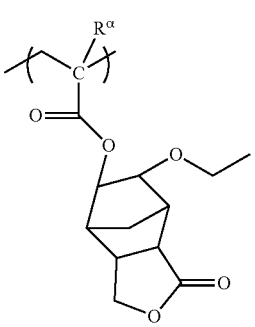
[Chemical Formula 52]
(a2-3-5)
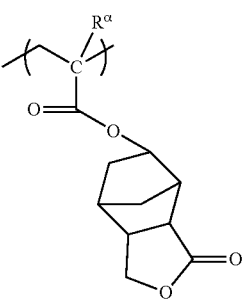
(a2-4-1)
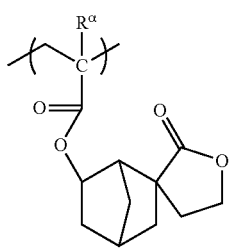
(a2-4-2)
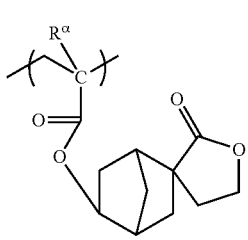
-continued
(a2-4-3)
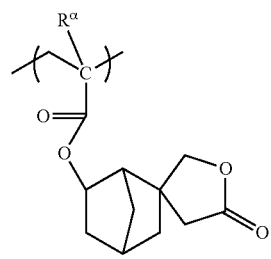
(a2-4-4)
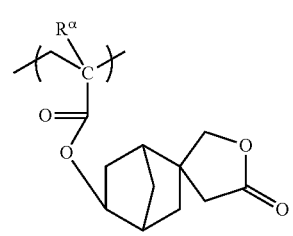
(a2-4-5)
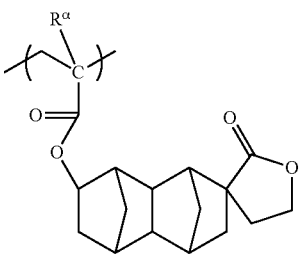
(a2-4-6)
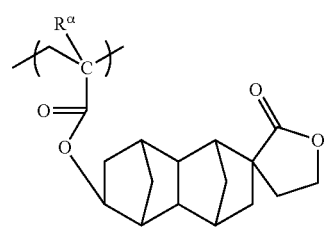
(a2-4-7)
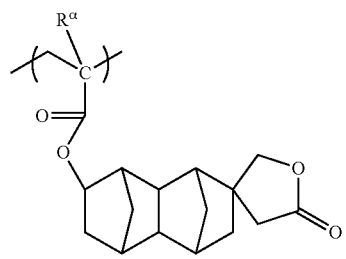
(a2-4-8)
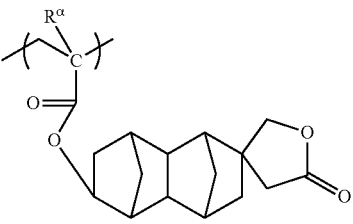

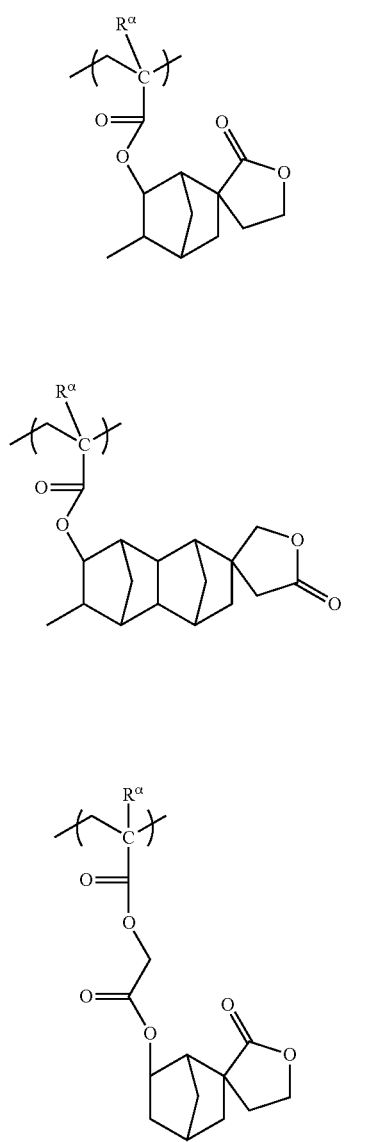
(a2-4-9)
(a2-4-10)
(a2-4-11)
(a2-4-12)
[Chemical Formula 53]
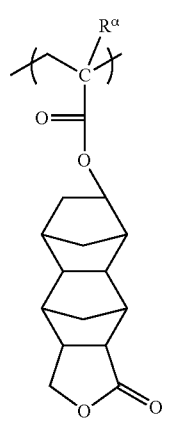
(a2-5-1)
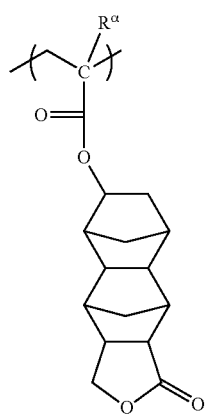
(a2-5-2)
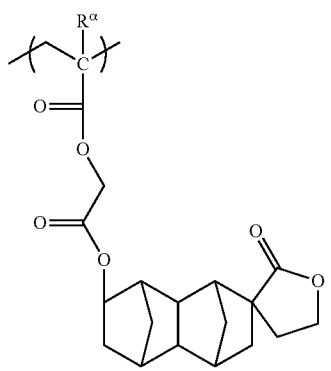
(a2-5-3)

(a2-5-4)

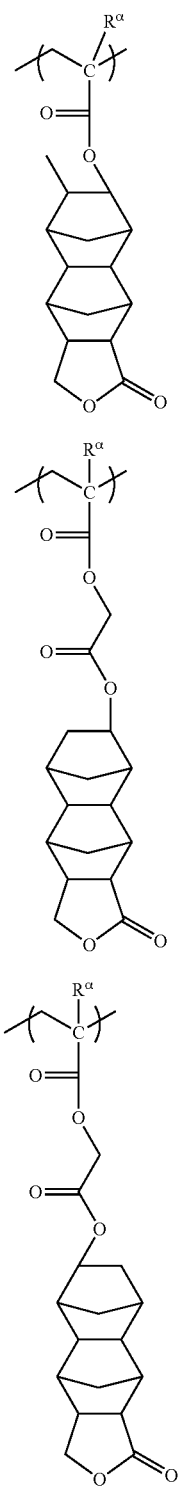

(a2-5-5)

(a2-5-6)

In the component (A1), as the structural unit (a2), one type of structural unit may be used, or two or more types may be used in combination.

As the structural unit (a2), at least one structural unit selected from the group consisting of formulas (a2-1) to (a2-5) is preferable, and at least one structural unit selected from the group consisting of formulas (a2-1) to (a2-3) is more preferable. Of these, it is preferable to use at least one structural unit selected from the group consisting of structural units represented by formulas (a2-1-1), (a2-1-2), (a2-2-1), (a2-2-7), (a2-3-1) and (a2-3-5).

In the component (A1), the amount of the structural unit (a2) based on the combined total of all structural units constituting the component (A1) is preferably 5 to 60 mol %, more preferably 10 to 50 mol %, and still more preferably 20 to 50 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units.

Structural Unit (a3)

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which some of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable,

[Chemical Formula 54]

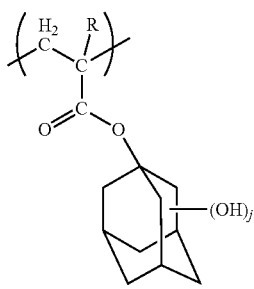 (a3-1)

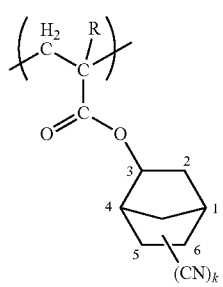 (a3-2)

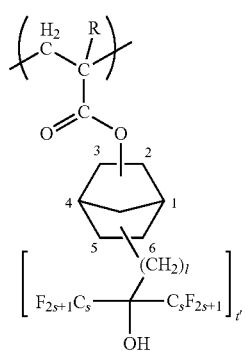 (a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3), one type of structural unit may be used, or two or more types may be used in combination.

The amount of the structural unit (a3) within the component (A1) based on the combined total of all structural units constituting the component (A1) is preferably 5 to 50 mol %, more preferably 5 to 40 mol %, and still more preferably 5 to 25 mol %. When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

Structural Unit (a4)

The structural unit (a4) is a structural unit derived from an acrylate ester containing a non-acid dissociable, aliphatic polycyclic group.

In the structural unit (a4), examples of this polycyclic group include the same groups as those described above in relation to the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below,

[Chemical Formula 55]

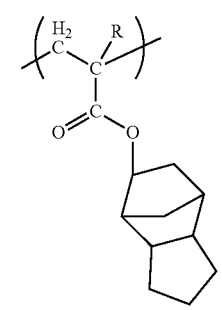 (a4-1)

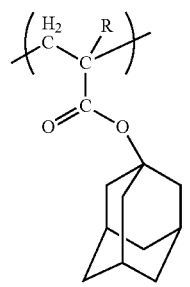 (a4-2)

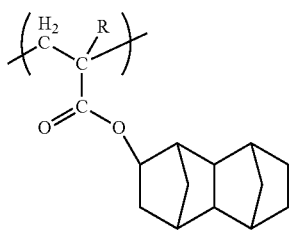 (a4-3)

[Chemical Formula 55 continued]

(a4-4)

(a4-5)

In the formulas, R is the same as defined above.

As the structural unit (a4), one type of structural unit may be used, or two or more types may be used in combination.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

Structural Unit (a7)

The structural unit (a7) is a structural unit derived from an acrylate ester having a sultone structure on the side chain thereof. By including the structural unit (a7), lithography properties such as resolution and resist pattern shape can be improved. Specific examples include structural units represented by general formula (a7-1) shown below.

[Chemical Formula 56]

(a7-1)

In the formula, R is the same as defined above; $R^{3\prime}$ represents a linear or branched alkylene group; A' represents an oxygen atom, a sulfur atom or an alkylene group of 1 to 5 carbon atoms which may contain an oxygen atom or a sulfur atom; and $n_{10}$ represents 0 to 2.

The linear or branched alkylene group for $R^{3\prime}$ preferably has 1 to 10 carbon atoms, more preferably 1 to 8, still more preferably 1 to 5, still more preferably 1 to 3, and most preferably 1 or 2.

A' is preferably a methylene group, an oxygen atom (—O—) or a sulfur atom (—S—).

$n_{10}$ is preferably 0 or 1.

As the structural unit (a7), one type of structural unit may be used, or two or more types may be used in combination.

When the structural unit (a7) is included in the component (A1), the amount of the structural unit (a7) based on the combined total of all structural units constituting the component (A1) is preferably 1 to 60 mol %, more preferably 5 to 55 mol %, and still more preferably 10 to 50 mol %.

In the positive resist composition of the present invention, the component (A1) is a polymeric compound having the structural unit (a1), the structural unit (a5) and the structural unit (a6).

Examples of the component (A1) include copolymers consisting of the structural units (a1), (a5) and (a6).

In the positive resist composition of the present invention, as the component (A1), one type may be used, or two or more types of compounds may be used in combination.

In the present invention, as the component (A1), a polymeric compound that includes a combination of structural units such as that shown below is particularly desirable.

[Chemical Formula 57]

(A1-11)

In the formula, R, $Q^{01}$, $R^1$, $R^{22}$, h, $R^2$, $R^3$ and W are the same as defined above; and the plurality of R may be the same or different from each other.

In formula (A1-11), $Q^{01}$ preferably represents $-A_{aryl}$-$X_{01}$— (wherein $A_{aryl}$ and $X_{01}$ are the same as defined above) or —C(=O)—O—X— (wherein X is the same as defined above).

$R^1$ is preferably a fluorinated hydrocarbon group, more preferably a fluorinated alkyl group, and still more preferably a fluorinated alkyl group of 1 to 5 carbon atoms.

$R^{22}$ is preferably a linear or branched alkyl group.

h is preferably 1 to 4.

It is preferable that at least one of $R^2$ and $R^3$ represents a hydrogen atom, and it is more preferable that both of $R^2$ and $R^3$ represent a hydrogen atom.

W is preferably a polycyclic group, and more preferably an adamanta-1,3-diyl group or an adamanta-1,2-diyl group.

When the polymeric compound represented by formula (A1-11) is used as an additive, in terms of improvement in the hydrophobicity of the resist film formed by applying the resist composition on a substrate and the hydrophilicity of the resist film during alkali developing, the ratio (molar ratio) of the structural unit (a5) to the structural unit (a6) (a5:a6) is preferably in the range of 95:5 to 70:30, more preferably in the range of 90:10 to 75:25. In addition, the amount (mol %) of the structural unit (a5) based on the combined total of structural units constituting the polymeric compound is preferably at least twice the amount of the structural unit (a6), more preferably at least 2.5 times the amount of the structural unit (a6), and still more preferably at least 3 times the amount of the structural unit (a6).

The weight average molecular weight (Mw) (the polystyrene equivalent value determined by gel permeation chromatography) of the component (A1) is not particularly limited, but is preferably 2,000 to 100,000, more preferably 3,000 to 100,000, still more preferably 4,000 to 50,000, and most preferably 5,000 to 50,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.8. Here, Mn is the number average molecular weight.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

Examples of the monomer that yields the structural unit (a5) include compounds in which a base dissociable group and a polymerizable group are bonded via a divalent linking group.

A "polymerizable group" refers to a group that renders a compound having the group polymerizable by a radical polymerization or the like, and examples of the polymerizable groups include groups containing an ethylenic double bond. Examples of the groups containing an ethylenic double bond include a group represented by $CH_2$=CR— (in the formula, R is the same as defined above).

Examples of the divalent linking groups include a group represented by the formula -$A_{aryl}$-$X_{01}$— (in the formula, $A_{aryl}$ and $X_{01}$ are the same as defined above) and a group represented by the formula —C(=O)—O—X— (in the formula, X is the same as defined above).

With respect to the monomer which yield the structural unit represented by general formula (a5-01), examples of the monomer which yield the structural unit represented by general formula (a5-01-1) include a fluorine-containing compound represented by general formula (a5-01-10) shown below, and examples of the monomer which yield the structural unit represented by general formula (a5-01-2) include a fluorine-containing compound represented by general formula (a5.01-20) shown below,

[Chemical Formula 58]

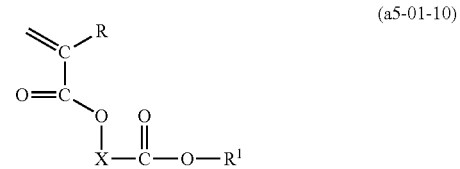

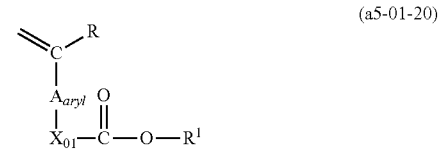

In the formulas, R, X, $A_{aryl}$, $X_{01}$ and $R^1$ are the same as defined above.

A fluorine-containing compound represented by general formula (a5-01-10) or (a5-01-20) (hereafter, frequently referred to as "fluorine-containing compound (A0)") can be produced, for example, by introducing the $R^1$ group ($R^1$ is the same as defined above) into the carboxy group of a compound represented by general formula (a0-1-0) or (a0-2-0) shown below (hereafter, collectively referred to as "compound (V-1)") (i.e., substituting the hydrogen atom at the terminal of the carboxy group with the $R^1$ group).

The $R^1$ group can be introduced by a conventional method. For example, a compound (V-1) can be reacted with a compound (V-2) represented by general formula (V-2) shown below, to thereby obtain a fluorine-containing compound (A0).

[Chemical Formula 59]

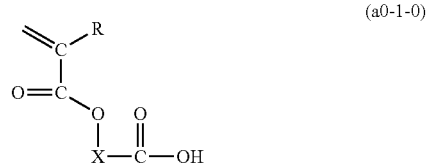

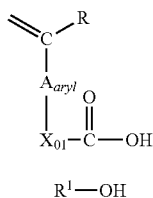

(a0-2-0)

$$R^1-OH \quad (V-2)$$

In the formulas, R, X, $A_{aryl}$, $X_{01}$ and $R^1$ are the same as defined above.

The method of reacting a compound (V-1) with a compound (V-2) is not particularly limited. For example, a method in which a compound (V-1) conies in contact with a compound (V-2) in a reaction solvent in the presence of a base can be used.

As a compound (V-1) and a compound (V-2), commercially available compounds can be used. Alternatively, a compound (V-1) and a compound (V-2) can be synthesized.

As a compound (V-1), for example, a low molecular weight compound derived from an acrylate ester such as a carboxyalkyl (meth)acrylate or a mono((meth)acryloyloxyalkyl) succinate, or a polymeric compound including a structural unit derived from an acrylate ester can be used.

As a compound (V-2), for example, a fluorinated alkylalcohol or the like can be used.

As the reaction solvent, any solvent capable of dissolving a compound (V-1) and a compound (V-2) (which are raw materials) can be used. Specific examples include tetrahydrofuran (THF), acetone, dimethylformamide (DMF), dimethylacetamide, dimethylsulfoxide (DMSO) and acetonitrile.

Examples of the base include organic bases such as triethylamine, 4-dimethylaminopyridine (DMAP) and pyridine; and inorganic bases such as sodium hydride, $K_2CO_3$ and $Cs_2CO_3$.

Examples of condensing agents include carbodiimide reagents such as ethyldiisopropylaminocarbodiimide hydrochloride (EDCI), dicyclohexylcarboxylmide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation may be used. Specific examples include inorganic acids such as hydrochloric acid, sulfuric acid and phosphoric acid; and organic acids such as methanesulfonic acid, trifluoromethemesulfonic acid, benzenesulfonic acid and p-toluenesulfonic acid. These acids can be used individually, or in a combination of two or more.

The amount of the compound (V-2) added, relative to the compound (V-1) is preferably within a range from 1 to 3 equivalents, and more preferably from 1 to 2 equivalents.

The reaction temperature is preferably −20 to 40° C., more preferably 0 to 30° C.

The reaction time varies depending on factors such as the reactivity of the compound (V-1) and the compound (V-2) and the reaction temperature. However, in general, the reaction time is preferably within a range from 30 to 480 minutes, and more preferably from 60 to 360 minutes.

For example, as a monomer which yields the structural unit (a6), a compound represented by general formula (I) shown below (hereafter, referred to as "compound (I)") can be used.

[Chemical Formula 60]

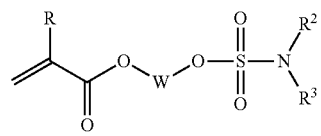

(I)

In general formula (I), R, $R^2$, $R^3$ and W are respectively the same as defined for R, $R^2$, $R^3$ and W in the aforementioned general formula (a6-1).

Although there are no particular restrictions on the method used for producing the compound (I), in one example of a preferred method, an alcohol derivative represented by a general formula (III) shown below is added to a reaction system containing a compound represented by a general formula $$X_hSO_2NR^2R^3 \quad (II)$$

in general formula (II), $X_h$ represents a fluorine atom, a chlorine atom, a bromine atom or an iodine atom; and $R^2$ and $R^3$ are the same as defined above, thereby yielding the compound (I).

[Chemical Formula 61]

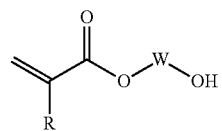

(III)

In general formula (III), R and W are the same as defined above.

In general formula (II), $R^2$ and $R^3$ are respectively the same as defined for $R^2$ and $R^3$ in the aforementioned general formula (a6-1).

In general formula (III), R and W are respectively the same as defined for R and W in the aforementioned general formula (a6-1).

In a specific example of the method of producing the compound (1), 3-sulfamoyloxyadamantane-1-yl acrylate can be produced by reacting 3-hydroxyadamantane-1-yl acrylate with $ClSO_2NH_2$.

The structure of the compound obtained in the manner described above can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray diffraction analysis.

In the present invention, when the component (A1) is used as a base resin of a positive resist composition, the component (A1) may be used alone, or the component (A1) may be used in combination with another resin which exhibits increased solubility in an alkali developing solution under action of an acid (hereafter, referred to as "component (A2)"), a low molecular weight component or a mixture thereof.

When the component (A1) is used in combination with the component (A2) as a base resin, the mixing ratio of the component (A1) to the component (A2) ((A1)/(A2)) in terms of weight ratio is preferably in the range of 99/1 to 1/99, more preferably in the range of 95/5 to 5/95, and still more preferably 90/10 to 10/90. When the amount of the component (A1)

relative to the amount of the component (A2) is at least as large as the lower limit of the above-mentioned range, a high resolution can be achieved in the formation of a resist pattern, and a resist pattern with minute size can be formed. On the other hand, when the amount of the component (A1) is no more than the upper limit of the above-mentioned range, the lithography properties can be improved.

In the positive resist composition of the present invention, when the component (A2) is used as the base resin, and the component (A1) is used as an additive other than the base resin, the amount of the component (A1) relative to 100 parts by weight of the component (A2) is preferably 0.1 to 50 parts by weight, more preferably 0.1 to 40 parts by weight, still more preferably 0.3 to 30 parts by weight, and most preferably 0.5 to 15 parts by weight. When the amount of the component (A1) is at least as large as the lower limit of the above-mentioned range, the characteristic feature of the resist film formed from the positive resist composition that the resist film is hydrophobic during immersion exposure and becomes hydrophilic by an alkali development treatment is improved. On the other hand, when the amount of the component (A1) is no more than the upper limit of the above-mentioned range, the lithography properties are improved.

When the component (A1) is used as an additive, the component (A1) can be preferably used as an additive in a resist composition for immersion exposure.

[Component (A2)]

The component (A2) is a resin component which exhibits increased solubility in an alkali developing solution under action of acid and does not fall under the category of the component (A1).

As the component (A2), any of the multitude of conventional base resins used within chemically amplified positive resist compositions can be arbitrarily selected for use.

Specific examples of the component (A2) include polymeric compounds having the aforementioned structural unit (a1) containing an acid dissociable, dissolution inhibiting group (preferably a structural unit derived from an acrylate ester containing an acid dissociable, dissolution inhibiting group).

Further, it is preferable that the component (A2) include the aforementioned structural unit (a2) derived from an acrylate ester containing a lactone-containing cyclic group, as well as the structural unit (a1).

Furthermore, it is preferable that the component (A2) include the aforementioned structural unit (a3) derived from an acrylate ester containing a polar group-containing aliphatic hydrocarbon group, as well as the structural unit (a1), or the structural unit (a1) and the structural unit (a2).

Also, the component (A2) may further include a structural unit (a4) different from the aforementioned structural units (a1), (a2) and (a3) (e.g., the aforementioned structural unit (a4) or (a7)), as well as the structural unit (a1).

Examples of such a copolymer include a copolymer consisting of the structural units (a1) and (a2) and (a3), and a copolymer consisting of the structural units (a1), (a2), (a3) and (a4).

In the positive resist composition of the present invention, as the component (A2), one type may be used, or two or more types of compounds may be used in combination.

In the present invention, as the component (A2), a polymeric compound that includes a combination of structural units such as that shown below is particularly desirable.

[Chemical Formula 62]

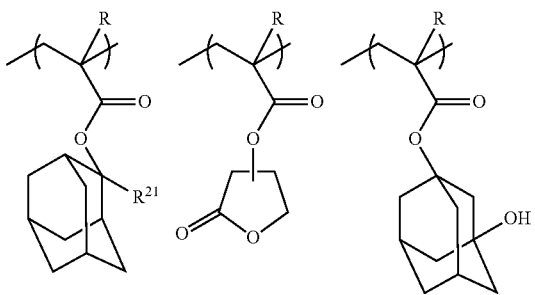

(A2-1)

In the formula, R and $R^{21}$ are the same as defined above, and the plurality of R may be the same or different from each other.

In formula (A2-1), the lower alkyl group for $R^{21}$ is the same as the lower alkyl group for R above, preferably a methyl group or an ethyl group, and most preferably a methyl group.

[Chemical Formula 63]

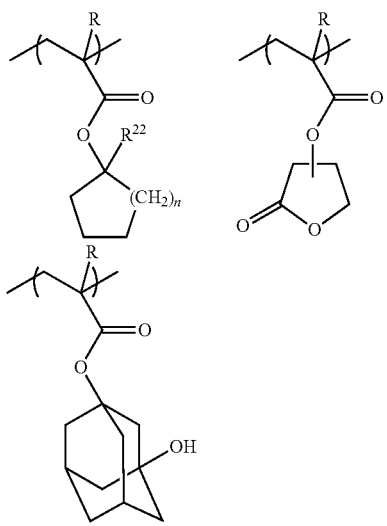

(A2-2)

In the formula, R, $R^{22}$ and h are the same as defined above, and the plurality of R may be the same or different from each other.

In formula (A2-2), the lower alkyl group for $R^{22}$ is the same as the lower alkyl group for R above, preferably a methyl group or an ethyl group, and most preferably a methyl group.

h is preferably 1 or 2, and most preferably 2.

The weight average molecular weight (Mw) (the polystyrene equivalent value determined by gel permeation chromatography) of the component (A2) is not particularly limited, but is preferably 1,000 to 50,000, more preferably 1,500 to 30,000, and most preferably 2,500 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (A2) is preferably 1.0 to 5.0, more preferably 1.0 to 3.0, and most preferably 1.2 to 2.5.

[Low Molecular Weight Component]

Examples of the low molecular weight component include low molecular weight compounds that have a molecular weight of at least 500 and less than 2,000, contains a hydrophilic group, and also contains an acid dissociable, dissolution inhibiting group described above in connection with the component (A1), Specific examples of the low molecular weight compound include compounds containing a plurality of phenol skeletons in which a part of the hydrogen atoms within hydroxyl groups have been substituted with the aforementioned acid dissociable, dissolution inhibiting groups.

In the positive resist composition of the present invention, as the component (A), one type may be used, or two or more types of compounds may be used in combination.

In the positive resist composition of the present invention, when the component (A) is used as a base component, the amount of the component (A) can be appropriately adjusted depending on the thickness of the resist film to be formed, and the like.

<Component (B)>

In the present invention, as the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators.

As an onium salt acid generator, a compound represented by general formula (b-1) or (b-2) shown below can be used.

[Chemical Formula 64]

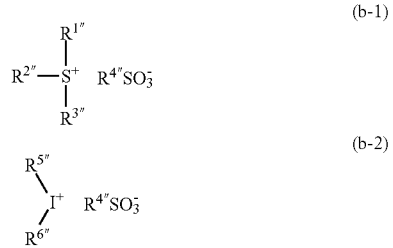

In the formulas above, $R^{1''}$ to $R^{3''}$, $R^{5''}$ and $R^{6''}$ each independently represent an aryl group or alkyl group, wherein two of $R^{1''}$ to $R^{3''}$ may be bonded to each other to form a ring with the sulfur atom; and $R^{4''}$ represents an alkyl group, a halogenated alkyl group, an aryl group or an alkenyl group which may have a substituent, with the provision that at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. In formula (b-1), two of $R^{1''}$ to $R^{3''}$ may be bonded to each other to form a ring with the sulfur atom.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tart-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is most preferable because it is excellent in resolution and can be synthesized at a low cost.

When two of $R^{1''}$ to $R^{3''}$ in formula (b-1) are bonded to each other to form a ring with the sulfur atom, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1) are bonded to each other to form a ring with the sulfur atom, the remaining one of $R^{1''}$ to $R^{3''}$ is preferably an aryl group. As examples of the aryl group, the same as the above-mentioned aryl groups for $R^{1''}$ to $R^{3''}$ can be given.

As preferable examples of the cation moiety for the compound represented by general formula (b-1), those represented by formulas (I-1-1) to (I-1.8) shown below which have a triphenylmetharie skeleton may be given.

[Chemical Formula 65]

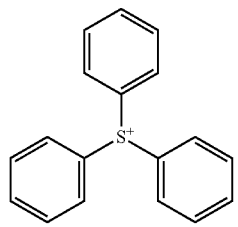

(I-1-1)

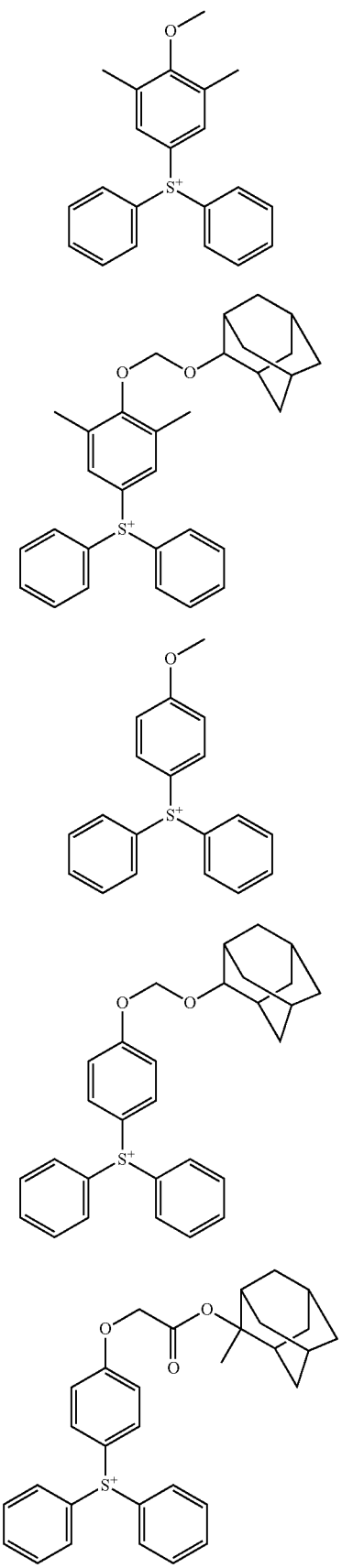

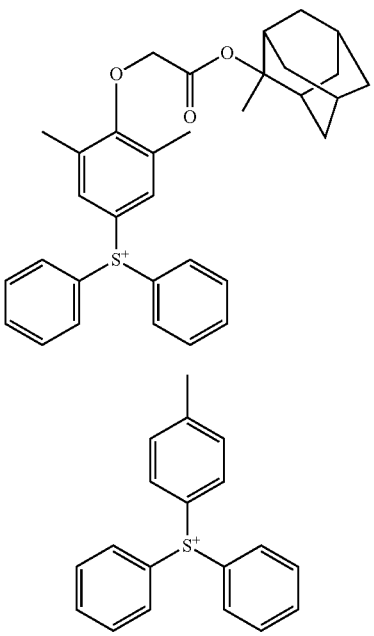

Further, as a cation moiety for an onium salt-based acid generator, any of the cations represented by formulas (I-1-9) and (I-1.10) shown below are also preferable.

In formulas (I-1-9) and (1-1-10) shown below, each of $R^{27}$ and $R^{39}$ independently represents a phenyl group or naphthyl group which may have a substituent, an alkyl group of 1 to 5 carbon atoms, an alkoxy group or a hydroxyl group.

u is an integer of 1 to 3, and most preferably 1 or 2.

[Chemical Formula 66]

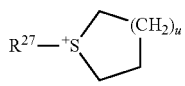

(I-1-9)

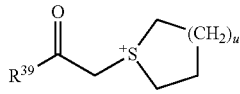

(I-1-10)

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for $R^{4'''}$, a group in which part of or all of the hydrogen atoms of the aforementioned linear, branched or cyclic alkyl group have been substituted with halogen atoms can be given. Examples of the aforementioned halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms (halogenation ratio (%)) is preferably 10 to 100%, more preferably 50 to 100%, and most preferably 100%. Higher halogenation ratios are preferable, as they result in increased acid strength.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X^3$-$Q^3$-(in the formula, $Q^3$ represents a divalent linking group containing an oxygen atom; and $X^3$ represents a hydrocarbon group of 3 to 30 carbon atoms which may have a substituent).

Examples of halogen atoms and alkyl groups as substituents for $R^{4'''}$ include the same halogen atoms and alkyl groups as those described above with respect to the halogenated alkyl group for $R^{4'''}$.

Examples of hetero atoms include an oxygen atom, a nitrogen atom, and a sulfur atom.

In the group represented by formula $X^3$-$Q^3$-, $Q^3$ represents a divalent linking group containing an oxygen atom.

$Q^3$ may contain an atom other than an oxygen atom. Examples of atoms other than oxygen include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, -$R^{92}$-O—C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5, and most preferably 1 to 3.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$C$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As $Q^3$, a divalent linking group containing an ester bond or an ether bond is preferable, and —$R^{91}$—O—, —$R^{92}$—O—C(=O)— or —C(=O)—O—$R^{93}$—O—C(=O)— is more preferable.

In the group represented by the formula $X^3$-$Q^3$-, the hydrocarbon group for $X^3$ may be either an aromatic hydrocarbon group or an aliphatic hydrocarbon group.

The aromatic hydrocarbon group is a hydrocarbon group having an aromatic ring. The aromatic hydrocarbon ring preferably has 3 to 30 carbon atoms, more preferably 5 to 30, still more preferably 5 to 20, still more preferably 6 to 15, and most preferably 6 to 12. Here, the number of carbon atoms within a substituent(s) is not included in the number of carbon atoms of the aromatic hydrocarbon group.

Specific examples of aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2, and most preferably 1.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which part of the carbon atoms constituting the ring within the aforementioned aryl group has been substituted with a hetero atom such as an oxygen atom, a sulfur atom or a nitrogen atom, and a heteroarylalkyl group in which part of the carbon atoms constituting the aromatic hydrocarbon ring within the aforementioned arylalkyl group has been substituted with the aforementioned heteroatom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for $X^3$ may be either a saturated aliphatic hydrocarbon group, or an unsaturated aliphatic hydrocarbon group. Further, the aliphatic hydrocarbon group may be linear, branched or cyclic.

In the aliphatic hydrocarbon group for $X^3$, part of the carbon atoms constituting the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" for $X^3$, there is no particular limitation as long as it is an atom other than carbon and hydrogen.

Examples of the halogen atom include a fluorine atom, a chlorine atom, an iodine atom and a bromine atom.

The substituent group containing a hetero atom may consist of a hetero atom, or may be a group containing a group or atom other than a hetero atom.

Specific examples of the substituent group for substituting part of the carbon atoms include —O—, —C(=O)—O—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a, cyclic aliphatic hydrocarbon group (aliphatic cyclic group) is preferable.

The linear saturated hydrocarbon group (alkyl group) preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15, and most preferably 3 to 10, Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5, still more preferably 2 to 4, and most preferably 3. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30, still more preferably 5 to 20, still more preferably 6 to 15, and most preferably 6 to 12.

As the aliphatic cyclic group, a group in which one or more hydrogen atoms have been removed from a monocycloalkane or a polycycloalkane such as a bicycloalkane, tricycloalkane or tetracycloalkane can be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and a group in which one or more hydrogen atoms have been removed from adamantane is particularly desirable.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 67]

(L1)

(L2)

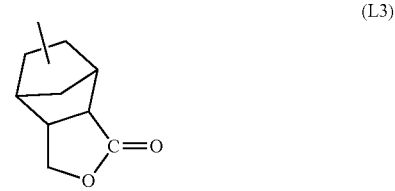

(L3)

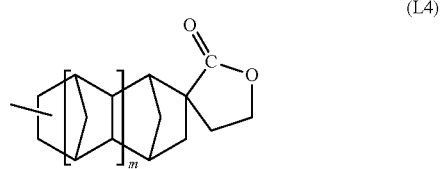

(L4)

(L5)

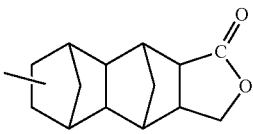

(S1)

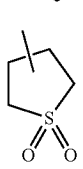

(S2)

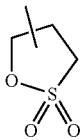

(S3)

(S4)

In the formula, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms); and m represents 0 or 1.

As the alkylene group for Q", $R^{94}$ and $R^{95}$, the same alkylene groups as those described above for $R^{91}$ to $R^{93}$ can be used.

In these aliphatic cyclic groups, part of the hydrogen atoms bonded to the carbon atoms constituting the ring structure may be substituted with a substituent. Examples of substituents include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a text-butyl group is particularly desirable.

As the alkoxy group and the halogen atom, the same groups as the substituent groups for substituting part or all of the hydrogen atoms can be used.

Among the examples described above, as $X^3$, a cyclic group which may have a substituent is preferable. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the aliphatic polycyclic group, the aforementioned group in which one or more hydrogen atoms have been removed from a polycycloalkane, and groups represented by formulas (L2) to (L5), (S3) and (S4) are preferable.

Further, in the present invention, it is particularly desirable that $X^3$ have a polar moiety, because it results in improved lithographic properties and resist pattern shape.

Specific examples of $X^3$ having a polar moiety include those in which a part of the carbon atoms constituting the aliphatic hydrocarbon group for $X^3$ is substituted with a substituent group containing a hetero atom such as —O—, —C(=O)—O—, —C(=O)—, —C(=O)—NH—, —NH— (wherein H may be substituted with a substituent such as an alkyl group or an acyl group), —S—, —S(=O)$_2$— and —S(=O)$_2$—O—.

In the present invention, $R^{4'''}$ preferably has $X^3$-$Q^3$- as a substituent. In such a case, $R^{4'''}$ is preferably a group represented by the formula $X^3$-$Q^3$-$Y^1$- (in the formula, $Q^3$ and $X^3$ are the same as defined above; and $Y^1$ represents an alkylene group of 1 to 4 carbon atoms which may have a substituent, or a fluorinated alkylene group of 1 to 4 carbon atoms which may have a substituent).

In the group represented by the formula $X^3$-$Q^3$-$Y^1$—, as the alkylene group for $Y^1$, the same alkylene group as those described above for $Q^3$ in which the number of carbon atoms is 1 to 4 can be used.

As the fluorinated alkylene group for $Y^1$, the aforementioned alkylene group in which part or all of the hydrogen atoms has been substituted with fluorine atoms can be used.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—; —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—; —$CH_2CH_2$—, —$CH_2CH_2CH_2$—, —$CH(CH_3)CH_2$—, —$CH(CH_2CH_3)$—, —$C(C_3)_2$—, —$CH_2CH_2CH_2CH_2$—, —$CH(CH_3)CH_2CH_2$—, —$C_2CH(CH_3)CH_2$—, —$CH(C_3)CH(CH_3)$—, —$C(CH_3)_2CH_2$—, —$CH(CH_2CH_3)CH_2$—, —CH(CH$_2$CH$_2$C$_3$)—, and —C(CH$_3$)(CH$_2$CH$_3$)—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable.

The alkylene group or fluorinated alkylene group may have a substituent. The alkylene group or fluorinated alkylene group "has a substituent" means that part or all of the hydrogen atoms or fluorine atoms in the alkylene group or fluorinated alkylene group has been substituted with groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5\prime\prime\prime}$ and $R^{6\prime\prime\prime}$ each independently represent an aryl group or alkyl group. At least one of $R^{5\prime\prime\prime}$ and $R^{6\prime\prime\prime}$ represents an aryl group. It is preferable that both of $R^{5\prime\prime\prime}$ and $R^{6\prime\prime\prime}$ represent an aryl group.

As the aryl group for $R^{5\prime\prime\prime}$ and $R^{6\prime\prime\prime}$, the same as the aryl groups for $R^{1\prime}$ to $R^{3\prime\prime}$ can be used.

As the alkyl group for $R^{5\prime\prime\prime}$ and $R^{6\prime\prime\prime}$, the same as the alkyl groups for $R^{1\prime\prime}$ to $R^{3\prime\prime}$ can be used.

It is particularly desirable that both of $R^{5\prime\prime\prime}$ and $R^{6\prime\prime\prime}$ represents a phenyl group.

As $R^{4\prime\prime\prime}$ in formula (b-2), the same groups as those mentioned above for $R^{4\prime\prime\prime}$ in formula (b-1) can be used.

Specific examples of suitable onium salt acid generators represented by formula (b-1) or (b-2) include diphenyliodonium trifluoromethanesulfonate or nonafluorobutanesulfonate; bis(4-text-butylphenypiodonium trifluoromethanesulfonate or nonafluorobutanesulfonate; triphenylsulfonium trifluoromethanesulfonate, heptafluoropropanesulfonate or nonafluorobutanesulfonate; tri(4-methylpheyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-text-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxymphthalene-1-yl)tetrahydrothiopheniutn trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by an alkyl sulfonate such as methanesulfonate, n-propanesulfonate, n-butanesulfonate, n-octanesulfonate, 1-adamantanesulfonate, or 2-norbornanesulfonate; or a sulfonate such as d-camphor-10-sulfonate, benzenesulfonate, perfluorobenzenesulfonate, or p-toluenesulfonate.

Furthermore, onium salts in which the anion moiety of these onium salts is replaced by an anion moiety represented by any one of formulas (b1) to (b8) shown below can also be used.

[Chemical Formula 68]

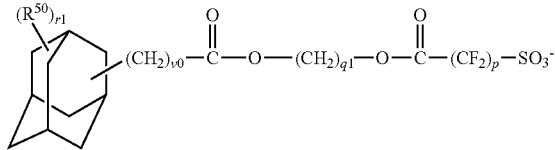

(b1)

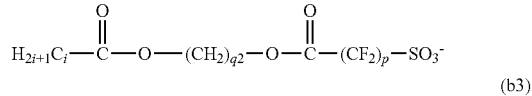

(b2)

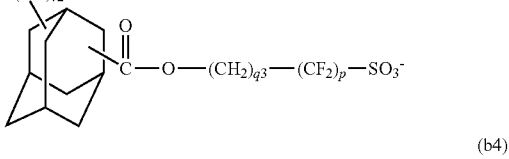

(b3)

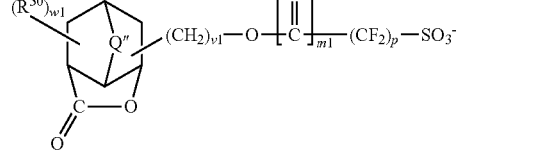

(b4)

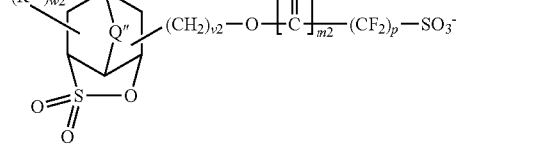

(b5)

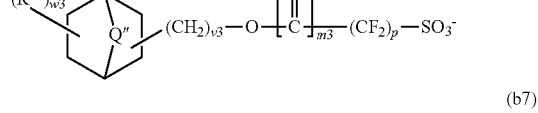

(b6)

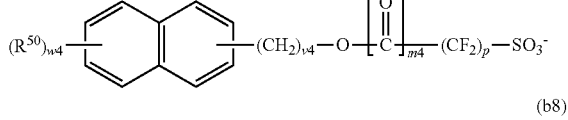

(b7)

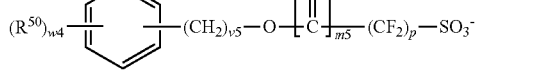

(b8)

In the formulas, p represents an integer of 1 to 3; each of q1 and q2 independently represents an integer of 1 to 5; q3 represents an integer of 1 to 12; each of r1 and r2 independently represents an integer of 0 to 3; i represents an integer of 1 to 20; $R^{50}$ represents a substituent; each of m1 to m5 independently represents 0 or 1; each of v0 to v5 independently represents an integer of 0 to 3; each of w1 to w5 independently represents an integer of 0 to 3; and Q" is the same as defined above.

As the substituent for $R^{50}$, the same groups as those which the aforementioned aliphatic hydrocarbon group or aromatic hydrocarbon group for $X^3$ may have as a substituent can be used.

If there are two or more of the $R^{50}$ group, as indicated by the values r1, r2, and w1 to w5, then the two or more of the $R^{50}$ groups may be the same or different from each other.

Further, onium salt-based acid generators in which the anion moiety in general formula (b-1) or (b-2) ($R^{4'''}SO_3^-$) is replaced by an anion represented by general formula (b-3) or (b-4) shown below (the cation moiety is the same as the cation moiety in the aforementioned formula (b-1) or (b-2)) may be used.

[Chemical Formula 69]

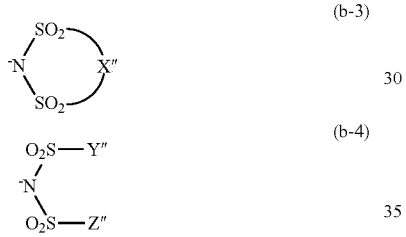

In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved.

The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Further, an onium salt-based acid generator in which the anion moiety ($R^{4'''}SO_3^-$) in general formula (b-1) or (b-2) has been replaced with $R^a$-$COO^-$ (in the formula, $R^a$ represents an alkyl group or a fluorinated alkyl group) can also be used (the cation moiety is the same as that in general formula (b-1) or (b-2)).

In the formula above, as $R^a$, the same groups as those described above for $R^{4'''}$ can be used.

Specific examples of the group represented by the formula "$R^a$—COO" include a trifluoroacetic acid ion, an acetic acid ion, and a 1-adamantanecarboxylic acid ion.

Furthermore, as an onium salt-based acid generator, a sulfonium salt having a cation moiety represented by general formula (b-5) or (b-6) shown below may be used.

[Chemical Formula 70]

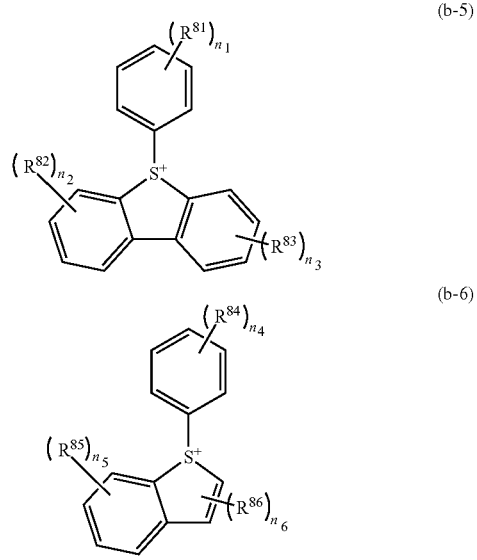

In formulas (b-5) and (b-6) above, each of $R^{81}$ to $R^{86}$ independently represents an alkyl group, an acetyl group, an alkoxy group, a carboxy group, a hydroxyl group or a hydroxyalkyl group; each of $n_1$ to $n_5$ independently represents an integer of 0 to 3; and $n_6$ represents an integer of 0 to 2.

With respect to $R^{81}$ to $R^{86}$, the alkyl group is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{81}$ to $R^{86}$ group, as indicated by the corresponding value of $n_1$ to $n_6$, then the two or more of the individual $R^{81}$ to $R^{86}$ group may be the same or different from each other.

$n_1$ is preferably 0 to 2, more preferably 0 or 1, and still more preferably 0.

It is preferable that $n_2$ and $n_3$ each independently represent 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4\prime\prime}SO_3^-$) for onium salt-based acid generators represented by general formula (b-1) or (b-2) shown above; and anion moieties represented by general formula (b-3) or (b-4) shown above.

In the present description, an oximesulfonate acid generator is a compound having at least one group represented by general formula (B-1) shown below, and has a feature of generating acid by irradiation. Such oximesulfonate acid generators are widely used for a chemically amplified resist composition, and can be appropriately selected.

[Chemical Formula 71]

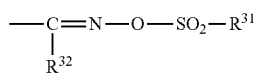

(B-1)

In the formula, each of $R^{31}$ and $R^{32}$ independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched, or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 72]

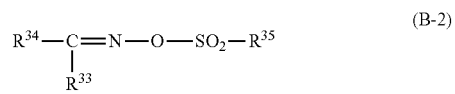

(B-2)

In the formula, $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 73]

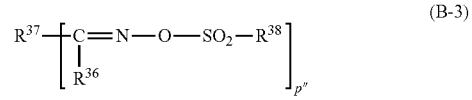

(B-3)

In the formula, $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. Further, the halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same one as the alkyl group having no substituent or the halogenated alkyl group for $R^{35}$ can be used.

p″ is preferably 2.

Specific examples of suitable oxime sultanate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyirnino)-4-chlorobenzyl cyanide, α-(benzenesulfanyloxyirnino)-2,4-dichlorobenzyl cyanide, α-(benzenesulfonyloxyitnino)-2,6-dichlorobenzyl cyanide, α-(benzenesulfonyloxyimino)-4-methoxybenzyl cyanide, α-(2-chlorobenzenesultanyloxyimino)-4-methoxybenzyl cyanide, α-(benzenesulfonylaxylmino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyhnino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described at pages 65 to 85) may be preferably used.

Furthermore, as preferable examples, the following can be used.

[Chemical Formula 74]

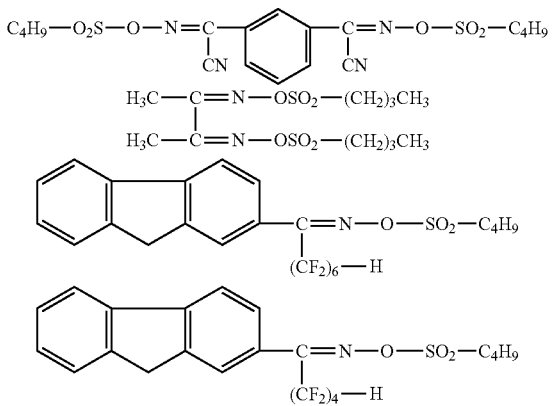

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethrme.

Further, diazomethane acid generators disclosed in Japanese Unexamined Patent Application, First Publication No, Hei 11.035551, Japanese Unexamined Patent Application, First Publication No. Hei 11-035552 and Japanese Unexamined Patent Application, First Publication No. Hei 11-035573 may be preferably used.

Furthermore, as examples of poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazornethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be given.

As the component (B), one type of these acid generators may be used alone, or two or more types may be used in combination.

In the present invention, as the component (B), it is preferable to use an onium salt-based acid generator having a fluorinated alkylsulfonic acid ion as the anion moiety.

In the positive resist composition of the present invention, the amount of the component (B) relative to 100 parts by weight of the component (A) is preferably 0.5 to 50 parts by weight, and more preferably 1 to 40 parts by weight. When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Components>

[Component (D)]

It is preferable that the positive resist composition of the present invention further includes a nitrogen-containing organic compound (D) (hereafter referred to as the component (D)) (provided that the component (A1) is excluded) as an optional component.

As the component (D), there is no particular limitation as long as it functions as an acid diffusion control agent, i.e., a quencher which traps the acid generated from the component (B) upon exposure. A multitude of these components (D) have already been proposed, and any of these known compounds may be used. Among these, an aliphatic amine, particularly a secondary aliphatic amine or tertiary aliphatic amine, and an aromatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylarmine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabioyolo[2.2.2]octane.

Further, aliphatic amines other than those described above can be used. Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris {2-(1-ethoxyethoxy)ethyl} amine, tris{2-(1-ethoxypropoxy)ethyl}amine and tris [2-{2-(2-hydroxyethoxy)ethoxy}ethyl]amine.

Examples of aromatic amines include aniline compounds such as aniline, N,N-n-butyl-aniline, 2,6-diisopropylaniline, N-isopropylaniline, 3-isopropoxyaniline and N-ethylaniline, pyridine, 4-dimethylaminopyridine, pyrrole, indole, pyrazole, imidazole and derivatives thereof, as well as diphenylamine, triphenylarmine and tribenzylamine.

As the component (D), one type of compound may be used alone, or two or more types may be used in combination.

The component (D) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

[Component (E)]

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type may be used alone, or two or more types may be used in combination.

As the component (E), an organic carboxylic acid is preferred, and salicylic acid is particularly desirable.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The positive resist composition of the present invention can be produced by dissolving the materials for the resist composition in an organic solvent (hereafter, referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples of the component (S) include lactones such as γ-butyrolactone; ketones such as acetone, methyl ethyl ketone, cyclohexanone (CH), methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

The component (S) can be used individually, or in combination as a mixed solvent.

Among these, cyclohexanone (CH), γ-butyrolactone, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3. Alternatively, when cyolohexanone (CH) is mixed as the polar solvent, the PGMEA:CH weight ratio is preferably from 1:9 to 9:1, and more preferably from 2:8 to 9:1.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is adjusted appropriately to a concentration that enables application of a coating solution to a substrate in accordance with the thickness of the coating film. In general, the component (S) is used in an amount that yields a solid content for the resist composition that is preferably within a range from 0.5 to 20% by weight, and more preferably from 1 to 15% by weight.

Dissolving of the components for a positive resist composition in the component (S) can be conducted by simply mixing and stirring each of the above components together using conventional methods, and where required, the composition may also be mixed and dispersed using a dispersion device such as a dissolver, a homogenizer, or a triple roll mill.

Furthermore, following mixing, the composition may also be filtered using a mesh, or a membrane filter or the like.

<<Method of Forming a Resist PatterN>>

The method of forming a resist pattern according to a second aspect of the present invention includes: using a positive resist composition of the present invention to form a resist film on a substrate; conducting exposure of the resist film; and alkali-developing the resist film to form a resist pattern.

The method for forming a resist pattern according to the present invention can be performed, for example, as follows.

More specifically, the method for forming a resist pattern according to the present invention can be performed, for example, as follows. Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed with an ArF exposure apparatus, an electron beam exposure apparatus, an EUV exposure apparatus or the like through a mask pattern or directly irradiated with electron beam without a mask pattern, followed by post exposure bake (PEB) under temperature conditions of 80 to 150° C. for 40 to 120 seconds, preferably 60 to 90 seconds, Subsequently, developing is conducted using an alkali developing solution such as a 0.1 to 10% by weight aqueous solution of tetramethylammnonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARO) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

The method of forming a resist pattern according to the present invention is also applicable to a double exposure method or a double patterning method.

As described above, according to the present invention, there are provided a novel resist composition and a method of forming a resist pattern that can be preferably used in lithography applications.

In the present invention, particularly when the polymeric compound (A1) is used as a base resin, a resist pattern can be formed with high resolution.

The reason for this has not been elucidated yet, but is presumed that such effect is achieved by virtue of the polymeric compound (A1) including the structural unit (a1) containing an acid dissociable, dissolution inhibiting group which is dissociated by the action of an acid to increase the solubility of the component (A1) in an alkali developing solution, the structural unit (a5) containing a base dissociable group which is decomposed (hydrolyzed) by the action of a base (alkali developing solution), and the structural unit (a6) in the molecular thereof.

In addition to the action of the structural unit (a1) and the structural unit (a5), because the structural unit (a6) within the polymer compound (A1) includes the structure represented by $OSO_2N(R^2)R^3$ as a side chain terminal, the polymer compound (A1) exhibits the required level of alkali solubility needed for either a resist composition, and furthermore, because the W group (cyclic alkylene group) and the sulfamoyloxy group ($OSO_2N$ group) of the structural unit (a6) are both structures of comparatively superior transparency, the overall transparency of the component (A1), and particularly the transparency to light having a wavelength in the vicinity of 193 nm, is very high. As a result, it is presumed that the three structural units act synergistically to significantly improve the resolution.

Moreover, in the present invention, particularly when the polymeric compound (A1) is used as an additive other than the base resin, generation of defects can be suppressed, and a resist pattern having an excellent shape can be fanned. The reason for this has not been elucidated yet, but is presumed as follows.

A resist film formed using the positive resist composition of the present invention includes the structural unit (a1) containing an acid dissociable, dissolution inhibiting group, the structural unit (a5) containing a base dissociable group and the structural unit (a6) represented by general formula (a6.1).

In particular, in the component (A1), the structural unit (a5) is decomposed (hydrolyzed) by the action of a base (alkali developing solution), so that the base dissociable group is dissociated from the structural unit (a5) to form a hydrophilic group "HO—C(=O).". Therefore, the resist film formed using a positive resist composition containing the component (A1) exhibits a higher hydrophilicity by alkali developing than the resist film prior to alkali developing.

Thus, by using such a positive resist composition in which the hydrophilicity is enhanced during alkali developing, the deposits after development exhibit increased affinity for the alkali developing solution, and generation of defects during (immersion) exposure (especially defects caused by deposits generated after the development process) can be effectively suppressed.

Especially in an immersion exposure process, it is preferable to enhance the hydrophobicity of the resist film so as to prevent the resist film from being affected by the immersion medium such as water. However, when the hydrophobicity of the resist film is high, it is disadvantageous in that the risk of defects caused by a deposit and the like generated after the development process becomes high. The reason for this is that the deposit is a residue which could not be washed off the resist film by the hydrophilic developing solution and remaining on the resist film. Since this deposit is hydrophobic, the deposit becomes easier to be adhered to the resist film as the hydrophobicity of the resist film becomes higher.

In view of the above, the resist film is required to be hydrophobic during immersion exposure and become hydrophilic during alkali developing.

As described above, the component (A1) according to the present invention is decomposable by an alkali developing solution. Therefore, by using a resist composition containing the component (A1), it becomes possible to form a resist film that is hydrophobic prior to coming in contact with an alkali developing solution (e.g., during immersion exposure), and becomes hydrophilic during alkali developing.

Furthermore, as described above, in the component (A1), the structural unit (a6) contains a structure represented by the formula "$OSO_2N(R^2)R^3$" on the terminal of the side chain. Therefore, it is presumed that the polymeric compound (A1) exhibits a satisfactory alkali solubility, so that deposits after development can be readily dissolved in the alkali developing solution. In addition, in the structural unit (a6), both the W group (cyclic alkylene group) and the sulfamoyloxy group (—OSO$_2$N— group) has a structure that exhibits a relatively high transparency. Therefore, it is presumed that the transparency of the polymeric compound (A1) is high, especially transparency to a light having a wavelength in the vicinity of 193 nm, so that a pattern can be readily resolved.

Thus, for the reasons described above, it is presumed that the positive resist composition of the present invention can effectively suppress generation of defects (especially defects caused by deposits generated after the development process), thereby enabling formation of a resist pattern having an excellent shape.

Furthermore, since the component (A1) has a carbonyloxy group (—C(=O)—O—) which exhibits a relatively high polarity, the component (A1) exhibits improved compatibility with other components of the resist composition. Therefore, the positive resist composition of the present invention is expected to exhibit improved stability over time.

It is preferable that the component (A1) contains a fluorine atom, and it is more preferable that the structural unit (a5) contains a fluorine atom (in particular, within the base dissociable group). By using a component (A1) containing a fluorine atom, the hydrophobicity of the resist film during immersion exposure can be enhanced.

When the component (A1) contains a fluorine atom, a resist film formed using the positive resist composition of the present invention exhibits a high hydrophobicity during immersion exposure for example, as compared to the case of using a conventional resist composition. Therefore, the resist film exhibits an excellent water tracking ability (tracking ability of water with respect to the movement of the lens) which is required when immersion exposure is conducted using a scanning-type immersion exposure apparatus as disclosed in Non-Patent Document 1, and a high scanning speed can be achieved.

In a resist film formed using the positive resist composition of the present invention, when the component (A1) contains a fluorine atom, the hydrophobicity of the resist film is enhanced as compared to a resist film formed using a conventional positive resist composition, and the contact angles against water, e.g., the static contact angle (the contact angle between the surface of a water droplet on the resist film in a horizontal state and the resist film surface), the dynamic contact angle (the contact angle at which a water droplet starts to slide when the resist film is inclined, including the contact angle at the front-end point of the water droplet in the sliding direction (advancing angle) and the contact angle at the rear-end point of the water droplet in the sliding direction (receding angle)) and sliding angle (the inclination angle at which a water droplet starts to slide when the resist film is inclined) are changed. For example, the higher the hydrophobicity of a resist film, the higher the static contact angle and the dynamic contact angle and the smaller the sliding angle.

FIG. 1 is an explanatory diagram of an advancing angle ($\theta_1$), a receding angle ($\theta_2$) and a sliding angle ($\theta_3$).

As shown in FIG. 1, when a droplet 1 is placed on a plane 2 and the plane 2 is gradually inclined, the advancing angle is the angle $\theta_1$ formed between the lower end 1a of the droplet 1 and the plane 2 as the droplet 1 starts to move (slide) on the plane 2.

Further, at this point (the point when the liquid droplet 1 starts to move (slide) down the flat surface 2), the angle $\theta_2$ between the surface of the liquid droplet at the top edge 1b of the liquid droplet 1 and the flat surface 2 is the receding angle, and the inclination angle $\theta_3$ of the flat surface 2 is the sliding angle.

In the present description, the static contact angle, the dynamic contact angle and the sliding angle are measured in the following manner.

First, a resist composition solution is spin-coated onto a silicon substrate, and then heated under predetermined conditions, for example, at a temperature of 110° C. to 115° C. for 60 seconds to form a resist film.

Subsequently, the contact angles can be measured using commercially available measurement apparatuses such as DROP MASTER-700 (product name; manufactured by Kyowa Interface Science Co. Ltd.), AUTO SLIDING ANGLE: SA-30 DM (product name; manufactured by Kyowa Interface Science Co. Ltd.), and AUTO DISPENSER: AD-31 (product name; manufactured by Kyowa Interface Science Co, Ltd.).

When the component (A1) contains a fluorine atom, with respect to a resist film formed using a positive resist composition containing the component (A1), the static contact angle as measured prior to exposure and development is preferably 70 degrees)(°) or more and more preferably 70 to 100°. When the static contact angle is within the above-mentioned range, the hydrophobicity of the resist film surface becomes excellent, thereby enabling high-speed scanning during immersion exposure. Further, the effect of suppressing elution of a substance (leaching) can be improved. It is presumed that one of the main reasons why these effects can be achieved is related to the hydrophobicity of the resist film. More specifically, it is presumed that, since an aqueous substance such as water is used as the immersion medium, higher hydrophobicity has an influence on the swift removal of the immersion medium from the surface of the resist film after the immersion exposure.

For the same reasons as described above, when the component (A1) contains a fluorine atom, with respect to a resist film formed using a positive resist composition containing the component (A1), the receding angle as measured prior to conducting exposure and development is preferably 65° or more, more preferably 70° or more, and still more preferably 72° or more. The upper limit value of the receding angle is not particularly limited, and can be, for example, 90° or less.

Furthermore, when the component (A1) contains a fluorine atom, with respect to a resist film formed using a positive resist composition containing the component (A1), the sliding angle as measured prior to exposure and development is preferably 25° or less, and more preferably 20° or less. When the sliding angle is no more than the upper limit of the above-mentioned range, the effect of suppressing the elution of a substance during immersion exposure is enhanced. The lower limit of the sliding angle is not particularly limited, and can be, for example, 5° or more.

Furthermore, when the component (A1) contains a fluorine atom, with respect to a resist film formed using a positive resist composition containing the component (A1), the advancing angle as measured prior to exposure and development is preferably 70 to 100°, and more preferably 75 to 90°. When the advancing angle is within the above-mentioned range, generation of defects can be suppressed, and various lithography properties can be improved.

The level of the above-mentioned various contact angles (dynamic contact angle, static contact angle and sliding angle) can be adjusted by the formulation of the positive resist composition, e.g., the type of the component (A1) and the amount of the component (A1). For example, by increasing the amount of the component (A1), the hydrophobicity of the formed resist film can be enhanced, and the static contact angle and the receding angle becomes large, in particular, the receding angle. Further, in particular, by adjusting the amount of the component (A1) and the amount of fluorine contained in the component (A1), the advancing angle can be adjusted (the smaller the amount of fluorine, the smaller the advancing angle).

Further, by using a positive resist composition containing a component (A1) containing a fluorine atom, elution of a substance from the resist film during immersion exposure can be suppressed.

As described above, immersion exposure is a method in which exposure (immersion exposure) is conducted in a state where the region between the lens and the resist layer formed on a wafer (which was conventionally filled with air or an inert gas such as nitrogen) is filled with a solvent (a immersion medium) that has a larger refractive index than the refractive index of air. In immersion exposure, when the resist film comes into contact with the immersion medium, elution of substances within the resist film (component (B), component (D), and the like) into the immersion medium occurs. This elution of a substance causes phenomenon such as degeneration of the resist film and change in the refractive index of the immersion medium, thereby adversely affecting the lithography properties.

The amount of the eluted substance is affected by the properties of the resist film surface (e.g., hydrophilicity, hydrophobicity, and the like). Therefore, it is presumed that the amount of eluted substance can be reduced by enhancing the hydrophobicity of the resist film surface.

Since a resist film formed using the positive resist composition of the present invention includes the component (A1), the resist film exhibits high hydrophobicity prior to conducting exposure and developing, as compared to a resist film which does not contain the component (A1). Thus, by the positive resist composition of the present invention, elution of a substance during immersion exposure can be suppressed.

Since elution of a substance can be suppressed, by using the positive resist composition of the present invention, phenomenon such as degeneration of the resist film and change in the refractive index of the immersion medium, which occur during immersion exposure, can be suppressed. Further, as variation in the refractive index of the immersion medium can be suppressed, a resist pattern having an excellent shape can be formed. Furthermore, the level of contamination of the lens within the exposure apparatus can be lowered. Therefore, there is no need for protection against these disadvantages, and hence, the present invention can contribute to simplifying the process and the exposure apparatus.

In addition, a resist film formed using the positive resist composition of the present invention hardly swells due to being exposed to water. Therefore, a very fine resist pattern can be formed with a high precision.

The positive resist composition of the present invention exhibits excellent lithography properties with respect to sensitivity, resolution, etching resistance and the like, and is capable of forming a resist pattern without any practical problems when used as a resist material for immersion exposure. For example, by using the positive resist composition of the present invention, a very fine resist pattern with a size of 90 nm or smaller can be formed.

More specifically, in addition to the effect of suppressing generation of defects, the positive resist composition of the present invention exhibits excellent lithography properties generally required (resist pattern shape, sensitivity, resolution, etching resistance, and the like). Also, by using a component (A1) containing a fluorine atom, the positive resist composition exhibits excellent properties required for a resist material used in immersion exposure (hydrophobicity, ability of suppressing elution of a substance, water tracking ability, and the like).

Therefore, the positive resist composition of the present invention is preferable for use in immersion exposure, and is a resist material preferable in immersion lithography.

EXAMPLES

As follows is a description of examples of the present invention, although the scope of the present invention is by no way limited by these examples.

In the following examples, a unit represented by a chemical formula (1) is referred to as "compound (1)", and the same applies for compounds represented by other formulas.

<Synthesis of Resin Component (A)>

The polymeric compounds (1) to (3) used as the component (A) in the present examples were synthesized in accordance with the following polymer synthesis examples.

The compound (11) and the compound (21) used in the polymer synthesis examples were synthesized as follows.

Monomer Synthesis Example 1

Synthesis of Compound (11)

Synthesis of 3-sulfamoyloxyadamantyl methacrylate

A 5-liter four-necked flask equipped with a thermometer, a dropping funnel and a stirrer was purged with nitrogen, and 980 g of heptane and 334 g (2.4 mol) of chlorosulfonyl isocyanate were added thereto using the dropping funnel. The internal temperature was cooled to 5° C., and 110 g (2.4 mol) of formic acid was added dropwise from the dropping funnel at a rate that maintained the temperature inside the flask at 5 to 8° C. Following completion of the dropwise addition, the internal temperature was raised to 20° C., and the mixture was stirred for 10 hours. To the resulting mixed solution was added a solution containing 186.7 g (0.79 mol) of 3-hydroxyadamantyl methacrylate, 525 g of N-methylpyrrolidone, 2.1 g of 4-methoxyphenol and 2.1 g of phenothiazine, with the addition performed via the dropping funnel at a rate that maintained the temperature inside the flask at a temperature of not more than 20° C. Following stirring for 3 hours at an internal temperature of 20 to 25° C., the reaction mixture was transferred to a separating funnel, and the upper layer was discarded. To the thus obtained lower layer were added 890 g of ethyl acetate and 700 g of water, and the resulting mixture was stirred, and left to settle. Then, the resultant was subjected to liquid separation to extract the ethyl acetate phase and the aqueous phase. A further 890 g of ethyl acetate was then added to the water layer, and a second extraction was performed. Following mixing of the two ethyl acetate layers, the resulting solution was washed 5 times with 900 g of water. The washed solution was then washed with 400 g of a 7% by weight aqueous solution of sodium bicarbonate, and then 400 g of water. The this obtained washed organic layer was concentrated under reduced pressure to obtain a concentrated solution of 500 g, and 630 g of toluene was added. The resulting solution was then heated to an internal temperature of 55° C., and then cooled to 3° C. to effect a recrystallization. The suspension obtained by the recrystallization was filtered, thereby obtaining 159.5 g (0.51 mol) (yield=64%) of crystals of the objective compound (11).

[Chemical Formula 75]

Compound (11)

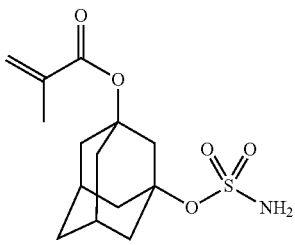

The results of ¹H-NMR analysis of the obtained compound (11) (3-sulfamoyloxyadamantyl methacrylate) are shown below.

¹H-NMR (300 MHz, DMSO-d₆, TMS, ppm) δ: 7,43 (2H, s), 5.96 (1H, s), 5.62 (1H, s), 2.48 (2H, s), 2.35 (3H, br), 2.23 (1H, s), 2.04 (6H, m), 1.84 (31H, s)1.52 (2H, s)

From the analysis results, it was confirmed that the compound (11) had a structure shown above.

Monomer Synthesis Example 2

Synthesis of Compound (21)

(i) Synthesis of Compound (21)-2

61 g (600 mmol) of triethylamine and 64 g (418 mmol) of methyl bromoacetate were added to 300 ml of a THF solution containing 30 g (348 mmol) of methacrylic acid in a nitrogen atmosphere at 0° C., and the temperature was elevated to room temperature, followed by stirring for 3 hours. After conducting thin-layer chromatography (TLC) to confirm that the raw materials had dissipated, the reaction solution was subjected to distillation under reduced pressure to remove the solvent. Then, water was added to the resultant, and extraction was conducted with ethyl acetate three times. The resulting organic phase was washed with water twice, and then subjected to distillation under reduced pressure to remove the solvent, thereby obtaining 47 g of a compound (21)-1 in the form of a colorless liquid (yield: 85%).

Subsequently, 700 ml of a THF solution containing 30 g (190 mmol) of the compound (21)-1 was prepared, and 700 ml of a 2.38% by weight aqueous solution of TMAH was added thereto, followed by stirring at room temperature for 3 hours. After conducting thin-layer chromatography (TLC) to confirm that the raw materials had dissipated, THF was distilled off under reduced pressure. Then, the resulting aqueous reaction solution was cooled to 0° C., and 50 ml of a 10 N hydrochloric acid was added thereto to render the aqueous reaction solution acidic, followed by extraction with ethyl acetate three times. The resulting organic phase was washed with water twice, and the solvent was distilled off under reduced pressure, thereby obtaining 26 g of a compound (21)-2 in the form of a colorless liquid (yield: 95%).

[Chemical Formula 76]

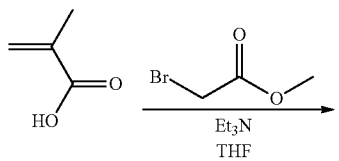

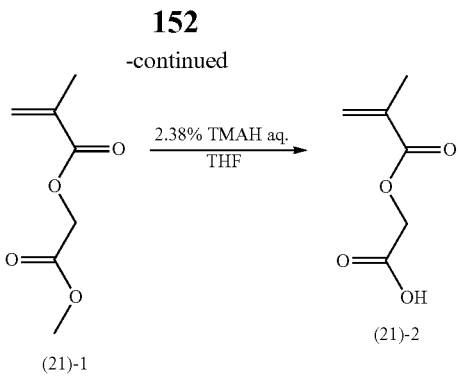

The obtained compounds (21)-1 and (21)-2 were analyzed by ¹H-NMR, The results are shown below.

Spectrum data of compound (21)-1
¹H-NMR (CDCl₃) 6.23 (s, 1H, Hb), 5.67 (d, 1H, Hb), 4.13 (s, 2H, Hc), 3.78 (s, 3H, Hd), 2.00 (s, 3H, Ha)

Spectrum data of compound (21)-2
¹H-NMR (CDCl₃) 6.23 (s, 1H, Hb), 5.67 (d, 1H, Hb), 4.69 (s, 2H, Hc), 2.00 (s, 3H, Ha)

[Chemical Formula 77]

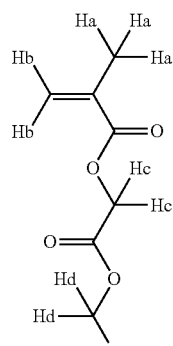

(21)-1

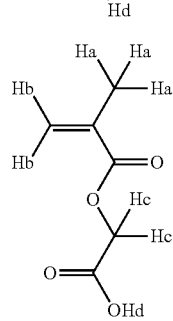

(21)-2

(ii) Synthesis of Compound (21)

26 g (180.39 mmol) of a compound (21)-2 was added to 200 ml of a THF solution containing 23.48 g (234.5 mmol) of 2,2,2-trifluoroethanol, 51.9 g (270,6 mmol) of ethyldiisopropylaminocarbodiimide (EDC1) hydrochloride and 0.11 g (0.9 mmol) of dimethylaminopyridine (DMAP) in a nitrogen atmosphere at 0° C., and the temperature was elevated to room temperature, followed by stirring for 3 hours. After conducting thin-layer chromatography (TLC) to confirm that the raw materials had dissipated, the reaction solution was cooled to 0° C., and water was added thereto to stop the reaction. Then, extraction was conducted with ethyl acetate three times, and the obtained organic phase was washed with water twice. Thereafter, the solvent was distilled off under reduced pressure to obtain a crude product, and the obtained crude product was purified by silica gel filtration (using ethyl acetate), thereby obtaining 25 g of a compound (21) in the form of a colorless liquid.

[Chemical Formula 78]

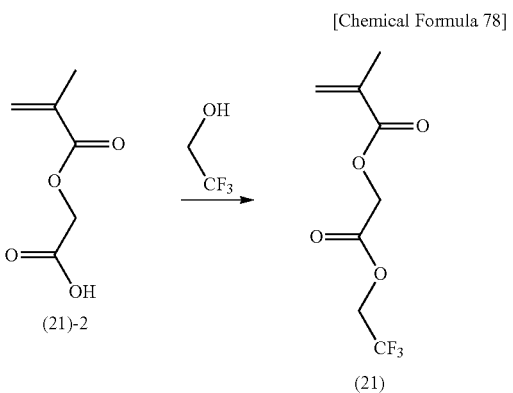

(21)

The obtained compound (21) was analyzed by $^1$H-NMR. The results are shown below.

$^1$H-NMR (CDCl$_3$) 6.24 (s, 1H, Hb), 5.70 (s, 1H, Hb), 4.80 (s, 2H, Hc), 4.60-4.51 (m, 2H, Hd), 1.99 (s, 3H, Ha)

From the results shown above, it was confirmed that the compound (21) had a structure shown below.

[Chemical Formula 79]

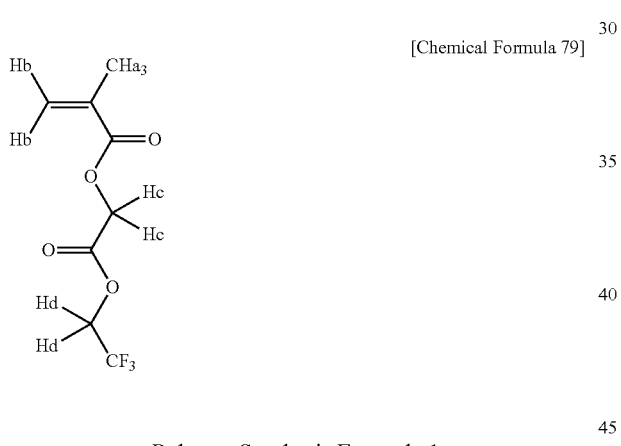

Polymer Synthesis Example 1

Synthesis of Polymeric Compound (1)

In a three-necked flask equipped with a thermometer and a reflux tube, 5.00 g (22.12 mmol) of a compound (21), 3.63 g (16,22 mmol) of a compound (25) and 3.41 g (10.82 mmol) of a compound (11) were dissolved in 28.09 g of methyl ethyl ketone (MEK) to obtain a solution. Then, 2.46 mmol of dimethyl 2,2'-azobis(isobutyrate) (V-601) as a polymerization initiator was added and dissolved in the resulting solution.

The resulting reaction solution was heated at 80° C. while stirring for 6 hours, and then cooled to room temperature.

The obtained reaction polymer solution was dropwise added to an excess amount of n-heptane, and an operation to deposit a polymer was conducted. Thereafter, the precipitated white powder was separated by filtration, followed by washing with n-heptane and methanol and drying, thereby obtaining 8.4 g of a polymeric compound (1) as an objective compound.

With respect to the polymeric compound (1), the weight average molecular weight (Mw) and the dispersity (Mw/Mn) were determined by the polystyrene equivalent value as measured by gel permeation chromatography (GPC). As a result, it was found that the weight average molecular weight was 17,500, and the dispersity was 1.97. Further, as a result of an analysis by carbon 13 nuclear magnetic resonance spectroscopy (600 MHz, $^{13}$C—NMR), it was found that the composition of the copolymer (ratio (molar ratio) of the respective structural units within the structural formula) was $a_5/a_1/a_6$=47.5/28.0/24.5.

[Chemical Formula 80]

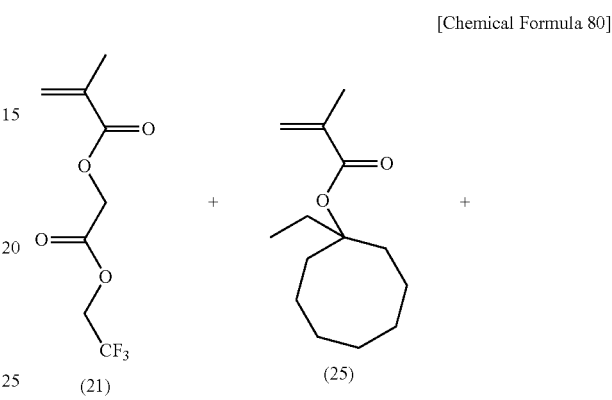

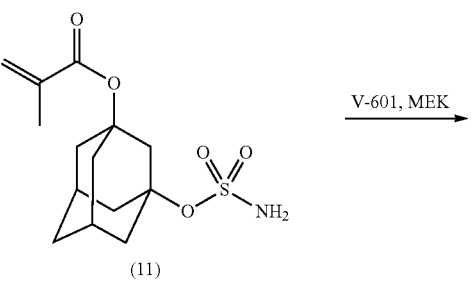

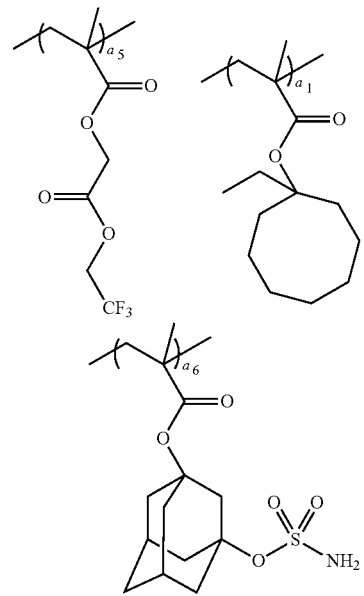

Polymeric compound (1)

Polymer Synthesis Example 2

Synthesis of Polymeric Compound (2)

Polymeric compound (2) was synthesized in the same manner as in the synthesis example of the polymeric compound (1), except that the molar ratio of the three monomers used was changed.

With respect to the polymeric compound (2), the weight average molecular weight (Mw) and the dispersity (Mw/Mn) were determined by the polystyrene equivalent value as measured by gel permeation chromatography (GPC). As a result, it was found that the weight average molecular weight was 18,500, and the dispersity was 1.99. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was $a_5/a_1/a_6$=60.1/20.7/19.2 (the obtained polymeric compound (2) had the same structure as the polymeric compound (1)).

Polymer Synthesis Example 3

Synthesis of Polymeric compound (3)

20.00 g (88.44 mmol) of the compound (21) and 6.60 g (29.48 mmol) of the compound (25) were added to a three-necked flask equipped with a thermometer and a reflux tube and were dissolved by adding 39.90 g of tetrahydrofuran thereto. Then, 23.58 mmol of dimethyl 2,2'-azobis(isobutyrate) (V-601) as a polymerization initiator was added and dissolved in the resulting solution. The resulting solution was dropwise added to 22.17 g of tetrahydrofuran that was heated to 67° C. under a nitrogen atmosphere over 3 hours, and was then subjected to a polymerization reaction. The resulting reaction solution was heated while stirring for 4 hours, and then cooled to room temperature.

The resulting polymer solution was dropwise added to an excess amount of n-heptane to thereby precipitate a polymer. Then, the precipitated polymeric compound was separated by filtration, followed by washing and drying, thereby obtaining 13 g of a polymeric compound (3) as an objective compound.

With respect to the polymeric compound (3), the weight average molecular weight (Mw) and the dispersity (Mw/Mn) were determined by the polystyrene equivalent value as measured by gel permeation chromatography (GPC). As a result, it was found that the weight average molecular weight was 25,900, and the dispersity was 1.50.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was $a_5/a_1$=78.3/21.7.

[Chemical Formula 81]

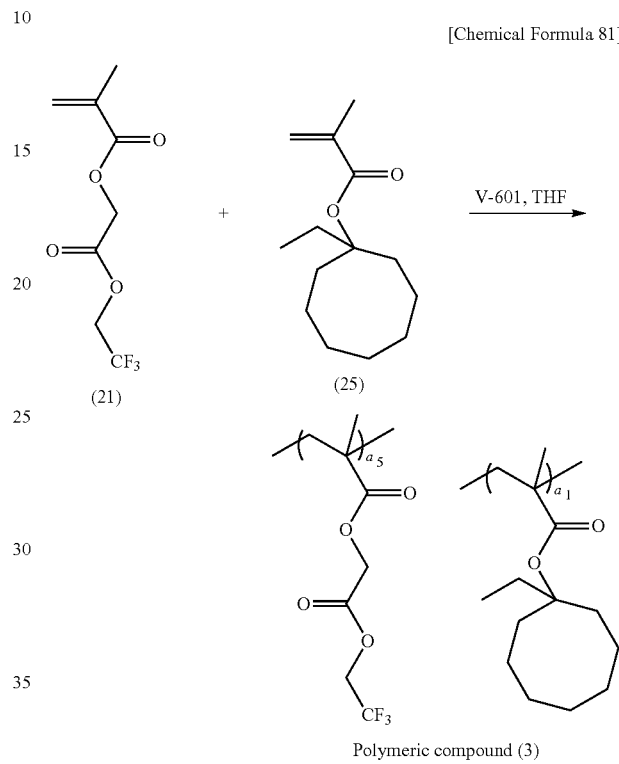

Polymeric compound (3)

<Production of Positive Resist Composition>

Examples 1 to 4, Comparative Examples 1 to 4

The components shown in Table 1 were mixed together and dissolved to obtain positive resist compositions.

TABLE 1

|  | Component (A) | | | Component (B) | | Component (D) | Component (E) | Component (S) | |
| --- | --- | --- | --- | --- | --- | --- | --- | --- | --- |
| Comp. Ex. 1 | (A)-1 [100] | — | — | (B)-1 [6.7] | (B)-2 [2.6] | (D)-1 [0.6] | (E)-1 [0.8] | (S)-1 [10] | (S)-2 [2400] |
| Comp. Ex. 2 | (A)-2 [100] | — | — | (B)-1 [6.7] | (B)-2 [2.6] | (D)-1 [0.6] | (E)-1 [0.8] | (S)-1 [10] | (S)-2 [2400] |
| Ex. 1 | (A)-3 [100] | — | — | (B)-1 [6.7] | (B)-2 [2.6] | (D)-1 [0.6] | (E)-1 [0.8] | (S)-1 [10] | (S)-2 [2400] |
| Comp. Ex. 3 | (A)-4 [85] | (A)-5 [15] | — | (B)-1 [6.7] | (B)-2 [2.6] | (D)-1 [0.6] | (E)-1 [0.8] | (S)-1 [10] | (S)-2 [2600] |
| Comp. Ex. 4 | (A)-4 [85] | (A)-5 [15] | (A)-1 [3.0] | (B)-1 [6.7] | (B)-2 [2.6] | (D)-1 [0.6] | (E)-1 [0.8] | (S)-1 [10] | (S)-2 [2600] |
| Ex. 2 | (A)-4 [85] | (A)-5 [15] | (A)-3 [3.0] | (B)-1 [6.7] | (B)-2 [2.6] | (D)-1 [0.6] | (E)-1 [0.8] | (S)-1 [10] | (S)-2 [2600] |
| Ex. 3 | (A)-4 [85] | (A)-5 [15] | (A)-6 [3.0] | (B)-1 [6.7] | (B)-2 [2.6] | (D)-1 [0.6] | (E)-1 [0.8] | (S)-1 [10] | (S)-2 [2600] |
| Ex. 4 | (A)-7 [100] | — | (A)-3 [50] | (B)-1 [6.7] | (B)-2 [2.6] | (D)-1 [0.6] | (E)-1 [0.8] | (S)-1 [10] | (S)-2 [2600] |

In Table 1, the reference characters indicate the following. Further, the values in brackets [ ] indicate the amount (in terms of parts by weight) of the component added. In the chemical formulas, the subscript numerals shown to the bottom right of the parentheses ( ) indicate the percentage (mol %) of the respective structural units.

(A)-1: the aforementioned polymeric compound (3)

(A)-2: a polymeric compound (4) represented by chemical formula (4) shown below. It was synthesized in the same manner as in Synthesis Example 1 described in Japanese Unexamined Patent Application, First Publication No. 2008-134607.

[Chemical Formula 82]

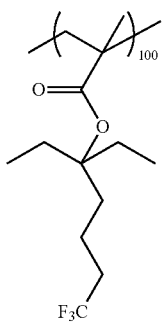

(4)

(A)-3: the aforementioned polymeric compound (1)

(A)-4: a copolymer represented by chemical formula (A2-2-1) shown below. Mw: 10,000, Mw/Mn: 1.78

(A)-5: a copolymer represented by chemical formula (A2-1-1) shown below Mw: 7,000, Mw/Mn: 1.68

(A)-6: the aforementioned polymeric compound (2)

(A)-7: a copolymer represented by chemical formula (A2-1.2) shown below. Mw: 7,000, Mw/Mn: 1.54

[Chemical Formula 83]

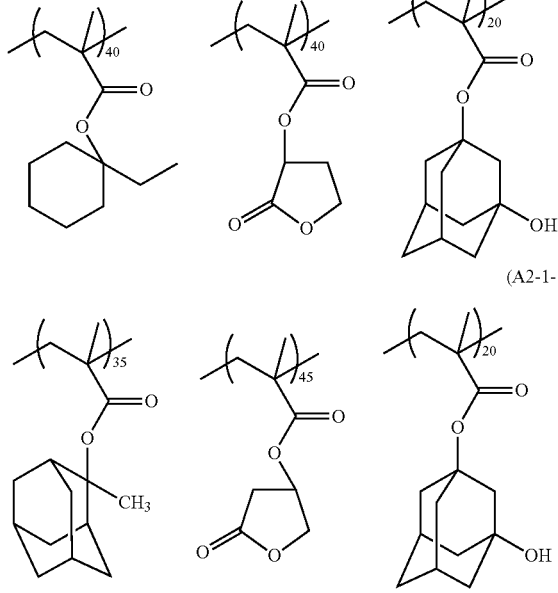

(A2-2-1)

(A2-1-1)

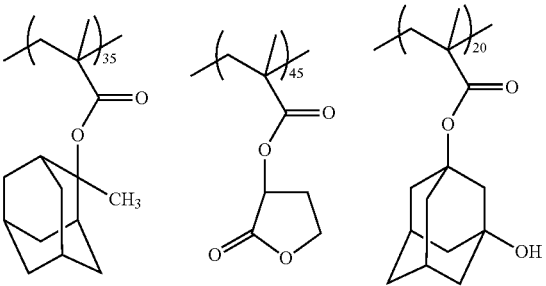

(A2-1-2)

(B)-1: a compound represented by chemical formula (B1) shown below. It was synthesized in the same manner as in Example 1 described in Japanese Unexamined Patent Application, First Publication No. 2009-167156.

(B)-2: a compound represented by chemical formula (B2) shown below

[Chemical Formula 84]

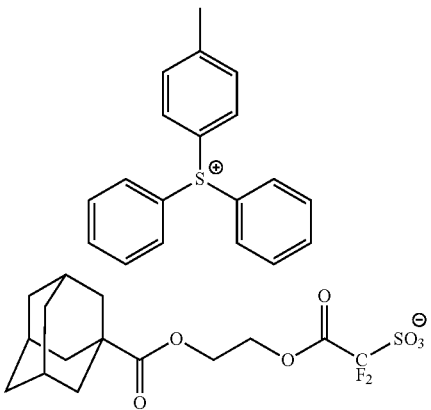

(B1)

(B2)

(D)-1: tri-n-pentylamine
(E)-1: salicylic acid
(S)-1: γ-butyrolactone
(S)-2: a mixed solvent of PGMEA/PGME=6/4 (weight ratio)

Examples in which Polymeric Compounds (1), (3) and (4) were Used as Base Resin

Using the positive resist compositions of Example 1 and Comparative Examples 1 and 2, formation of resist pattern was evaluated as follows.

[Formation of Resist Pattern]

An organic anti-reflection film composition (product name: ARC29A, manufactured by Brewer Science Ltd.) was applied to an 8-inch silicon wafer using a spinner, and the composition was then baked at 205° C. for 60 seconds, thereby forming an organic anti-reflection film having a film thickness of 77 nm.

Then, the resist composition was applied to the anti-reflection film using a spinner, and was then prebaked (PAB) on a hotplate at 110° C. for 60 seconds and dried, thereby forming a resist film having a film thickness of 100 nm.

Subsequently, the resist film was selectively irradiated with an ArF excimer laser (193 nm) through a binary mask pattern, using an ArF exposure apparatus NSR—S302 (manufactured by Nikon Corporation; NA (numerical aperture)=0.60, ⅔annular illumination).

Thereafter, a post exposure bake (PEB) treatment was conducted at 80° C. for 60 seconds, followed by development for 30 seconds at 23° C. in a 2.38% by weight aqueous solution of tetramethylammonium hydroxide (TMAH) (product name: NMD-3; manufactured by Tokyo Ohka Kogyo Co., Ltd.). Then, the resist film was washed for 30 seconds with pure water, followed by drying by shaking.

As a result, with the positive resist composition of Example 1, it was confirmed that a line and space pattern (hereafter, referred to as "LS pattern") having a line width of 217 nm (pitch: 360 μm), an LS pattern having a line width of 161 nm (pitch: 360 nm), an LS pattern having a line width of 118 nm (pitch: 360 nm) and an LS pattern having a line width of 81 nm (pitch; 360 nm) could be formed.

With the positive resist composition of Comparative Example 1, although an LS pattern having a line width of 260 nm (pitch: 360 nm) could be formed, an LS pattern having a smaller line width could not be resolved.

With the positive resist composition of Comparative Example 2, even a resist film could not be formed.

Examples in which Polymeric Compounds (1), (2) and (3) were Used as Additive

Using the positive resist compositions of Examples 2 and 3 and Comparative Examples 3 and 4, the static contact angles of the resist film surface prior to exposure and after alkali development were measured as follows, to thereby evaluate the hydrophobicity of the resist film. Further, the thickness loss was also evaluated.

[Evaluation of Hydrophobicity of Resist Film]
(Measurement of Static Contact Angle on Resist Film Surface Prior to Exposure)

Each positive resist composition was applied to an 8-inch silicon wafer using a spinner, and was then prebaked (PAB) on a hotplate at 110° C. for 60 seconds and dried, thereby forming a resist film having a film thickness of 120 μm.

Subsequently, 2 μl of water was dropped onto the surface of the resist film (prior to exposure), and the static contact angle was measured using DROP MASTER-700 (manufactured by Kyowa Interface Science Co. Ltd.). The measured value was defined as "contact angle after coating(°)", The results are shown in Table 2.

(Measurement of Static Contact Angle of Resist Film Surface after Alkali Development)

The wafer after the measurement of static contact angle prior to exposure was subjected to development treatment at 23° C. with a 2.38% by weight aqueous solution of tetramethylammnonium hydroxide (TMAH) for 10 seconds or 30 seconds, using an LD nozzle (an accessory of a coating apparatus ACTS manufactured by Tokyo Electron Ltd.). Then, after each development treatment, the wafer was washed with pure water, and the static contact angle was measured in the same manner as described above. The measured value was defined as "contact angle after development (°)". The results are shown in Table 2.

TABLE 2

|  | Contact angle after coating (°) | Contact angle after 10 seconds development (°) | Contact angle after 30 seconds development (°) |
| --- | --- | --- | --- |
| Comp. Ex. 3 | 73.5 | 65.3 | 64.5 |
| Comp. Ex. 4 | 88.5 | 70.2 | 68.8 |
| Ex. 2 | 78.3 | 68.9 | 63.2 |
| Ex. 3 | 84.3 | 64.0 | 61.8 |

From the results shown in Table 2, the resist films formed using the positive resist compositions of Examples 2 and 3 exhibited a large contact angle after coating, as compared to the resist film of Comparative Example 3. Therefore, it was confirmed that, by including the polymeric compound (1) or the polymeric compound (2), the hydrophobicity of the resist film surface can be enhanced.

Further, the resist films of Examples 2 and 3 exhibited a small contact angle after development, as compared to the contact angle after coating. Therefore, it was confirmed that the hydrophilicity of the resist film surface was increased by alkali development treatment.

In the resist film of Comparative Example 4 (using an additive), the contact angle was high as compared to the resist film of Comparative Example 3 (using no additive), even after 30 seconds of development. On the other hand, in the resist film of Example 2 (using an additive), the contact angle after 30 seconds of development is lower than the resist film of Comparative Example 3, In the resist film of Example 3 (using an additive), the contact angle after 10 seconds of development is lower than the resist film of Comparative Example 3, Therefore, it was confirmed that the hydrophilicity of the resist film surface is higher than a resist film without using an additive.

Thus, the positive resist compositions of Examples 2 and 3 have the effect of being hydrophobic during immersion exposure and turning hydrophilic during alkali development, and hence, reduction of defects during development can be expected. In particular, although the resist film of Example 3 exhibits the same level of high hydrophobicity after coating as the resist film of Comparative Example 4, the resist film of Example 3 exhibits a higher hydrophilicity after development (even after development of only 10 seconds) than the resist film of Comparative Example 4. Therefore, it can be appreciated that the resist film of Example 3 is superior in terms of the aforementioned effect.

[Evaluation of Thickness Loss]

The positive resist composition of Example 4 was uniformly applied to an 8-inch silicon wafer by spin-coating, and was then prebaked (PAB) at 110° C. for 60 seconds, thereby forming a resist film having a film thickness of 110 nm.

Subsequently, the resist film was subjected to an overall open exposure using an ArF excimer laser exposure apparatus NSR—S302 (manufactured by Nikon Corporation), with an exposure dose in the range of 0 to 16 mJ/cm$^2$ (17 points at intervals of 1 mJ/cm$^2$) and 20 mJ/cm$^2$.

Then, after the overall open exposure with each exposure dose, post exposure bake (PEB) was conducted at 80° C., 100° C. or 120° C. for 60 seconds, followed by development for 30 seconds using a 2.38% by weight aqueous solution of tetramethylammonium hydroxide.

The film thickness of the resist film prior to exposure and after development was measured using a scanning electron microscope (SEM), and a graph was plotted, taking the exposure dose (mJ/cm$^2$) on the horizontal axis, and the film thickness of the resist film (nm) on the vertical axis.

Figure 2:
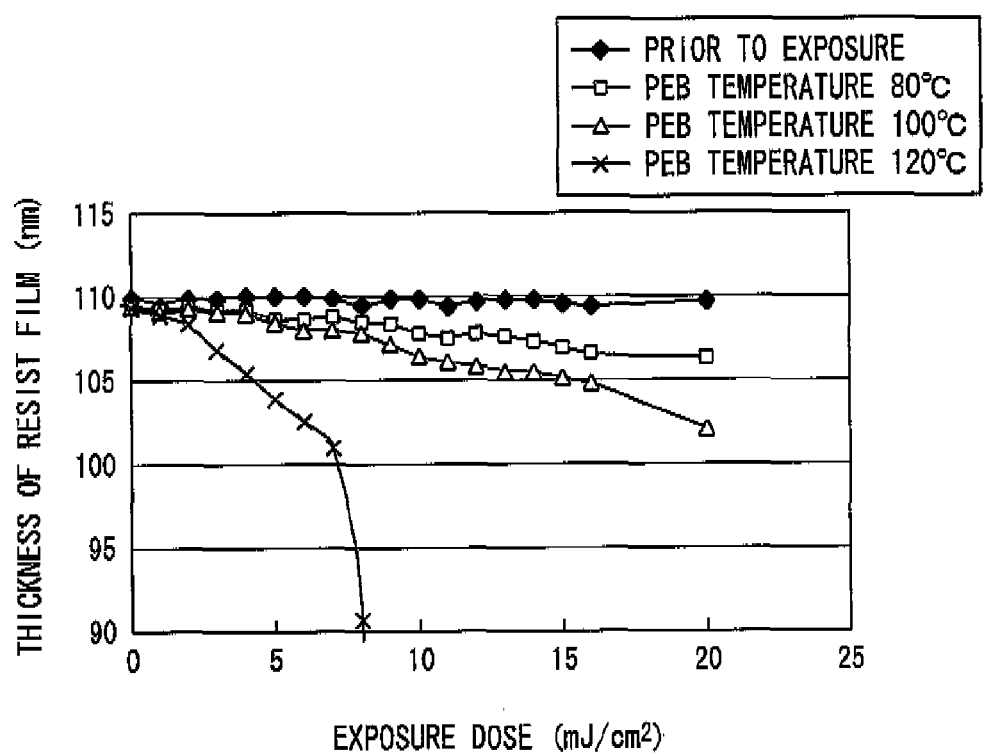
FIG. 2 is a graph showing the change in thickness of the resist film with respect to the positive resist composition of Example 4, relative to the exposure dose

FIG. 2 is a graph showing the change in thickness of the resist film with respect to the positive resist composition of Example 4, relative to the exposure dose.

From the graph of FIG. 2, in the positive resist composition of Example 4, thickness loss is observed in low exposure dose region, meaning that deposits and the like after development process can be readily dissolved in the alkali developing solution. Therefore, it is expected that generation of defects can be suppressed, and resist pattern shape can be improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising a resin component (A) which exhibits increased solubility in an alkali developing solution under action of acid and an acid-generator component (B) which generates acid upon exposure, the base component (A) comprising a polymeric compound (A1) comprising:

a structural unit (a1) containing an acid dissociable, dissolution inhibiting group, a structural unit (a5) containing a base dissociable group, and a structural unit (a6) represented by general formula (a6-1) shown below:

[Chemical Formula 1]

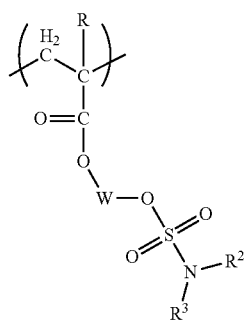

(a6-1)

wherein R represents a hydrogen atom, an alkyl group of 1 to 5 carbon atoms or a halogenated alkyl group of 1 to 5 carbon atoms; each of R$^2$ and R$^3$ independently represents a hydrogen atom or an alkyl group that may contain an oxygen atom at an arbitrary position, or R$^2$ and R$^3$ are bonded together to form an alkylene group; and W represents a cyclic alkylene group that may include an oxygen atom at an arbitrary position.

2. The positive resist composition according to claim 1, wherein the structural unit (a5) is at least one structural unit selected from the group consisting of a structural unit represented by general formula (a5-01-1) shown below and a structural unit represented by general formula (a5-01-2) shown below:

[Chemical Formula 2]

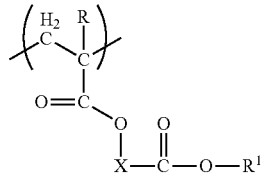

(a5-01-1)

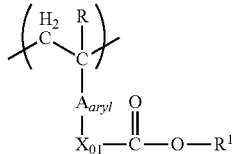

(a5-01-2)

wherein each R independently represents a hydrogen atom, an alkyl group of 1 to 5 carbon atoms or a halogenated alkyl group of 1 to 5 carbon atoms, and each R$^1$ independently represents an organic group having a fluorine atom; in general formula (a5-01-1), X represents a divalent linking group; in general formula (a5-01-2), A$_{aryl}$ represents a divalent aromatic cyclic group which may have a substituent, and X$_{01}$ represents a single bond or a divalent linking group;

provided that each of X, A$_{aryl}$ and X$_{01}$ has no fluorine atom.

3. The positive resist composition according to claim 1, wherein the structural unit (a1) is a structural unit derived from an acrylate ester containing an acid dissociable, dissolution inhibiting group.

4. The positive resist composition according to claim 1, which further comprises a nitrogen-containing organic compound (D) excluding the polymeric compound (A1).

5. A method of forming a resist pattern, comprising:

using the positive resist composition of claim 1 to form a resist film on a substrate;

conducting exposure of the resist film; and alkali-developing the resist film to form a resist pattern.

\* \* \* \* \*

UNITED STATES PATENT AND TRADEMARK OFFICE
CERTIFICATE OF CORRECTION

PATENT NO. : 8,450,044 B2
APPLICATION NO. : 12/945526
DATED : May 28, 2013
INVENTOR(S) : Tomoyuki Hirano, Daiju Shiono and Daichi Takaki It is certified that error appears in the above-identified patent and that said Letters Patent is hereby corrected as shown below:

Title Page (Item 57) Abstract, Line 8, Change "an a" to --a--.

In the Specifications

Column 1, Line 15, Change "fanned" to --formed--.

Column 3, Line 66, Change "an a" to --a--.

Column 5, Line 7, Change "dose" to --dose.--.

Column 6, Line 57, Change "adamantine" to --adamantane--.

Column 17, Line 58, Change "are" to --an--.

Column 20, Lines 55-65, (Approx.),

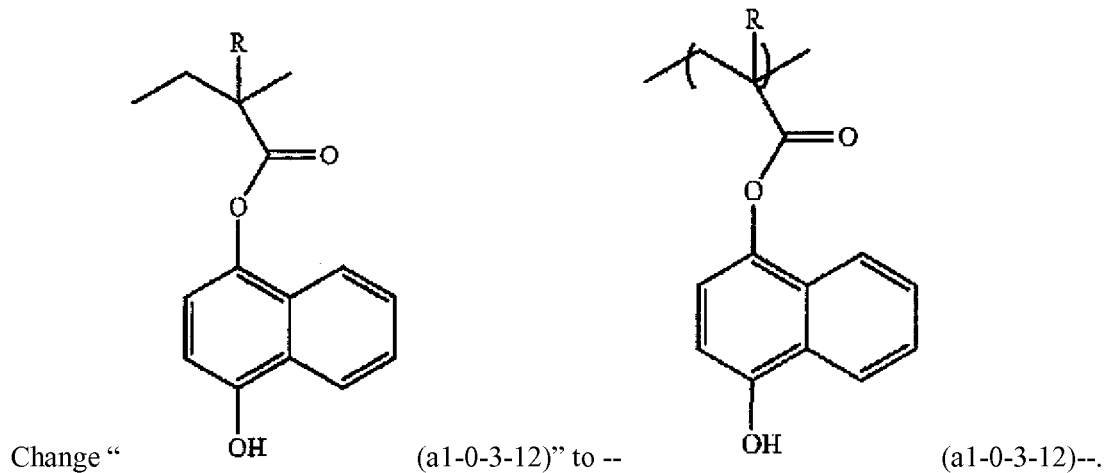

Signed and Sealed this
Seventh Day of January, 2014

Margaret A. Focarino
*Commissioner for Patents of the United States Patent and Trademark Office*

CERTIFICATE OF CORRECTION (continued)
U.S. Pat. No. 8,450,044 B2

Column 23, Line 67, Change "below," to --below.--.

Column 24, Line 64, Change "axe" to --are--.

Column 57, Line 16, Change "shown," to --shown--.

Column 60, Line 51, Change "$C_2$" to --$CH_2$--.

Column 67, Line 5, Change "(a5.01-26)" to --(a5-01-26)--.

Column 68, Line 41, Change "$R^{55}$" to --$R^{58}$--.

Column 78, Line 25, Change "units," to --units.--.

Column 79, Line 55, Change "$C_2$" to --$CH_2$--.

Column 80, Line 60, Change "bye" to --by--.

Column 82, Line 59, Change "rang;" to --range,--.

Column 83, Line 43, Change "below," to --below.--.

Column 87, Line 4, Change "cycloodyl" to --cyclooctyl--.

Column 97, Line 38, Change "propionolatone" to --propionolactone--.

Column 97, Line 48, Change "below," to --below.--.

Column 99, Line 4, Change "group" to --group.--.

Column 112, Line 67, Change "preferable," to --preferable.--.

Column 114, Line 30, Change "below," to --below.--.

Column 118, Line 17, Change "(a5.01-20)" to --(a5-01-20)--.

Column 118, Line 17, Change "below," to --below.--.

Column 119, Line 16, Change "conies" to --comes--.

Column 119, Line 40, Change "dicyclohexylcarboxylmide" to --dicyclohexylcarboxyimide--.

Column 119, Line 50, Change "trifluoromethemesulfonic" to --trifluoromethanesulfonic--.

Column 123, Line 65, Change "$R^{l}$" to --$R^{1}$--.

Column 124, Line 14, Change "tart" to --tert--.

Column 124, Line 53, Change "triphenylmetharie" to --triphenylmethane--.

Column 127, Line 58, Change "$C_3$" to --$CH_3$--.

Column 131, Line 52, Change "text" to --tert--.

Column 132, Line 3, Change "polycycloallcane" to --polycycloalkane--.

Column 133, Line 21, Change "butylphenypiodonium" to --butylphenyl)iodonium--.

Column 133, Lines 24-25, Change "methylpheyl" to --methylphenyl--.

Column 133, Line 51, Change "methoxymphtalene" to --methoxynaphthalene--.

Column 133, Line 51, Change "tetrahydrothiopheniutn" to --tetrahydrothiophenium--.

Column 139, Line 31, Change "sultanate" to --sulfonate--.

Column 139, Line 36, Change "benzenesulfonyloxyirnino" to --benzenesulfonyloxyimino--.

Column 139, Line 37, Change "benzenesulfanyloxyirnino" to --benzenesulfonyloxyimino--.

Column 139, Line 38, Change "benzenesulfonyloxyitnino" to --benzenesulfonyloxyimino--.

Column 139, Line 40, Change "chlorobenzenesultanyloxyimino" to --chlorobenzenesulfonyloxyimino--.

Column 139, Line 41, Change "benzenesulfonylaxylmino" to --benzenesulfonyloxyimino--.

Column 139, Line 47, Change "methylsulfonyloxyhnino" to --methylsulfonyloxyimino--.

Column 139, Line 61, Change "isopropylsulfonyloxymino" to --isopropylsulfonyloxyimino--.

Column 140, Lines 22-25 (Approx.), Change

" 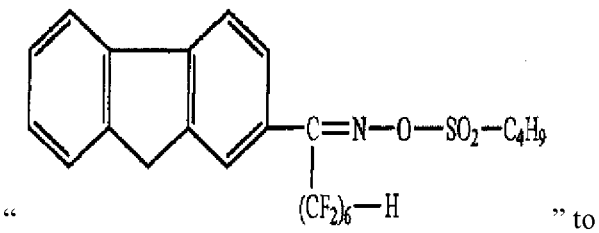 " to

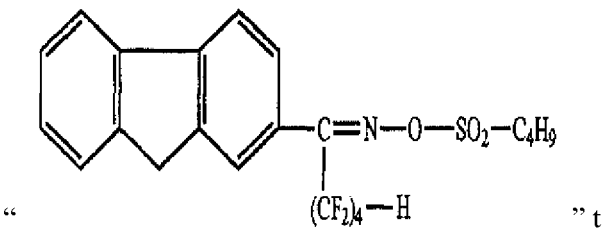 --.

Column 140, Lines 26-30 (Approx.), Change

" 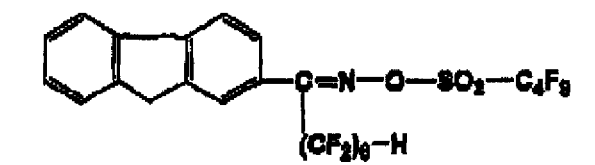 " to

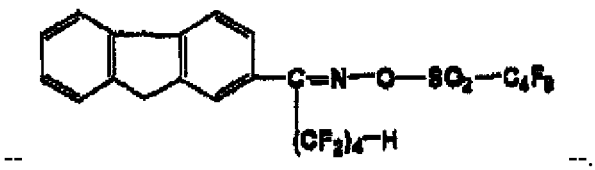 --.

Column 140, Line 39, Change "diazomethrme" to --diazomethane--.

Column 140, Line 50, Change "phenylsulfonyldiazornethylsulfonyl" to --phenylsulfonyldiazomethylsulfonyl--.

Column 141, Line 37, Change "heptylarmine" to --heptylamine--.

Column 141, Line 54, Change "diazabioyolo" to --diazabicyclo--.

Column 142, Line 2, Change "triphenylarmine" to --triphenylamine--.

Column 143, Lines 40-41, Change "cyolohexanone" to --cyclohexanone--.

CERTIFICATE OF CORRECTION (continued)
U.S. Pat. No. 8,450,044 B2

Column 144, Line 22, Change "tetramethylammnonium" to --tetramethylammonium--.

Column 145, Line 16, Change "at" to --as--.

Column 146, Line 15, Change "fanned" to --formed--.

Column 146, Line 22, Change "(a6.1)" to --(a6-1)--.

Column 150, Line 60, Change "this" to --thus--.

Column 159, Lines 62-63, Change "tetramethylammnonium" to --tetramethylammonium--.